(12) United States Patent
Jarikov

(10) Patent No.: US 7,183,010 B2
(45) Date of Patent: Feb. 27, 2007

(54) ORGANIC LIGHT-EMITTING DIODE DEVICES WITH IMPROVED OPERATIONAL STABILITY

(75) Inventor: Viktor V. Jarikov, Rochester, NY (US)

(73) Assignee: Eastman Kodak Corporation, Rochester, NY (US)

( * ) Notice: Subject to any disclaimer, the term of this patent is extended or adjusted under 35 U.S.C. 154(b) by 58 days.

(21) Appl. No.: 10/634,324

(22) Filed: Aug. 5, 2003

(65) Prior Publication Data

US 2004/0076853 A1    Apr. 22, 2004

Related U.S. Application Data

(63) Continuation-in-part of application No. 10/131,801, filed on Apr. 24, 2002, now abandoned.

(51) Int. Cl.
*H05B 33/14* (2006.01)
*H01L 51/50* (2006.01)

(52) U.S. Cl. .................. 428/690; 428/917; 313/504; 313/506

(58) Field of Classification Search ............... 428/690, 428/917; 313/504, 506
See application file for complete search history.

(56) References Cited

U.S. PATENT DOCUMENTS

| | | | | |
|---|---|---|---|---|
| 5,281,489 A * | 1/1994 | Mori et al. | .................. | 428/690 |
| 5,294,870 A * | 3/1994 | Tang et al. | .................. | 313/504 |
| 5,405,709 A * | 4/1995 | Littman et al. | ............. | 428/690 |
| 6,740,429 B2 * | 5/2004 | Aziz et al. | .................. | 428/690 |
| 2004/0021415 A1 * | 2/2004 | Vong et al. | .................. | 313/509 |

* cited by examiner

*Primary Examiner*—Dawn Garrett
(74) *Attorney, Agent, or Firm*—Raymond L. Owens

(57) ABSTRACT

An organic light-emitting device includes a substrate, an anode and a cathode disposed over the substrate, and a luminescent layer disposed between the anode and the cathode wherein the luminescent layer includes a host and at least one dopant. The host of the luminescent layer is selected to include a solid organic material comprising a mixture of at least two components, one of which is capable of forming both monomer state and an aggregate state.

108 Claims, 8 Drawing Sheets

ORGANIC LIGHT-EMITTING DIODE DEVICES WITH IMPROVED OPERATIONAL STABILITY

CROSS REFERENCE TO RELATED APPLICATIONS

This is a continuation-in-part of application Ser. No. 10/131,801, filed Apr. 24, 2002 now abandoned entitled "Organic Light-emitting Diode Devices With Improved Operational Stability" by Viktor V. Jarikov.

FIELD OF THE INVENTION

The present invention relates to organic light-emitting diode devices and more particularly to the design of the composition of the organic layers for improvements in operational stability.

BACKGROUND OF THE INVENTION

Organic light-emitting diodes (OLED), also known as organic electroluminescent (EL) devices, are a class of electronic devices that emit light in response to an electrical current applied to the device. The structure of an OLED device generally includes an anode, an organic EL medium, and a cathode. The term, organic EL medium, herein refers to organic materials or layers of organic materials disposed between the anode and the cathode in the OLED device. The organic EL medium can include low molecular weight compounds, high molecular weight polymers, oligimers of low molecular weight compounds, or biomaterials, in the form of a thin film or a bulk solid. The medium can be amorphous or crystalline. Organic electroluminescent media of various structures have been described in the prior art. Dresner, in RCA Review, 30, 322 (1969), described a medium comprising a single layer of anthracene film. Tang et al., in Applied Physics Letters, 51, 913 (1987), Journal of Applied Physics, 65, 3610 (1989), and commonly assigned U.S. Pat. No. 4,769,292, reported an EL medium with a multi-layer structure of organic thin films, and demonstrated highly efficient OLED devices using such a medium. In some OLED device structures the multi-layer EL medium includes a hole-transport layer adjacent to the anode, an electron-transport layer adjacent to the cathode, and disposed in between these two layers, a luminescent layer. Furthermore, in some preferred device structures, the luminescent layer is constructed of a doped organic film comprising an organic material as the host and a small concentration of a fluorescent compound as the dopant. Improvements in EL efficiency, chromaticity, and stability have been obtained in these doped OLED devices by selecting an appropriate dopant-host composition. The dopant, being the dominant emissive center, is selected to produce the desirable EL colors. Examples of the doped luminescent layer reported by Tang et al. in commonly assigned U.S. Pat. No. 4,769,292 and by Chen et al. in commonly assigned U.S. Pat. No. 5,908,581 are: tris(8-quinolinol)aluminum ($AlQ_3$) host doped with coumarin dyes for green emitting OLEDs; and $AlQ_3$ doped with 4-dicyanomethylene-4H-pyrans (DCMs) for orange-red emitting OLEDs. Shi et al., in commonly assigned U.S. Pat. No. 5,593,788, disclosed that a long operational life was obtained in an OLED device by using a quinacridone compound as the dopant in an $AlQ_3$ host. Bryan et al., in commonly assigned U.S. Pat. No. 5,141,671, disclosed a luminescent layer containing perylene or a perylene derivative as a dopant in a blue emitting host. They showed that a blue emitting OLED device with an improved operational stability was obtained. In both disclosures, the incorporation of selected fluorescent dopants in the luminescent layer is found to improve substantially the overall OLED device performance parameters. Co-doping of luminescent layer with anthracene derivatives results in devices with better stability as shown in JP 99273861 and JP 284050. Doping the hole-transport layer with materials that impede hole-transport and co-doping hole-transport materials into electron-transporting $AlQ_3$ leads to the improved device lifetimes, Popovic et al. Thin Solid Films 2000, 363, 6; SPIE 1998, 3476, 68.

The most common formulation of the doped luminescent layer includes only a single dopant in a host matrix. However, in a few instances, incorporation of more than one dopant in the luminescent layer was found to be beneficial in improving stability. Using a luminescent layer containing rubrene, a yellow emitting dopant, and DCJ, 4-(dicyanomethylene)-2-methyl-6-[2-(4-julolidyl)ethenyl]-4H-pyran, a red emitting dopant, in an $AlQ_3$ host it is possible to produce a red emitting OLED device with improved operational stability, Hamada et al. in Applied Phys. Lett. 75, 1682 (1999); EP1162674. Here rubrene functions as a co-dopant in mediating energy transfer from the $AlQ_3$ host to the DCJ emitter. Generally, in dual dopant systems, it has been noted that the operational stability tends to increase compared to that of the single dopant systems.

Although EL efficiency, color, and stability have been improved significantly using doped luminescent layers of various compositions, the problem of low operational stability persists. Insufficient stability presents the greatest obstacle for many desirable practical applications.

SUMMARY OF THE INVENTION

It is an object of the present invention to provide OLED devices with improved operational stability.

It is another object of the present invention to provide OLED devices with improved luminance efficiency.

It is another object of the present invention to provide a color OLED device with improved color chromaticity.

It is a further object of the present invention to provide specifically OLED devices with improved operational stability, luminance efficiency, and chromaticity.

These objects are achieved in an organic light-emitting device comprising a substrate, an anode and a cathode disposed over the substrate, and a luminescent layer disposed between the anode and the cathode wherein the luminescent layer includes a host and at least one dopant, the host of the luminescent layer is selected to include a solid organic material comprising a mixture of at least two components, one of which is capable of forming both monomer state and an aggregate state.

These objects are further achieved in an organic light-emitting device, comprising:
  a) a substrate;
  b) an anode and a cathode disposed over the substrate;
  c) a luminescent layer disposed between the anode and the cathode wherein the luminescent layer includes a host and at least one dopant;
  d) the host of the luminescent layer being selected to include a solid organic material comprising a mixture of at least two components wherein:
    i) the first component of the mixture is an organic compound that is capable of transporting either electrons or holes or both and is capable of forming both monomer state and an aggregate state and further is capable of forming the aggregate state either in the ground electronic state or in the excited electronic state that results in a different absorption or emission spectrum or both relative to the absorption or emission spectrum or both of the monomer state, respectively, or the first component of the mixture is capable of forming the aggregate state whose presence results in a quantum yield of luminescence of the monomer state being different relative to the quantum yield of luminescence of the monomer state in the absence of the aggregate state, and ii) the second component of the mixture is an organic compound that upon mixing with the first host component is capable of forming a continuous and substantially pin-hole-free layer; and e) the dopant of the luminescent layer being selected to produce light from the light-emitting device.

Another advantage of the present invention is that it provides OLED devices with high operational stability, lower drive voltage, excellent luminance efficiency and color chromaticity, and with luminance efficiency and color chromaticity essentially independent of the current density.

Another advantage of the present invention is that it provides OLED devices that are suitable for high-brightness and long-lifetime lighting and display applications.

BRIEF DESCRIPTION OF THE DRAWINGS

The drawings are necessarily of a schematic nature, since the individual layers are too thin and the thickness differences of the various elements too great to permit depiction to scale or to permit convenient proportionate scaling.

DETAILED DESCRIPTION OF THE INVENTION

Figure 1:
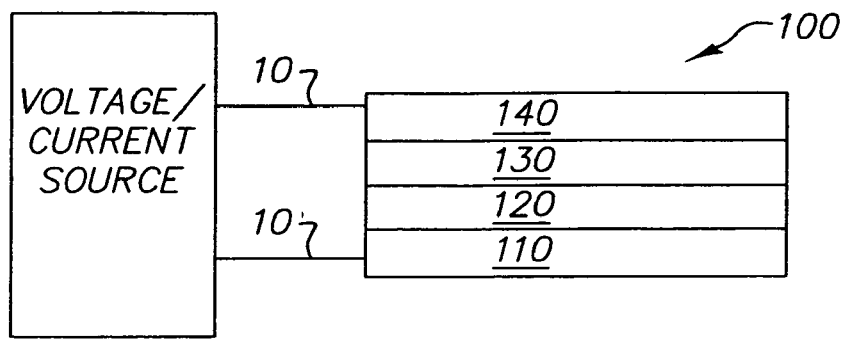
FIG. 1 is schematic structure of an OLED with an organic EL medium.

FIG. 1 illustrates the structure of an OLED device of the simplest construction practiced in the present invention. In this structure, OLED device 100 includes an anode 120, an EL medium 130, and a cathode 140, disposed upon a substrate 110. In operation, an electrical current is passed through the OLED by connecting an external current or voltage source with electrical conductors 10 to the anode and the cathode, causing light to be emitted from the EL medium. The light can exit through either the anode or the cathode or both as desired and depending on their optical transparencies. The EL medium includes a single layer or a multi-layer of organic materials.

Figure 2:
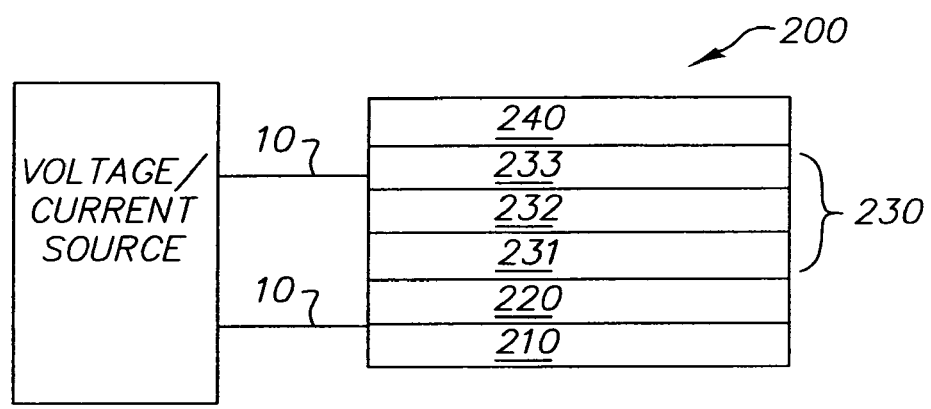
FIG. 2 and FIG. 3 are two schematic OLED structures showing two different configurations of the organic EL medium.

FIG. 2 illustrates the structure of another OLED device of the present invention. In this structure, OLED device 200 includes a substrate 210 and an EL medium 230, disposed between anode 220 and cathode 240. EL medium 230 includes a hole-transport layer 231 adjacent to the anode, an electron-transport layer 233 adjacent to the cathode, and a luminescent layer 232 disposed between the hole-transport layer and the electron-transport layer. In operation, an electrical current is passed through the OLED device by connecting an external current or voltage source with electrical conductors 10 to the anode and the cathode. This electrical current, passing through the EL medium, causes light to be emitted primarily from the luminescent layer 232. Hole-transport layer 231 carries the holes, that is, positive electronic charge carriers, from the anode to the luminescent layer. Electron-transport layer 233 carries the electrons, that is, negative electronic charge carriers, from the cathode to the luminescent layer 232. The recombination of holes and electrons produces light emission, that is, electroluminescence, from the luminescent layer 232.

Figure 3:
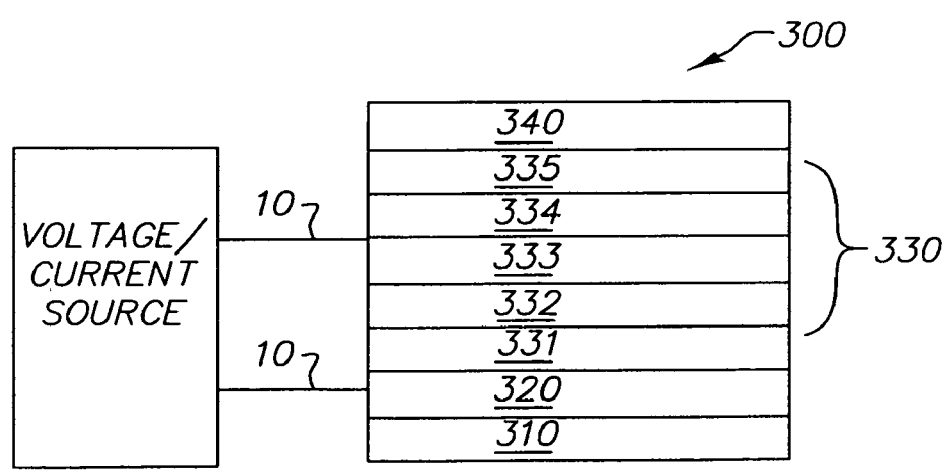

FIG. 3 illustrates yet another structure of an OLED device of the present invention. In this structure, OLED device 300 includes a substrate 310 and an EL medium 330 disposed between anode 320 and cathode 340. EL medium 330 includes a hole-injection layer 331, a hole-transport layer 332, a luminescent layer 333, an electron-transport layer 334, and an electron-injection layer 335. Similarly to OLED device 200 of FIG. 2, the recombination of electrons and holes produces emission primarily from the luminescent layer 333. The provision of the hole-injection layer 331 and the electron-injection layer 335 serves to reduce the barriers for carrier injection from the respective electrodes. Consequently, the drive voltage required for the OLED device can be reduced.

Figure 4:
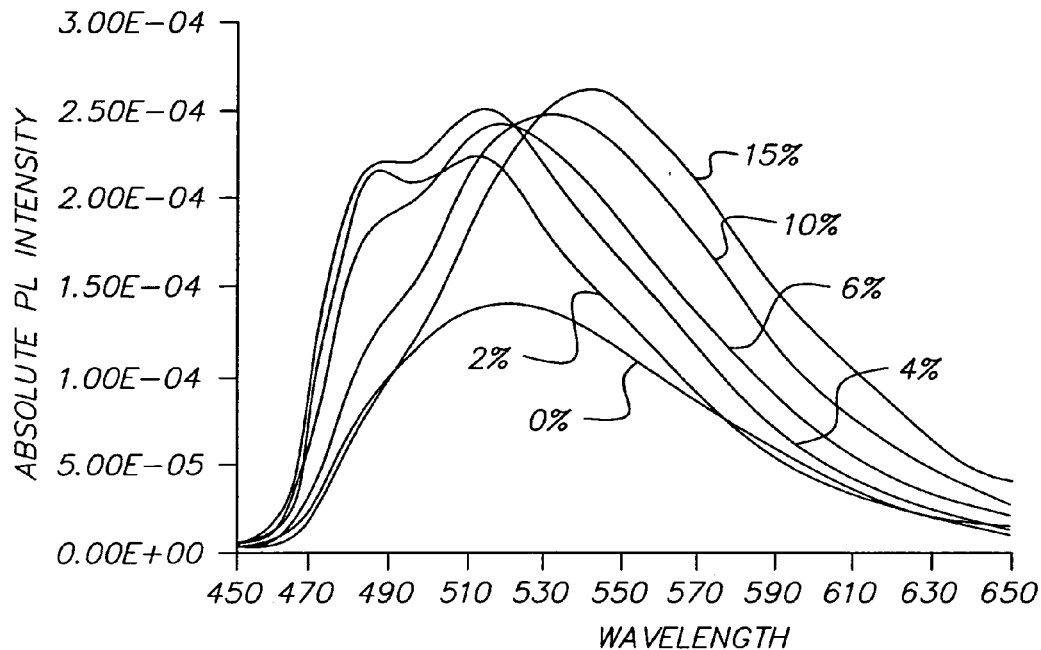
FIG. 4 shows photoluminescence spectra of an OLED device where the light-emitting layer is composed of naphtho[2,3-a]pyrene and AlQ$_3$; excitation wavelength is 430 nm.

FIG. 4 shows representative absolute photoluminescence (PL) spectra of an OLED device where the light-emitting layer is composed of naphtho[2,3-a]pyrene and AlQ$_3$. It can be seen that the higher the volume % of naphtho[2,3-a] pyrene in the layer the more emission spectrum is shifted to the red. This signals formation of the aggregate state the concentration of which and the average size of which increases with increasing volume % of naphtho[2,3a]pyrene. The excitation wavelength is 430 nm and thus both AlQ$_3$ and naphtho[2,3-a]pyrene are excited resulting in an emission spectrum composed of the photoluminescence of both AlQ$_3$ and naphtho[2,3-a]pyrene, the latter being in the monomer state or the aggregate state or both.

Figure 5:
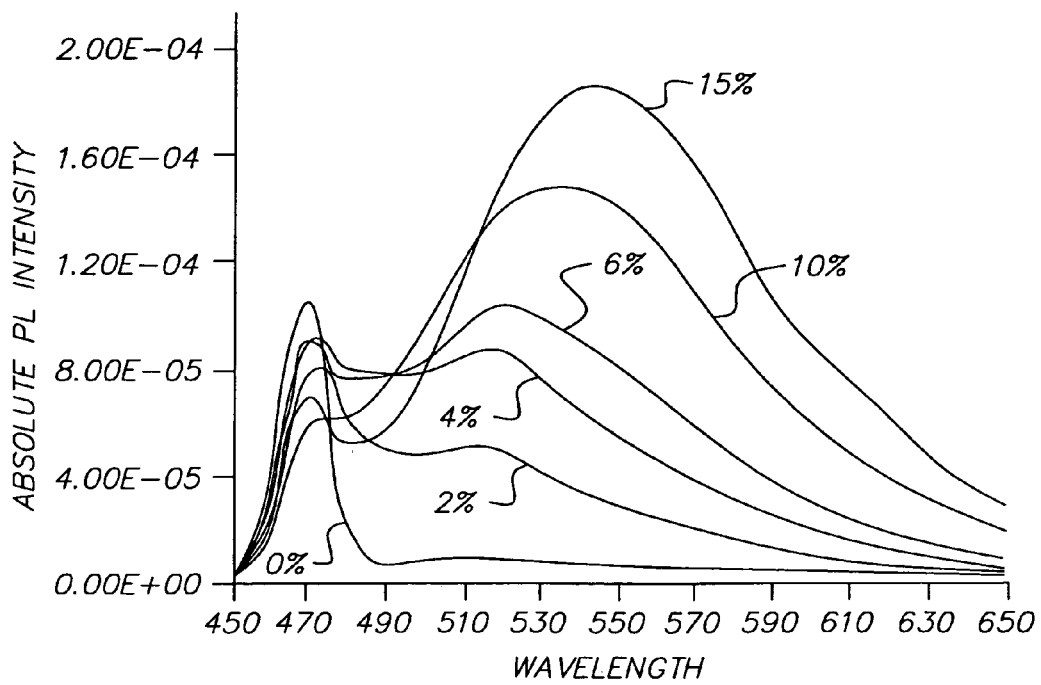
FIG. 5 shows photoluminescence spectra of the same OLED device where the light-emitting layer is composed of naphtho[2,3-a]pyrene and AlQ$_3$; excitation wavelength is 470 nm.

FIG. 5 shows representative absolute photoluminescence (PL) spectra of the OLED device of FIG. 4 obtained with the excitation wavelength of 470 nm. Here primarily naphtho[2,3-a]pyrene is excited resulting in an emission spectrum composed almost exclusively of the photoluminescence of naphtho[2,3a]pyrene in its monomer state or aggregate state or both.

Figure 6:
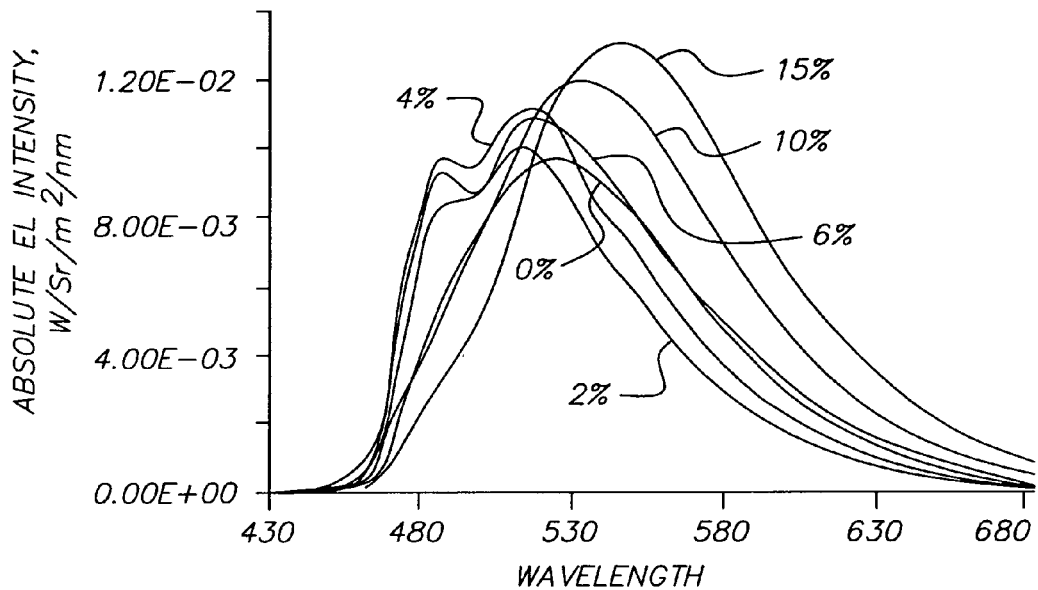
FIG. 6 shows electroluminescence spectra of the same OLED device where the light-emitting layer is composed of naphtho[2,3-a]pyrene and AlQ$_3$; current density is 20 mA/cm$^2$.

FIG. 6 shows the corresponding absolute electroluminescence (EL) spectra of the OLED device of FIG. 4 and FIG. 5. It can be seen that the EL spectra resemble the PL spectra of FIG. 4 closely. This signals that the singlet excites states of both AlQ$_3$ and naphtho[2,3-a]pyrene are produced in an operating device. Thus, the EL spectrum is composed of the luminescence of both AlQ$_3$ and naphtho[2,3-a]pyrene, the latter being in its monomer state or aggregate state or both depending on the volume % of naphtho[2,3-a]pyrene in the luminescent layer.

Figure 7:
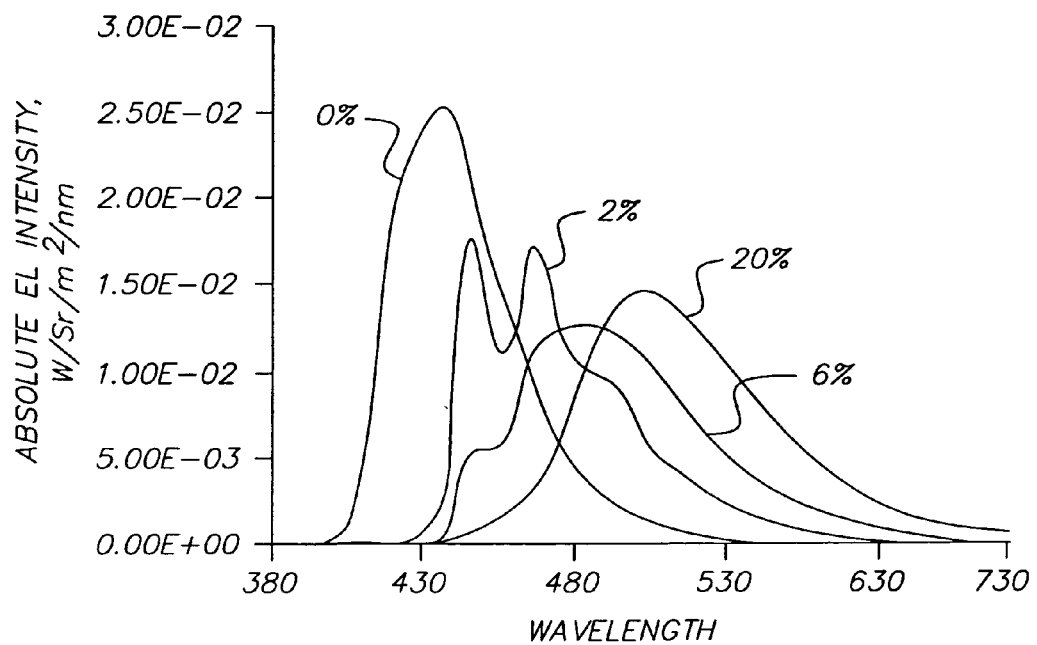
FIG. 7 shows electroluminescence spectra of an OLED device where the light-emitting layer is composed of naphtho[2,3-a]pyrene and TBADN; current density is 20 mA/cm$^2$.

FIG. 7 shows the absolute EL spectra of an OLED device where the light-emitting layer is composed of naphtho[2,3-a]pyrene and TBADN. It can be seen that the EL spectra behave similarly to those of FIG. 6. This signals that formation of an aggregate state of naphtho[2,3-a]pyrene occurs in a nonpolar TBADN environment as well as in polar AlQ$_3$ environment. With increasing concentration of naphtho[2,3-a]pyrene the aggregate contribution to the overall EL drastically increases. Thus, the EL spectrum is composed primarily of the emission spectrum of naphtho[2,3-a]pyrene in its monomer state in the 2% case, while in the 20% case the emission is almost solely that of naphtho[2,3-a]pyrene in its aggregate state.

Figure 8:
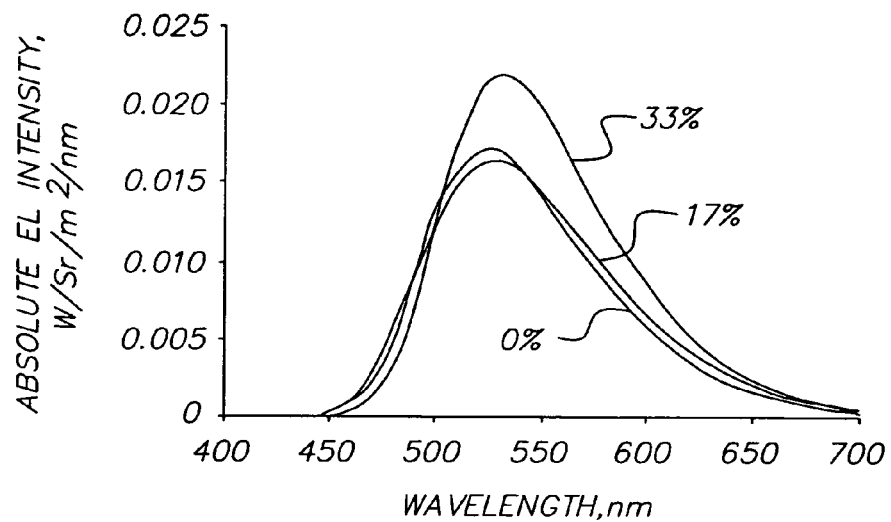
FIG. 8 shows electroluminescence spectra of an OLED device where the light-emitting layer is composed of dibenzo[b,k]perylene and AlQ$_3$; current density is 20 mA/cm$^2$.

FIG. 8 shows the absolute EL spectra of an OLED device where the light-emitting layer is composed of dibenzo[b,k]perylene and AlQ$_3$. It can be seen that the EL spectra signal major involvement of an aggregate state of dibenzo[b,k]perylene in EL production. Thus, the EL spectrum is composed primarily of the emission spectrum of dibenzo[b,k]perylene in its aggregate state while a small portion of EL comes from the emission of AlQ$_3$.

Figure 9:
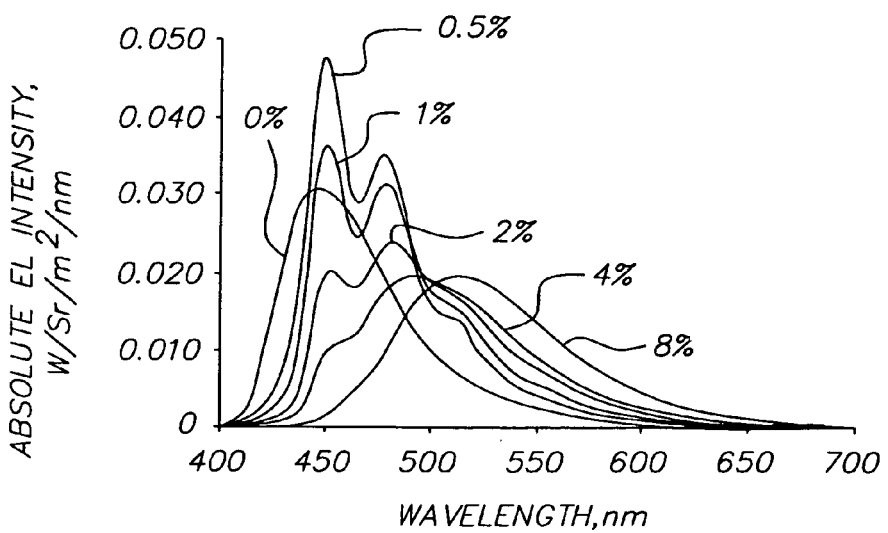
FIG. 9 shows electroluminescence spectra of an OLED device where the light-emitting layer is composed of dibenzo[b,k]perylene and TBADN; current density is 20 mA/cm$^2$.

FIG. 9 shows the absolute EL spectra of an OLED device where the light-emitting layer is composed of dibenzo[b,k]perylene and TBADN. The EL spectra signal that formation of an aggregate state of dibenzo[b,k]perylene occurs in a nonpolar TBADN environment as well as in polar AlQ$_3$ environment. With increasing concentration of dibenzo[b,k]perylene the aggregate contribution to the overall EL drastically increases. Thus, the EL spectrum is composed primarily of the emission spectrum of dibenzo[b,k]perylene in its monomer state in the 0.5% case, while in the 8% case the emission is almost solely that of dibenzo[b,k]perylene in its aggregate state.

Figure 10:
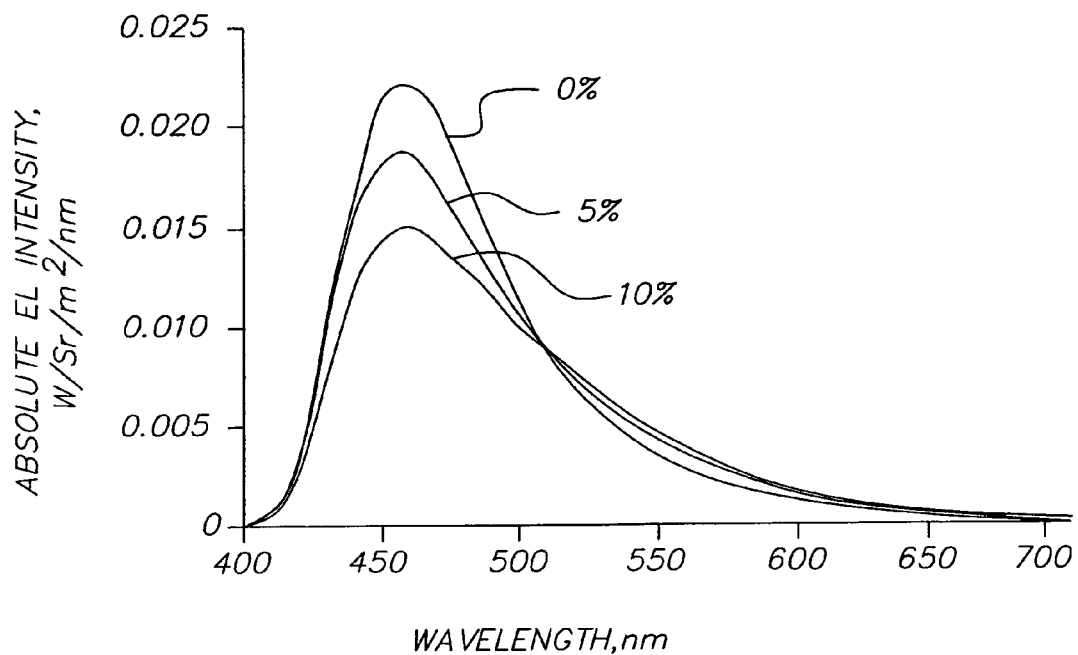
FIG. 10 shows electroluminescence spectra of an OLED device where the light-emitting layer is composed of benzo[a]pyrene and TBADN; current density is 20 mA/cm$^2$.

FIG. 10 shows the absolute EL spectra of an OLED device where the light-emitting layer is composed of benzo[a]pyrene and TBADN. The EL spectra signal that formation of an aggregate state of benzo[a]pyrene occurs. The EL spectra are composed of the emission spectrum of benzo[a]pyrene in its aggregate state and the emission spectrum of TBADN.

Figure 11:
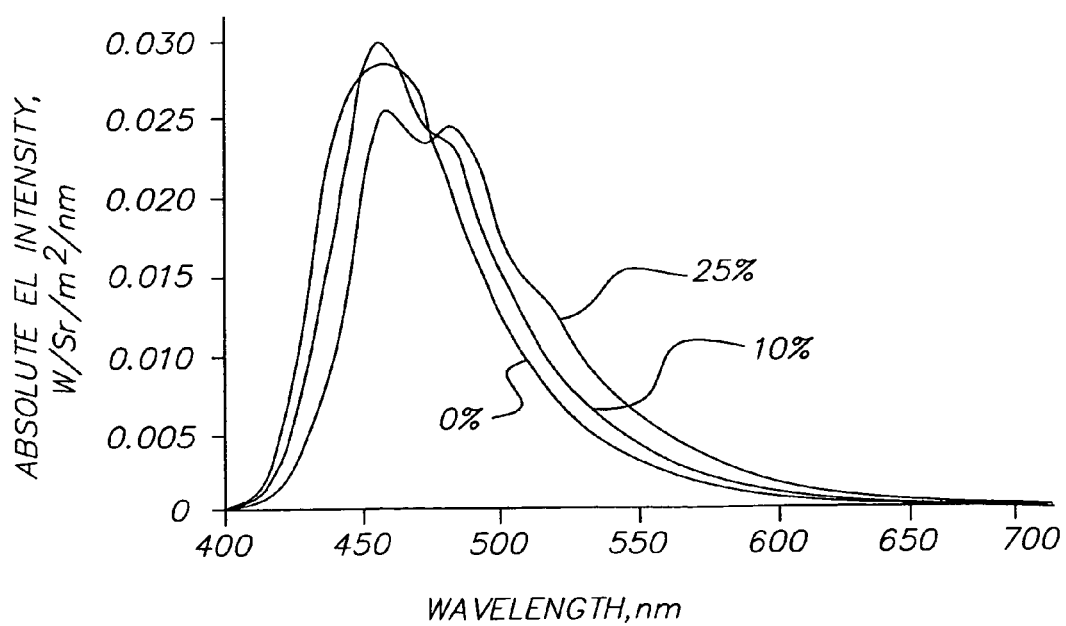
FIG. 11 shows electroluminescence spectra of an OLED device where the light-emitting layer is composed of benzo[ghi]perylene and TBADN; current density is 20 mA/cm$^2$.

FIG. 11 shows the absolute EL spectra of an OLED device where the light-emitting layer is composed of benzo[ghi]perylene and TBADN. The EL spectra signal that formation of an aggregate state of benzo[ghi]perylene occurs. With increasing concentration of benzo[ghi]perylene the aggregate contribution to the overall EL increases. The EL spectra are composed primarily of the emission spectrum of benzo[ghi]perylene in its aggregate state with some contribution of the monomer state emission and possibly little emission of TBADN.

Figure 12:
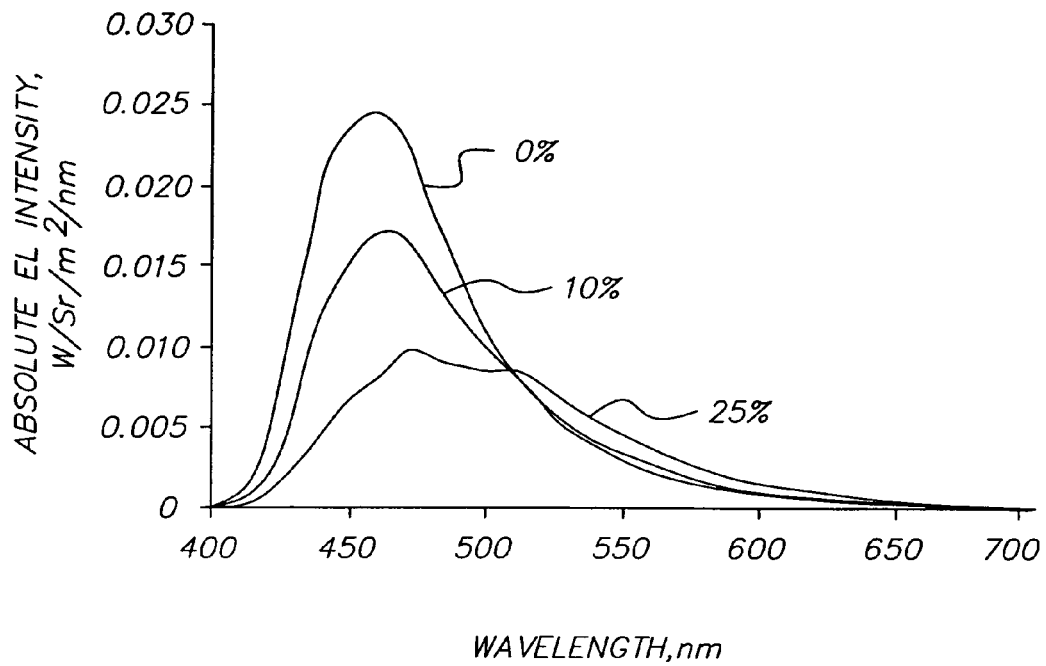
FIG. 12 shows electroluminescence spectra of an OLED device where the light-emitting layer is composed of coronene and TBADN; current density is 20 mA/cm$^2$.

FIG. 12 shows the absolute EL spectra of an OLED device where the light-emitting layer is composed of coronene and TBADN. The EL spectra signal that formation of an aggregate state of coronene occurs. With increasing concentration of coronene the aggregate contribution to the overall EL increases. The EL spectra are composed primarily of the emission spectrum of coronene in its aggregate state with some contribution of the emission of TBADN.

Figure 13:
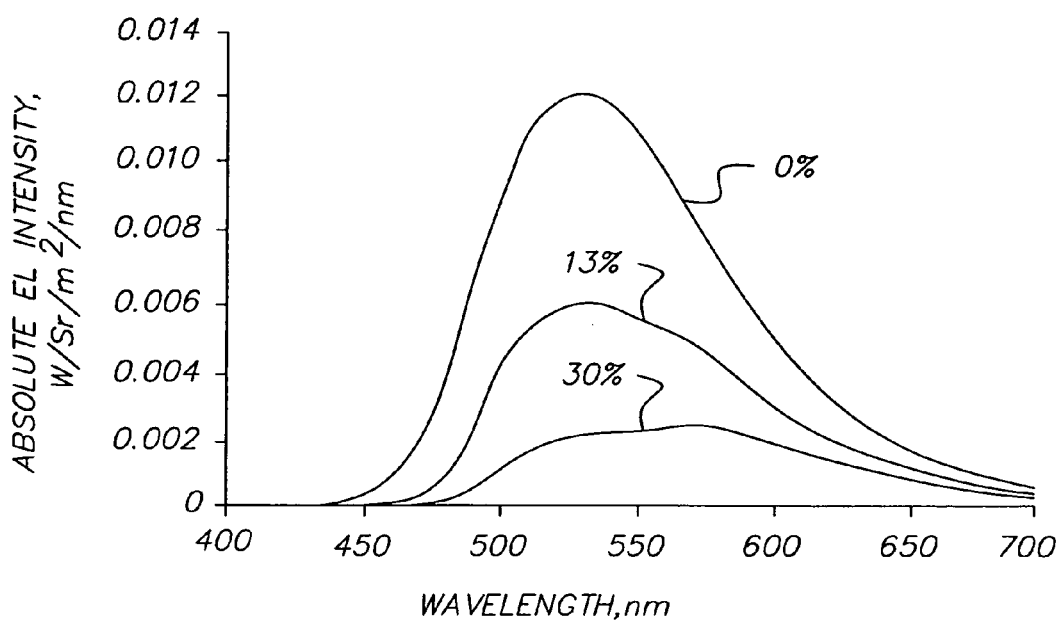
FIG. 13 shows electroluminescence spectra of an OLED device where the light-emitting layer is composed of decacyclene and AlQ$_3$; current density is 20 mA/cm$^2$.

FIG. 13 shows the absolute EL spectra of an OLED device where the light-emitting layer is composed of decacyclene and AlQ$_3$. The EL spectra signal that formation of an aggregate state of decacyclene occurs. With increasing concentration of decacyclene the aggregate contribution to the overall EL increases. The EL spectra are composed primarily of the emission spectrum of decacyclene in its aggregate state with some contribution of the emission of AlQ$_3$.

Figure 14:
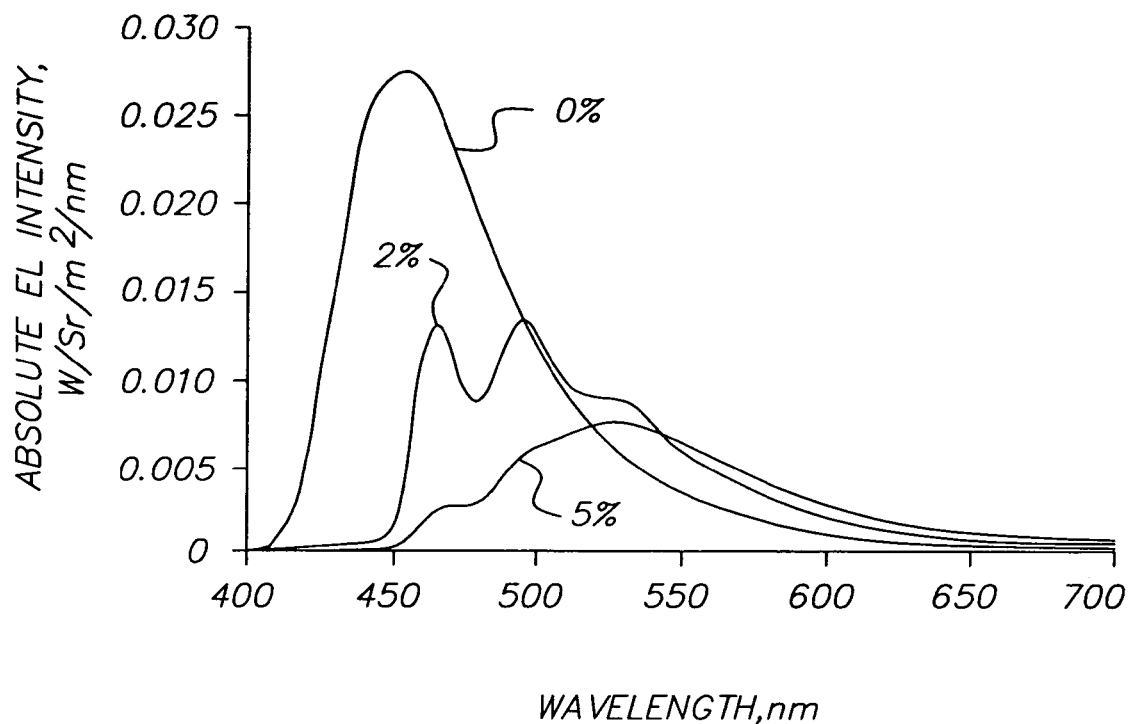
FIG. 14 shows electroluminescence spectra of an OLED device where the light-emitting layer is composed of dibenzo[b,def]chrysene and TBADN; current density is 20 mA/cm$^2$.

FIG. 14 shows the absolute EL spectra of an OLED device where the light-emitting layer is composed of dibenzo[b,def]chrysene and TBADN. The EL spectra signal that formation of an aggregate state of dibenzo[b,def]chrysene occurs. With increasing concentration of dibenzo[b,def]chrysene the aggregate contribution to the overall EL drastically increases. The EL spectra are composed of the emission spectrum of dibenzo[b,def]chrysene in its monomer state and the emission of its aggregate state.

Figure 15:
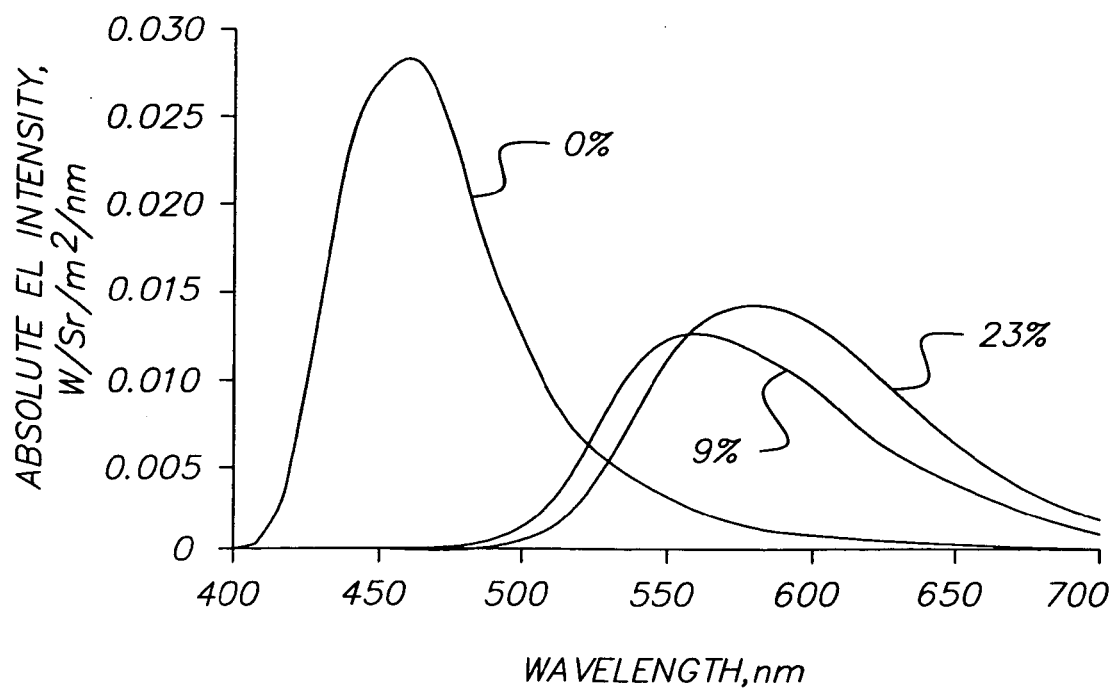
FIG. 15 shows electroluminescence spectra of an OLED device where the light-emitting layer is composed of peropyrene and TBADN; current density is 20 mA/cm$^2$.

FIG. 15 shows the absolute EL spectra of an OLED device where the light-emitting layer is composed of peropyrene (dibenzo[cd,lm]perylene) and TBADN. The EL spectra signal that formation of an aggregate state of peropyrene occurs. With increasing concentration of peropyrene the aggregate contribution to the overall EL drastically increases. The EL spectra are composed primarily of the emission spectrum of peropyrene in its aggregate state.

Figure 16:
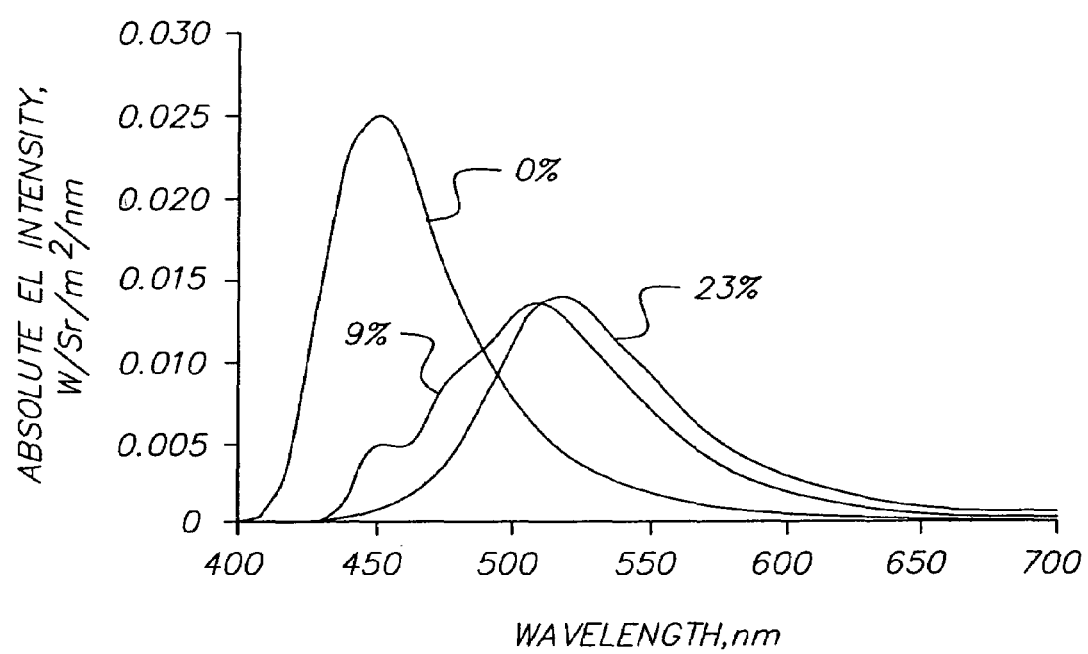
FIG. 16 shows electroluminescence spectra of an OLED device where the light-emitting layer is composed of perylene and TBADN; current density is 20 mA/cm$^2$.

FIG. 16 shows the absolute EL spectra of an OLED device where the light-emitting layer is composed of perylene and TBADN. The EL spectra signal that formation of an aggregate state of perylene occurs. With increasing concentration of perylene the aggregate contribution to the overall EL drastically increases. The EL spectra are composed primarily of the emission spectrum of perylene in its aggregate state.

According to the present invention, the luminescent layer (either layer 232 of FIG. 2 or layer 333 of FIG. 3) is primarily responsible for the electroluminescence emitted from the OLED device. One of the most commonly used formulations for this luminescent layer is an organic thin film including a host and one or more dopants. The host serves as the solid medium or matrix for the transport and recombination of charge carriers injected from the anode and the cathode. The dopant, usually homogeneously distributed in the host in small quantity, provides the emission centers where light is generated. Following the teaching of the prior art, the present invention uses a luminescent layer including a host and a dopant, but it distinguishes over the prior art that the host of the present invention is a mixture having at least two components, each component having specific electronic properties. The selection of these host components and compatible dopant materials is in accordance with the following criteria:

1. The host is a solid organic thin film comprising a mixture of at least two components;
2. The first component of the mixture is an organic compound that is capable of transporting either electrons or holes or both;
3. The first component of the mixture is capable of forming both monomer state and an aggregate state;
4. The first component of the mixture is capable of forming the aggregate state either in the ground electronic state or in the excited electronic state;
5. The first component of the mixture is capable of forming the aggregate state that results in a different absorption or emission spectrum or both relative to the absorption or emission spectrum or both of the monomer state, respectively (the aggregate state can emit or absorb or both to the red or to the blue of the emission or absorption spectrum or both of the monomer state, respectively);
6. The first component of the mixture is capable of forming the aggregate state whose presence results in a quantum yield of luminescence of the monomer state being different relative to the quantum yield of luminescence of the monomer state in the absence of the aggregate states (the quantum yield of luminescence for the monomer state can be either enhanced or reduced);
7. The second component of the mixture is an organic compound that upon mixing with the first host component is capable of forming a continuous and substantially pin-hole-free layer;
8. The dopant is an organic luminescent compound capable of accepting the energy released from the recombination of electrons and holes in either the first or second host components, and emitting the energy as light.

Following the selection criteria of this invention, OLED devices have been constructed having excellent operational stability. Importantly, for red devices the luminance efficiency measured in candelas per ampere significantly increases, compared to the system without the first component, and remains constant over a large range of brightness or current densities. In addition, the color chromaticity is greatly improved and the drive voltage is reduced. This is a distinct advantage over the prior art, where such operational stability improvements over comparative examples combined with such long lifetimes have never been demonstrated, the luminance efficiency often decreases, or otherwise varies, with increasing brightness or current density, color chromaticity is often compromised, and drive voltage often increases. Another important advantage is that the chromaticity also remains essentially constant, independent of the brightness or current density. Thus, the problem of color shift with brightness in an OLED device is also eliminated.

Preferred materials for the first host component of the luminescent layer of this invention include a class of compounds which, for the purpose of this invention, will be referred to as benzenoid compounds and N—, O—, Si—, B—, P—, and S-atom containing heterocyclic compounds. The benzenoid compounds comprise polycyclic hydrocarbons (PAH), combinations of two or more PAH which are chemically linked, and combinations of two or more PAH which are not chemically linked. Non-benzenoid aromatic hydrocarbons such as azulene and its derivatives are included in the list of preferred materials for the first host component also. Essentially any more or less flat and rigid molecule, or one having a flat and rigid part, has a propensity to undergo aggregation and form an aggregate state and as such is included in the list of preferred materials for the first host component of the luminescent layer of this invention. Possible exceptions include compounds that undergo known unfavorable chemical reactions either thermally, photochemically, or upon electrochemical oxidation or reduction in an OLED device. For example, 1,3-diphenylisobenzofuran readily undergoes Diels-Alder reactions as well as rearrangement and condensation reactions; truxenes, fluorenes, and other compounds having Aryl-$CH_2$-Aryl' or Aryl-CH(Aryl")-Aryl' bridges have labile hydrogen atoms; esters undergo dissociation and decarboxylation reactions, alcohols and acids undergo deprotonation, etc. Another example of an exception that depends on the nature of the use of the material in an OLED device can include certain heterocyclic molecules such as imidazoles, triazoles, oxadiazoles, pyridines, phenanthrolines, and others which are known to undergo certain chemical transformations in an OLED device upon their electrochemical oxidation (hole injection) that leads to short operational lifetimes. Another example of possible exception includes molecules containing chloro-, bromo-, or iodo-substituents which upon electrochemical oxidation or reduction undergo possible cleavage or dissociation reactions that lead to short operational stabilities of an OLED device. Benzenoid and heterocyclic compounds absorbing light in the UV, near UV, and visible region up to 450 nm are preferred materials for the first host component of a blue-emitting OLED device and blue layer of a white-emitting OLED device. Benzenoid and heterocyclic compounds absorbing light in the UV, near UV, and visible region up to 490 nm are preferred materials for the first host component of a blue-green-emitting OLED device and blue-green layer of a white-emitting OLED device. Benzenoid and heterocyclic compounds absorbing light in the UV, near UV, and visible region up to 520 nm are preferred materials for the first host component of a green-emitting OLED device and green layer of a white-emitting OLED device. Benzenoid and heterocyclic compounds absorbing light in the UV, near UV, and visible region up to 580 nm are preferred materials for the first host component of a yellow-orange-emitting OLED device and yellow-orange layer of a white-emitting OLED device. Benzenoid and heterocyclic compounds absorbing light in the UV, near UV, and visible region up to 630 nm are preferred materials for the first host component of a red-emitting OLED device and red layer of a white-emitting OLED device.

The list of simple PAH useful as building blocks and parent structures for benzenoid compounds or derivatives thereof includes:
1. Benzene
2. Naphthalene
3. Phenanthrene
4. Chrysene
5. Anthracene
6. Naphthacene
7. Pentacene
8. Hexacene
9. Heptacene
10. Pyrene
11. Perylene
12. Benzo[ghi]perylene
13. Benzo[a]perylene
14. Benzo[b]perylene
15. Coronene
16. Fluoranthene
17. Fluorene 18. Tetraphene
19. Pentaphene
20. Hexaphene
21. Aceanthrylene
22. Acepyrene
23. Aceperylene
24. Anthanthrene
25. Indene
26. Triphenylene
27. Biphenyl
28. Terphenyl
29. Quarterphenyl
30. Quinqephenyl
31. Sexiphenyl
32. Binaphthyl
33. Picene
34. Pyranthrene
35. Bisanthrene (bisanthene)
36. Ovalene
37. Peropyrene
38. Triptycene
39. Phenalene The list of simple heterocycles useful as building blocks for heterocyclic compounds or derivatives thereof includes:
40. Pyrrole
41. Pyrazole
42. Imidazole
43. 1,2,3-Triazole
44. 1,2,4-Triazole
45. 1,2-Dithiole
46. 1,3-Dithiole
47. 1,2-Oxathiole
48. Isoxazole
49. Oxazole
50. Thiazole
51. Isothiazole
52. 1,2,4-Oxadiazole
53. 1,2,5-Oxadiazole
54. 1,3,4-Oxadiazole
55. 1,2,3,4-Oxatriazole
56. 1,2,3,5-Oxatriazole
57. 1,2,3-Dioxazole
58. 1,2,4-Dioxazole
59. 1,3,2-Dioxazole
60. 1,3,4-Dioxazole
61. 1,2,5-Oxathiazole
62. 1,3-Oxathiole
63. Pyridine
64. Pyridazine
65. Pyrimidine
66. Pyrazine
67. 1,3,5-Triazine
68. 1,2,4-Triazine
69. 1,2,3-Triazine
70. Furan
71. Dibenzofuran
72. Benzofuran
73. Isobenzofuran
74. Thiophene
75. Dibenzothiophene
76. Benzo[b]thiophene
77. Benzo[c]thiophene
78. Indole
79. Pyrano[3,4-b]pyrrole
80. Indazole
81. Indoxazine
82. Benzoxazole
83. Quinoline
84. Isoquinoline
85. Cinnoline
86. Quinazoline
87. 1,8-Naphthyridine
88. 1,7-Naphthyridine
89. 1,6-Naphthyridine
90. 1,5-Naphthyridine
91. Benzoxazine
92. Carbazole
93. Xanthene
94. Acridine
95. Purine
96. Dibenzo[f,h]quinoline (1-Azatriphenylene)
97. Dibenzo[f,h]quinoxaline (1,4-Diazatriphenylene)
98. Phenanthridine
99. 1,7-Phenanthroline
100. 1,10-Phenanthroline
101. 4,7-Phenanthroline
102. Phenazine The list of preferred benzenoid compounds or alkyl, alkenyl, alkynyl, aryl, substituted aryl, silyl, ace, indeno, 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP,

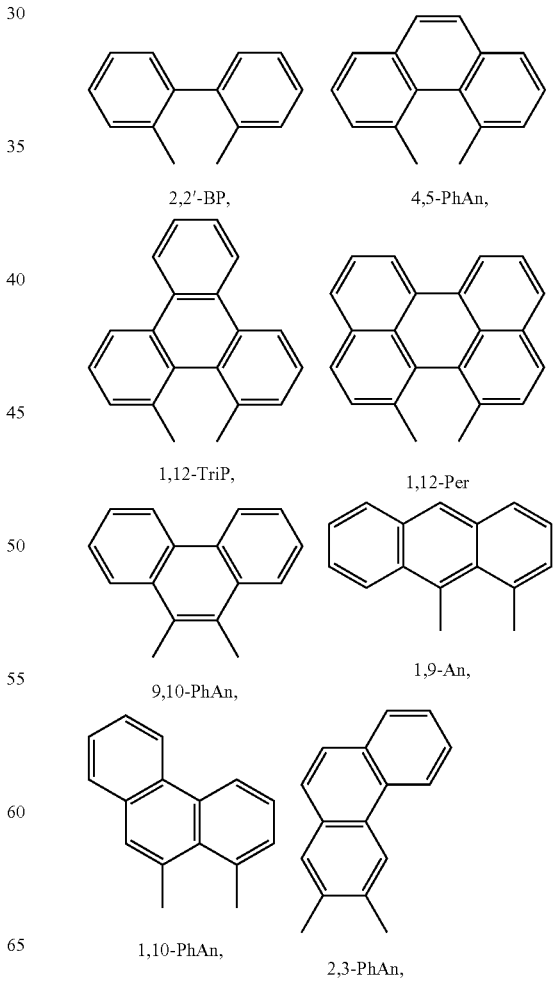

2,2'-BP,  4,5-PhAn, 1,12-TriP,  1,12-Per 9,10-PhAn,  1,9-An, 1,10-PhAn,  2,3-PhAn,

-continued

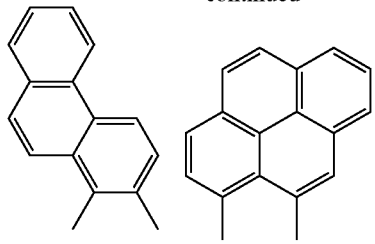

1,2-PhAn,   1,10-Pyr,

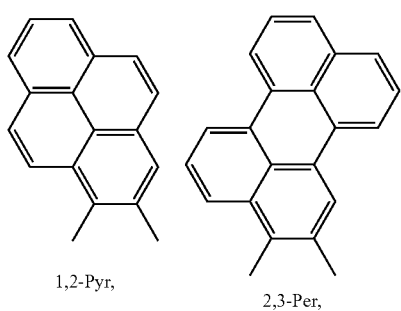

1,2-Pyr,   2,3-Per,

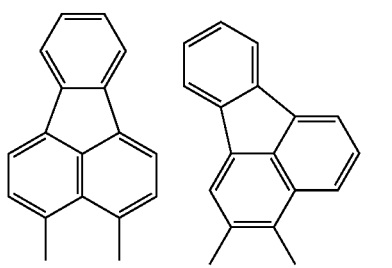

3,4-FlAn,   2,3-FlAn,

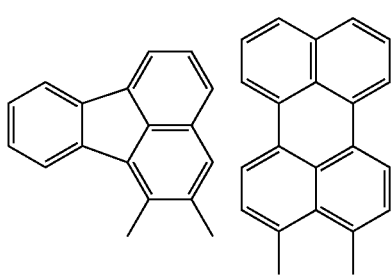

1,2-FlAn,   3,4-Per,

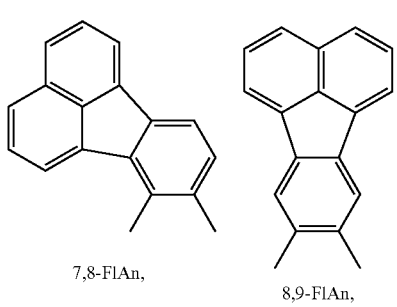

7,8-FlAn,   8,9-FlAn,

-continued

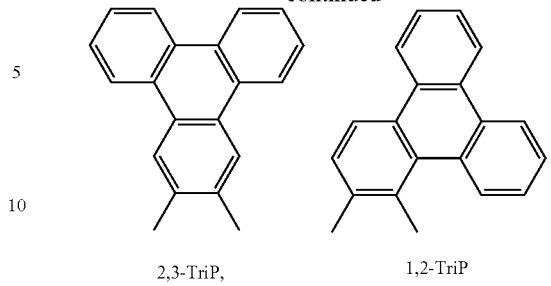

2,3-TriP,   1,2-TriP (where bonds that do not form a cycle indicate points of attachment), fluoro, cyano, alkoxy, aryloxy, amino, aza, oxo, thia, heterocyclic, keto, and dicyanomethyl derivatives thereof as materials for the first host component of the luminescent layer of this invention includes:

103. Picene
104. Benzo[a]anthracene
105. Benzo[ghi]perylene
106. Benzo[a]pyrene
107. Benzo[e]pyrene
108. Benzo[a]naphthacene
109. Naphtho[2,3-a]pyrene
110. Naphtho[2,3-e]pyrene
111. Rubicene
112. Anthanthrene
113. Fluoranthene
114. Benzo[a]coronene
115. Dibenzo[b,def]chrysene
116. Naphtho[2,3-a]coronene
117. Dibenzo[cd,lm]perylene
118. Benzo[ghi]naphtho[cde]perylene
119. Benzo[b]perylene
120. Benzo[a]pentacene
121. Benzo[a]perylene
122. Naphtho[8,1,2-bcd]perylene
123. Dibenzo[b,k]perylene
124. Dibenzo[b,n]perylene
125. Naphtho[1,2-a]pyrene
126. Naphtho[1,2-e]pyrene
127. Benzo[rst]pentaphene
128. Dibenzo[def,p]chrysene
129. Dibenzo[fg,op]naphthacene
130. Dibenzo[h,rst]pentaphene
131. Terrylene
132. Aceanthrylene
133. Acenaphth[1,2-a]anthracene
134. Acenaphth[1,2-b]anthracene
135. Acenaphthalene
136. Acenaphthene
137. Acenaphtho[1,2,3-cde]pyrene
138. Acenaphtho[1,2-b]phenanthrene
139. Acenaphtho[1,2j]fluoranthene
140. Acenaphtho[1,2-k]cyclopenta[cd]fluoranthene
141. Acenaphtho[1,2-k]fluoranthene
142. 13H-Acenaphtho[1,8-ab]phenanthrene
143. Acenaphthylene
144. Aceperylene
145. Acephenanthrene
146. Acepyrene
147. Acepyrylene
148. [6] Annulene
149. Anthanthrene 150. Anthra[1,2,3,4-rst]pentaphene
151. Anthra[1,2-a]aceanthrylene
152. Anthra[1,2-a]anthracene
153. Anthra[1,2-a]benz[j]anthracene
154. Anthra[1,2-a]naphthacene
155. Anthra[1,2-b]phenanthrene
156. Anthra[1,9,8-abcd]benzo[hi]coronene
157. Anthra[2,1,9,8-stuva]benzo[op]naphtho[2,1,8,7-hijk]pentacene
158. Anthra[2,1,9,8,7-defghi]benzo[op]pentacene
159. Anthra[2,1,9,8,7-defghi]benzo[st]pentacene
160. Anthra[2,1,9,8,7-defghi]benzo[uv]pentacene
161. Anthra[2,1,9,8-defgh]benzo[rst]pentaphene
162. Anthra[2,1,9,8-defgh]pentaphene
163. Anthra[2,1,9,8-opqra]naphthacene
164. Anthra[2,1,9,8-stuva]pentacene
165. Anthra[2,1,9-qra]naphthacene
166. Anthra[2,1-a]aceanthrylene
167. Anthra[2,1-a]naphthacene
168. Anthra[2,3-a]coronene
169. Anthra[2,3-a]naphthacene
170. Anthra[3,2,1,9,8-rstuva]benzo[ij]pentaphene
171. Anthra[3,2,1,9-pqra]benzo[cd]perylene
172. Anthra[7,8,9,1,2,3-rstuvwx]hexaphene
173. Anthra[8,9,1,2-cdefg]benzo[a]naphthacene
174. Anthra[8,9,1,2-lmnop]benzo[a]naphthacene
175. Anthra[9,1,2-abc]coronene
176. Anthra[9,1,2-bcd]perylene
177. Anthra[9,1,2-cde]benzo[rst]pentaphene
178. Anthra[9,1-bc]fluorene
179. Anthracene
180. Anthraceno-1',2',1,2-anthracene
181. Anthraceno[2,1-a]anthracene
182. Anthrodianthrene
183. 4,5-Benz-10,11-(1',2'-naphtha)chrysene
184. Benz[4,10]anthra[1,9,8-abcd]coronene
185. 15H-Benz[4,5]indeno[1,2-1]phenanthrene
186. 9H-Benz[4,5]indeno[2,1-c]phenanthrene
187. 7H-Benz[5,6]indeno[1,2-a]phenanthrene
188. Benz[5,6]indeno[2,1-a]phenalene
189. 7H-Benz[5,6]indeno[2,1-a]phenanthrene
190. 9H-Benz[5,6]indeno[2,1-c]phenanthrene
191. Benz[a]aceanthrylene
192. Benz[a]acenaphthylene
193. Benz[a]acephenanthrylene
194. 1,2:5,6-Benz[a]anthracene
195. Benz[a]anthracene
196. Benz[a]indeno[1,2-c]fluorene
197. Benz[a]indeno[2,1-c]naphthalene
198. Benz[a]indeno[5,6-g]fluorene
199. Benz[a]ovalene
200. Benz[b]anthracene
201. Benz[b]indeno[2,1-h]fluorene
202. 11H-Benz[bc]aceanthrylene
203. Benz[c]indeno[2,1-a]fluorene
204. Benz[d]aceanthrylene
205. Benz[d]ovalene
206. 1H-Benz[de]anthracene
207. Benz[de]indeno[2,1-b]anthracene
208. Benz[def]indeno[1,2,3-hi]chrysene
209. Benz[def]indeno[1,2,3-qr]chrysene
210. Benz[e]aceanthrylene
211. 3,4-Benz[e]acephenanthrylene
212. Benz[e]acephenanthrylene
213. 3H-Benz[e]indene
214. 1H-Benz[e]indene
215. 1H-Benz[f]indene
216. 1H-Benz[fg]aceanthrylene
217. 5H-Benz[fg]acenaphthylene
218. 10H-Benz[g]indeno[2,1-a]phenanthrene
219. Benz[j]aceanthrylene
220. Benz[j]acephenanthrylene
221. Benz[k]acephenanthrylene
222. Benz[l]aceanthrylene
223. Benz[l]acephenanthrylene
224. Benz[mno]aceanthrylene
225. Benz[mno]indeno[1,7,6,5-cdef]chrysene
226. Benz[mno]indeno[5,6,7,1-defg]chrysene
227. 2,3-Benzanthracene
228. 1,2:5,6-Benzanthracene
229. 1,2-Benzanthracene
230. 1,2-Benzanthrene
231. 1H-meso-Benzanthrene
232. Benzanthrene
233. Benzanthreno-Bz-1,Bz-2:2,3-naphthalene
234. 9,10[1',2']-Benzenoanthracene, 9,10-dihydro
235. 7,8-Benzfluoranthene
236. 2,3-Benzidene
237. 1,10-(peri)-Benzo-1,5-dihydropyrene
238. 2,3-Benzo-6,7-naphthoanthracene
239. 1.14-Benzobisanthene
240. 1.14-Benzodinaphtho[1'.7',2,4],[7'''.1''',11.13]bisanthene
241. Benzo[1,2-a,3,4-a',5,6-a'']triacenaphthylene
242. Benzo[1,2-a,4,5-a']diacenaphthylene
243. Benzo[2,1-a:3,4-a']dianthracene
244. Benzo[3,4]phenanthro[2,1,10,9,8,7-pqrstuv]pentaphene
245. Benzo[6,7]phenanthro[4,3-b]chrysene
246. Benzo[a]anthanthrene
247. Benzo[a]coronene
248. 1H-Benzo[a]cyclopent[h]anthracene
249. 9H-Benzo[a]cyclopent[i]anthracene
250. Benzo[a]cyclopenta[de]naphthacene
251. Benzo[a]cyclopenta[fg]naphthacene
252. Benzo[a]cyclopenta[hi]naphthacene
253. Benzo[a]cyclopenta[mn]naphthacene
254. Benzo[a]cyclopenta[op]naphthacene
255. Benzo[a]fluoranthene
256. 11H-Benzo[a]fluorene
257. Benzo[a]fluorene
258. Benzo[a]heptacene
259. Benzo[a]hexacene
260. Benzo[a]hexaphene
261. Benzo[a]naphth[2,1-j]anthracene
262. Benzo[a]naphthacene
263. Benzo[a]naphtho[1,2,3,4-ghi]perylene
264. Benzo[a]naphtho[1,2-c]naphthacene
265. Benzo[a]naphtho[1,2-h]anthracene
266. Benzo[a]naphtho[1,2-j]naphthacene
267. Benzo[a]naphtho[1,2-l]naphthacene
268. Benzo[a]naphtho[2,1,8-cde]perylene
269. Benzo[a]naphtho[2,1,8-hij]naphthacene
270. Benzo[a]naphtho[2,1,8-lmn]perylene
271. Benzo[a]naphtho[2,1-h]pyrene
272. Benzo[a]naphtho[2,1-j]naphthacene
273. Benzo[a]naphtho[2,1-l]naphthacene
274. Benzo[a]naphtho[7,8,1,2,3-pqrst]pentaphene
275. Benzo[a]naphtho[8,1,2-cde]naphthacene
276. Benzo[a]naphtho[8,1,2-klm]perylene
277. Benzo[a]naphtho[8,1,2-lmn]naphthacene
278. Benzo[a]pentacene
279. Benzo[a]pentaphene
280. Benzo[a]perylene 281. Benzo[a]phenanthrene
282. Benzo[a]picene
283. Benzo[a]pyranthrene
284. Benzo[a]pyrene
285. Benzo[b]anthanthrene
286. Benzo[b]chrysene
287. 5H-Benzo[b]cyclopenta[def]chrysene
288. 13H-Benzo[b]cyclopenta[def]triphenylene
289. Benzo[b]cyclopenta[hi]chrysene
290. 4H-Benzo[b]cyclopenta[jkl]triphenylene
291. 4H-Benzo[b]cyclopenta[mno]chrysene
292. Benzo[b]cyclopenta[qr]chrysene
293. Benzo[b]fluoranthene
294. 11H-Benzo[b]fluorene
295. Benzo[b]naphthacene
296. Benzo[b]naphtho[1,2,3,4-pqr]perylene
297. Benzo[b]naphtho[1,2-k]chrysene
298. Benzo[b]naphtho[1,2-l]chrysene
299. Benzo[b]naphtho[2,1-g]chrysene
300. Benzo[b]naphtho[2,1-k]chrysene
301. Benzo[b]naphtho[2,1-p]chrysene
302. Benzo[b]naphtho[2,3-g]chrysene
303. Benzo[b]naphtho[2,3-j]chrysene
304. Benzo[b]naphtho[2,3-l]chrysene
305. Benzo[b]naphtho[8,1,2-pqr]chrysene
306. Benzo[b]pentahelicene
307. Benzo[b]pentaphene
308. Benzo[b]perylene
309. Benzo[b]phenanthrene
310. Benzo[b]picene
311. Benzo[b]triphenylene
312. Benzo[bc]naphtho[1,2,3-ef]coronene
313. Benzo[bc]naphtho[3,2,1-ef]coronene
314. Benzo[c]chrysene
315. Benzo[c]cyclopenta[hi]chrysene
316. 4H-Benzo[c]cyclopenta[mno]chrysene
317. Benzo[c]cyclopenta[qr]chrysene
318. Benzo[c]fluorene
319. 7H-Benzo[c]fluorene
320. Benzo[c]hexaphene
321. Benzo[c]naphtho[1,2-l]chrysene
322. Benzo[c]naphtho[2,1-m]pentaphene
323. Benzo[c]naphtho[2,1-p]chrysene
324. Benzo[c]naphtho[2,3-l]chrysene
325. Benzo[c]naphtho[7,8,1,2,3-pqrst]pentaphene
326. Benzo[c]naphtho[8,1,2-ghi]chrysene
327. Benzo[e]naphtho[2,3-a]pyrene
328. Benzo[c]pentahelicene
329. Benzo[c]pentaphene
330. Benzo[c]phenanthrene
331. Benzo[c]picene
332. Benzo[c]tetraphene
333. 1H-Benzo[cd]fluoranthene
334. Benzo[cd]naphtho[3,2,1,8-pqra]perylene
335. 6H-Benzo[cd]pyrene
336. 3H-Benzo[cd]pyrene
337. 5H-Benzo[cd]pyrene
338. 2H-Benzo[cd]pyrene
339. Benzo[de]cyclopent[a]anthracene
340. Benzo[de]cyclopent[b]anthracene
341. Benzo[de]naphtho[2,1,8,7-qrst]pentacene
342. Benzo[de]naphtho[3,2,1-mn]naphthacene
343. Benzo[de]naphtho[8,1,2,3-stuv]picene
344. 7H-Benzo[de]pentacene
345. Benzo[def]chrysene
346. Benzo[def]cyclopenta[hi]chrysene
347. 4H-Benzo[def]cyclopenta[mno]chrysene
348. Benzo[def]cyclopenta[qr]chrysene
349. Benzo[def]fluorene
350. Benzo[def]phenanthrene
351. Benzo[def]pyranthrene
352. Benzo[e]anthanthrene
353. Benzo[e]cyclopenta[jk]pyrene
354. Benzo[e]cyclopenta[jk]pyrene
355. Benzo[e]fluoranthene
356. Benzo[e]phenanthro[1,10,9,8-opqra]perylene
357. Benzo[e]phenanthro[2,3,4,5-pqrab]perylene
358. Benzo[e]pyrene
359. Benzo[ef]phenaleno[9,1,2-abc]coronene
360. Benzo[c]phenanthrene
361. Benzo[f]pentahelicene
362. Benzo[f]picene
363. Benzo[fg]cyclopent[a]anthracene
364. Benzo[fg]naphtho[1,2,3-op]naphthacene
365. Benzo[fgh]dinaphtho[1,2,3,4-pqr:1',2',3',4'-zalbl]trinaphthylene
366. Benzo[g]chrysene
367. 8H-Benzo[g]cyclopenta[mno]chysene
368. Benzo[g]naphtho[2,1-b]chrysene
369. Benzo[g]naphtho[8,1,2-abc]coronene
370. Benzo[ghi]cyclopenta[cd]perylene
371. 1H-Benzo[ghi]cyclopenta[pqr]perylene
372. Benzo[ghi]fluoranthene
373. Benzo[ghi]naphtho[1,2-b]perylene
374. Benzo[ghi]naphtho[2,1-a]perylene
375. Benzo[ghi]naphtho[2,1-b]perylene
376. Benzo[ghi]naphtho[2',1',8',7':5,6,7]aceanthryleno[10,1,2-abcd]perylene (Circumanthracene)
377. Benzo[ghi]perylene
378. Benzo[h]naphtho[1,2,3,4-rst]pentaphene
379. Benzo[h]naphtho[7,8,1,2,3-pqrst]pentaphene
380. Benzo[h]pentaphene
381. Benzo[h]phenanthro[2,1,10,9,8,7-pqrstuv]pentaphene
382. 7H-Benzo[hi]chrysene
383. 4H-Benzo[hi]chrysene
384. Benzo[i]pentahelicene
385. Benzo[ij]dinaphtho[2,1,8,7-defg:7',8',1',2',3'-pqrst]pentaphene
386. Benzo[ij]naphtho[2,1,8,7-defg]pentaphene
387. Benzo[j]benzo[2,1-a:3,4-a']dianthracene
388. Benzo[j]fluoranthene
389. Benzo[j]naphtho[8,1,2-abc]coronene
390. Benzo[k]fluorene
391. Benzo[k]fluoranthene
392. Benzo[kl]naphtho[2,1,8,7-defg]pentaphene
393. Benzo[l]cyclopenta[cd]pyrene
394. Benzo[l]fluoranthene
395. Benzo[l]naphtho[1,2-b]chrysene
396. Benzo[l]naphtho[2,1-b]chrysene
397. Benzo[l]phenanthrene
398. Benzo[lm]naphtho[1,8-ab]perylene
399. Benzo[lm]phenanthro[5,4,3-abcd]perylene
400. Benzo[lmn]naphtho[2,1,8-qra]perylene
401. Benzo[m]diphenanthro[1,10,9-abc:1',10',9'-ghi]coronene
402. Benzo[m]naphtho[8,1,2-abc]coronene
403. Benzo[mno]fluoranthene
404. Benzo[mno]naphtho[1,2-c]chrysene
405. Benzo[mno]naphtho[2,1-c]chrysene
406. Benzo[o]hexaphene
407. 8H-Benzo[p]cyclopenta[def]chrysene
408. Benzo[p]hexaphene
409. Benzo[p]naphtho[1,2-b]chrysene
410. Benzo[p]naphtho[1,8,7-ghi]chrysene 411. Benzo[p]naphtho[2,1-b]chrysene
412. Benzo[p]naphtho[8,1,2-abc]coronene
413. Benzo[pqr]dinaphtho[8,1,2-bcd:2',1',8'-lmn]perylene
414. Benzo[pqr]naphtho[1,2-b]perylene
415. Benzo[pqr]naphtho[2,1,8-def]picene
416. Benzo[pqr]naphtho[2,1-b]perylene
417. Benzo[pqr]naphtho[8,1,2-bcd]perylene
418. Benzo[pqr]naphtho[8,1,2-cde]picene
419. Benzo[pqr]picene
420. Benzo[q]hexaphene
421. Benzo[qr]naphtho[2,1,8,7-defg]pentacene
422. Benzo[qr]naphtho[2,1,8,7-fghi]pentacene
423. Benzo[qr]naphtho[3,2,1,8-defg]chrysene
424. Benzo[qrs]naphtho[3,2,1,8,7-defgh]pyranthrene
425. Benzo[rs]dinaphtho[2,1,8,7-klmn:3',2',1',8',7'-vwxyz]hexaphene
426. Benzo[rst]dinaphtho[8,1,2-cde:2',1',8'-klm]pentaphene
427. Benzo[rst]dinaphtho[defg,ijkl]pentaphene
428. Benz[rst]anthra[cde]pentaphene
429. Benzo[rst]naphtho[2,1,8-fgh]pentaphene
430. Benzo[rst]naphtho[8,1,2-cde]pentaphene
431. Benzo[rst]pentaphene
432. Benzo[rst]phenaleno[1,2,3-de]pentaphene (Violanthrene C)
433. Benzo[rst]phenanthro[1,10,9-cde]pentaphene
434. Benzo[rst]phenanthro[10,1,2-cde]pentaphene
435. Benzo[rst]pyreno [1,10,9-cde]pentaphene
436. Benzo[s]picene
437. Benzo[st]naphtho[2,1,8,7-defg]pentacene
438. Benzo[tuv]naphtho[2,1-b]picene
439. Benzo[uv]naphtho[2,1,8,7-defg]pentacene
440. Benzo[uv]naphtho[2,1,8,7-defg]pentaphene
441. Benzo[vwx]hexaphene
442. 1,2-Benzoacenaphthylene
443. Benzobenzanthrene
444. 2,3-Benzochrysene
445. 15,16-Benzodehydrocholanthrene
446. o-meso-Benzodianthrene
447. p-meso-Benzodianthrene
448. 11,12-Benzofluoranthene
449. 2,13-Benzofluoranthene
450. Benzofluoranthene
451. 7,10-Benzofluoranthene
452. 8,9-Benzofluoranthene
453. 10,11-Benzofluoranthene
454. 3,4-Benzofluoranthene
455. 2,3-Benzofluoranthene
456. 1,2-Benzofluorene
457. 2,3-Benzofluorene
458. 3,4-Benzofluorene
459. 1H-Benzonaphthene
460. 1,12-Benzoperylene
461. 1,2-Benzoperylene
462. 2,3-Benzoperylene
463. 1,2-Benzophenanthrene
464. 2,3-Benzophenanthrene
465. 3,4-Benzophenanthrene
466. 9,10-Benzophenanthrene
467. 2,3-Benzopicene
468. 6,7-Benzopyrene
469. 3,4-Benzopyrene
470. 3,4-Benzotetraphene
471. 1,2-Benzperylene
472. 1,2-Benzpyrene
473. 4,5-Benzpyrene
474. 2,3-Benztriphenylene
475. 1,1'-Bicoronene
476. 2,3:1',8'-Binaphthylene
477. 3,4-(o,o'-Biphenylene)cyclopentadiene
478. 3,4-(o,o'-Biphenylene)fluorene
479. o-Biphenylenemethane
480. Biphenylenephenanthrene
481. o-Biphenylmethane
482. Bisanthrene
483. Ceranthrene
484. homeo-Cerodianthrene
485. Cholanthrene
486. Cholanthrylene
487. Chrysene
488. Chryseno[2,1-b]picene
489. Chrysofluorene
490. Corannulene
491. Coronene
492. 1,2-Cyclo-delta 1',3'-pentadienophenanthrene
493. 1,2-Cyclo-delta 1',4'-pentadienophenanthrene
494. Cyclohexatriene
495. 1H-Cyclopent[a]anthracene
496. 1H-Cyclopent[b]anthracene
497. Cyclopent[b]indeno[4,5-g]phenanthrene
498. Cyclopent[b]indeno[5,6-g]phenanthrene
499. Cyclopent[i]indeno[5,6-a]anthracene
500. Cyclopenta[1,2-a:3,4,5-b'c']dicoronene
501. 17H-Cyclopenta[a]phenanthrene
502. 15H-Cyclopenta[a]phenanthrene
503. 1H-Cyclopenta[a]pyrene
504. 11H-Cyclopenta[a]triphenylene
505. 8H-Cyclopenta[b]phenanthrene
506. Cyclopenta[cd]perylene
507. Cyclopenta[cd]pyrene
508. Cyclopenta[de]anthracene
509. Cyclopenta[de]naphthacene
510. Cyclopenta[de]naphthalene
511. Cyclopenta[de]pentacene
512. Cyclopenta[de]pentaphene
513. Cyclopenta[de]picene
514. 4H-Cyclopenta[def]chrysene
515. 4H-Cyclopenta[def]phenanthrene
516. 4H-Cyclopenta[def]triphenylene
517. 1H-Cyclopenta[e]pyrene
518. Cyclopenta[fg]naphthacene
519. Cyclopenta[fg]pentacene
520. Cyclopenta[fg]pentaphene
521. 11H-Cyclopenta[ghi]perylene
522. 6H-Cyclopenta[ghi]picene
523. Cyclopenta[hi]chrysene
524. Cyclopentak[jk]phenanthrene
525. 1H-Cyclopenta[l]phenanthrene
526. 2H-Cyclopenta[l]phenanthrene
527. Cyclopenta[pq]pentaphene
528. 13H-Cyclopenta[pqr]picene
529. 13H-Cyclopenta[rst]pentaphene
530. Cyclopentaphenanthrene
531. Decacyclene
532. Dehydro-8,9-trimethylene-1,2-benzanthracene
533. 3,4,1,6-Di(1,8-naphthylene)benzene
534. 1,9,5,10-Di(peri-naphthylene)anthracene
535. Di-beta-naphthofluorene
536. Dibenz[a,c]anthracene
537. Dibenz[a,e]aceanthrylene
538. Dibenz[a,e]acephenanthrylene
539. Dibenz[a,h]anthracene
540. Dibenz[a,j]aceanthrylene
541. Dibenz[a,j]anthracene
542. Dibenz[a,k]acephenanthrylene 543. 7H-Dibenz[a,kl]anthracene
544. 1H-Dibenz[a,kl]anthracene
545. 4H-Dibenz[a,kl]anthracene
546. Dibenz[a,l]aceanthrylene
547. Dibenz[a,n]triphenylene
548. 13H-Dibenz[bc,j]aceanthrylene
549. 13H-Dibenz[bc,l]aceanthrylene
550. Dibenz[de,kl]anthracene
551. Dibenz[e,ghi]indeno[1,2,3,4-pqra]perylene
552. Dibenz[e,j]aceanthrylene
553. Dibenz[e,k]acephenanthrylene
554. Dibenz[e,l]aceanthrylene
555. Dibenz[e,l]acephenanthrylene
556. 1,2:3,4-Dibenzanthracene
557. 3,4,5,6-Dibenzanthracene
558. 2,3:6,7-Dibenzanthracene
559. 1,2,7,8-Dibenzanthracene
560. beta,beta'-Dibenzanthracene
561. 1,2,6,7-Dibenzanthracene
562. 1,2,3,4-Dibenznaphthalene
563. 3.4,11.12-Dibenzobisanthene
564. Dibenzo-1,2,7,8-anthracene
565. Dibenzo-2,3,11,12-fluoranthene
566. 1,2,7,8-Dibenzo-4,5-phenanthrylenemethane
567. Dibenzo[a,c]chrysene
568. 13H-Dibenzo[a,c]fluorene
569. Dibenzo[a,c]naphthacene
570. Dibenzo[a,c]pentacene
571. Dibenzo[a,c]pentaphene
572. Dibenzo[a,c]picene
573. Dibenzo[a,c]tetraphene
574. Dibenzo[a,c]triphenylene
575. Dibenzo[a,cd]naphtho[8,1,2,3-fghi]perylene
576. Dibenzo[a,d]coronene
577. 13H-Dibenzo[a,de]naphth[2,3-h]anthracene
578. 4H-Dibenzo[a,de]naphthacene
579. 4H-Dibenzo[a,de]pentacene
580. Dibenzo[a,e]fluoranthene
581. Dibenzo[a,e]pyrene
582. Dibenzo[a,f]fluoranthene
583. Dibenzo[a,f]perylene
584. Dibenzo[a,f]piceiie
585. Dibenzo[a,f]tetraphene
586. Dibenzo[a,g]coronene
587. 13H-Dibenzo[a,g]fluorene
588. Dibenzo[a,ghi]naphtho[2,1,8-cde]perylene
589. Dibenzo[a,ghi]naphtho[2,1,8-lmn]perylene
590. Dibenzo[a,ghi]naphtho[8,1,2-klm]perylene
591. Dibenzo[a,ghi]perylene
592. 13H-Dibenzo[a,h]fluorene
593. Dibenzo[a,h]pentaphene
594. Dibenzo[a,h]phenanthrene
595. Dibenzo[a,h]pyrene
596. 13H-Dibenzo[a,i]fluorene
597. Dibenzo[a,i]pyrene
598. Dibenzo[a,j]coronene
599. Dibenzo[a,j]difluoreno[2,1,9-cde:2',1',9'-lmn]perylene
600. Dibenzo[a,j]fluoranthene
601. Dibenzo[a,j]naphthacene
602. Dibenzo[a,j]perylene
603. Dibenzo[a,j]plcene
604. Dibenzo[a,j]tetracene
605. Dibenzo[a,jk]fluorine
606. Dibenzo[a,jk]phenanthro[8,9,10,1,2-cdefgh]pyranthrene
607. Dibenzo[a,k]fluoranthene
608. Dibenzo[a,k]tetraphene
609. Dibenzo[a,l]fluoranthene
610. Dibenzo[a,l]naphthacene
611. Dibenzo[a,l]pentacene
612. Dibenzo[a,l]pyrene
613. Dibenzo[a,m]pentaphene
614. Dibenzo[a,m]tetraphene
615. Dibenzo[a,n]pentacene
616. Dibenzo[a,n]perylene
617. Dibenzo[a,n]picene
618. Dibenzo[a,o]pentaphene
619. Dibenzo[a,o]perylene
620. Dibenzo[a,o]picene
621. Dibenzo[a,p]chrysene
622. Dibenzo[a,pqr]picene
623. Dibenzo[a,rst]benzo[5,6]phenanthro[9,10,1-klm]pentaphene
624. Dibenzo[a,rst]naphtho[8,1,2-cde]pentaphene
625. Dibenzo[a,rst]pentaphene
626. Dibenzo[b,def]chrysene
627. Dibenzo[b,e]fluoranthene
628. Dibenzo[b,f]picene
629. 8H-Dibenzo[b,fg]pyrene
630. Dibenzo[b,g]chrysene
631. 7H-Dibenzo[b,g]fluorene
632. Dibenzo[b,g]phenanthrene
633. Dibenzo[b,ghi]fluoranthene
634. Dibenzo[b,ghi]perylene
635. 12H-Dibenzo[b,h]fluorene
636. Dibenzo[b,h]phenanthrene
637. Dibenzo[b,h]pyrene
638. Dibenzo[b,j]fluoranthene
639. Dibenzo[b,j]plcene
640. Dibenzo[b,jk]fluorene
641. Dibenzo[b,k]chrysene
642. Dibenzo[b,k]fluoranthene
643. Dibenzo[b,k]perylene
644. Dibenzo[b,l]chrysene
645. Dibenzo[b,l]fluoranthene
646. Dibenzo[b,m]picene
647. 8H-Dibenzo[b,mn]phenanthrene
648. 13H-Dibenzo[b,mn]phenanthrene
649. Dibenzo[b,mno]fluoranthene
650. Dibenzo[b,n]pentaphene
651. Dibenzo[b,n]perylene
652. Dibenzo[b,n]picene
653. Dibenzo[b,p]chrysene
654. Dibenzo[b,pqr]perylene
655. Dibenzo[b,qr]naphtho[3,2,1,8-defg]chrysene
656. Dibenzo[b,s]picene
657. Dibenzo[b,tuv]naphtho[2,1-m]picene
658. Dibenzo[b,tuv]picene
659. Dibenzo[lm,yz]pyranthrene
660. Dibenzo[bc,ef]coronene
661. Dibenzo[bc,kl]coronene
662. Dibenzo[c,f]tetraphene
663. Dibenzo[c,g]chrysene
664. 7H-Dibenzo[c,g]fluorene
665. Dibenzo[c,g]phenanthrene
666. Dibenzo[c,h]pentaphene
667. Dibenzo[c,hi]naphtho[3,2,1,8-mnop]chrysene
668. Dibenzo[c,i]cyclopenta[a]fluorene
669. Dibenzo[c,k]tetraphene
670. Dibenzo[c,l]chrysene
671. Dibenzo[c,lm]fluorene
672. Dibenzo[c,m]pentaphene
673. Dibenzo[c,m]picene
674. Dibenzo[c,m]tetraphene 675. 5H-Dibenzo[c,mn]phenanthrene
676. Dibenzo[c,mno]chrysene
677. Dibenzo[c,p]chrysene
678. Dibenzo[c,pqr]picene
679. Dibenzo[c,rst]pentaphene
680. Dibenzo[c,s]picene
681. Dibenzo[cd,fg]anthanthrene
682. Dibenzo[cd,hi]anthanthrene
683. Dibenzo[cd,jk]pyrene
684. Dibenzo[cd,k]naphtho[3,2,1,8-pqra]perylene
685. Dibenzo[cd,lm]anthanthrene
686. Dibenzo[cd,lm]perylene
687. Dibenzo[cd,n]naphtho[3,2,1,8-pqra]perylene
688. Dibenzo[de,ij]naphtho[3,2,1,8,7-rstuv]pentaphene
689. Dibenzo[de,ij]naphtho[7,8,1,2,3-pqrst]pentaphene
690. Dibenzo[de,ij]pentaphene
691. Dibenzo[de,ij]phenanthro[2,1,10,9,8,7-pqrstuv]pentaphene
692. Dibenzo[de,kl]pentaphene
693. Dibenzo[de,mn]naphthacene
694. Dibenzo[de,nm]naphtho[2,1,8-qra]naphthacene
695. Dibenzo[de,op]naphthacene
696. Dibenzo[de,qr]naphthacene
697. Dibenzo[de,qr]pentacene
698. Dibenzo[de,qr]tetracene
699. Dibenzo[de,st]pentacene
700. Dibenzo[de,uv]pentacene
701. Dibenzo[de,uv]pentaphene
702. Dibenzo[def,i]naphtho[8,1,2-vwx]pyranthrene
703. Dibenzo[defmno]chrysene
704. Dibenzo[def,mno]cyclopenta[hi]chrysene
705. Dibenzo[def,p]chrysene
706. Dibenzo[e,ghi]perylene
707. Dibenzo[e,l]pyrene
708. Dibenzo[ef,hi]naphtho[8,1,2-abc]coronene
709. Dibenzo[ef,no]naphtho[8,1,2-abc]coronene
710. Dibenzo[fj]naphtho[1,2,3,4-pqr]picene
711. Dibenzo[fj]picene
712. Dibenzo[f,m]tetraphene
713. Dibenzo[ftpqr]picene
714. Dibenzo[fs]picene
715. Dibenzo[fg,ij]benzo[9,10]pyreno[5,4,3,2,1-pqrst]pentaphene
716. Dibenzo[fg,ij]naphtho[2,1,8-uva]pentaphene
717. Dibenzo[fg,ij]naphtho[7,8,1,2,3-pqrst]pentaphene
718. Dibenzo[fg,ij]pentaphene
719. Dibenzo[fg,ij]phenanthro[2,1,10,9,8,7-pqrstuv]pentaphene
720. Dibenzo[fg,ij]phenanthro[9,10,1,2,3-pqrst]pentaphene
721. Dibenzo[fg,ij]triphenyleno[1,2,3,4-rst]pentaphene
722. Dibenzo[fg,op]anthanthrene
723. Dibenzo[fg,op]naphthacene
724. Dibenzo[fg,qr]pentacene
725. Dibenzo[fg,st]hexacene
726. Dibenzo[fgh,pqr]trinaphthylene
727. Dibenzo[g,p]chrysene
728. Dibenzo[ghi,lm]naphtho[1,8-ab]perylene
729. Dibenzo[ghi,mno]fluoranthene
730. Dibenzo[ghi,n]naphtho[8,1,2-bcd]perylene
731. Dibenzo[ghi,pqr]perylene
732. Dibenzo[b,n]perylene
733. Dibenzo[h,rst]pentaphene
734. 12H-Dibenzo[a,fg]naphthacene
735. Dibenzo[hi,kl]naphtho[8,1,2-abc]coronene
736. Dibenzo[hi,op]dinaphtho[8,1,2-cde:2',1',8'-uva]pentacene
737. Dibenzo[hi,qr]anthanthrene
738. Dibenzo[h,s]peropyrene
739. Dibenzo[ij,rst]naphtho[2,1,8,7-defg]pentaphene
740. Dibenzo[ij,rst]phenanthro[9,10,1,2-defg]pentaphene
741. Dibenzo[ijk,tuv]peropyrene
742. Dibenzo[j,l]fluoranthene
743. Dibenzo[j,lm]naphtho[1,8-ab]perylene
744. Dibenzo[j,lm]phenanthro[5,4,3-abcd]perylene
745. Dibenzo[kl,no]naphtho[8,1,2-abc]coronene
746. Dibenzo[kl,rst]naphtho[2,1,8,7-defg]pentaphene
747. Dibenzo[j,lm]naphtho[ab]perylene
748. Dibenzo[mn,qr]fluoreno[2,1,9,8,7-defghi]naphthacene
749. Dibenzo[o,rst]dinaphtho[2,1-a:8',1',2'-cde]pentaphene
750. Dibenzo[pq,uv]pentaphene
751. Dibenzo[q,vwx]hexaphene
752. Dibenzo[rs,vwx]naphtho[2,1,8,7-klmn]hexaphene
753. Dibenzo[uv,albl]benzo[5,6]naphthaceno[2,1,12,11,10,9fghijklm]heptacene
754. 2,3,6,7-Dibenzoanthracene
755. 1,2,5,6-Dibenzoanthracene
756. 2,3,8,9-Dibenzocoronene
757. 2,3,4,5-Dibenzocoronene
758. vic-diperi-Dibenzocoronene
759. anti-diperi-Dibenzocoronene
760. 2,3,5,6-Dibenzofluoranthene
761. 1,2,3,4-Dibenzofluorene
762. 2,3,6,7-Dibenzofluorene
763. 1,2,7,8-Dibenzofluorene
764. 1,2,5,6-Dibenzofluorene
765. 2,3,10,11-Dibenzoperylene
766. 2,3,8,9-Dibenzoperylene
767. 1.12,2.3-Dibenzoperylene
768. 1.12,4.5-Dibenzoperylene
769. 1,2,5,6-Dibenzophenanthrene
770. 2,3:7,8-Dibenzophenanthrene
771. beta,beta'-Dibenzophenanthrene
772. 3,4,5,6-Dibenzophenanthrene
773. gamma,gamma'-Dibenzophenanthrene
774. 2,3,6,7-Dibenzophenanthrene
775. 4,5,9,10-Dibenzopyrene
776. 2,3:4,5-Dibenzopyrene
777. 3,4:8,9-Dibenzopyrene
778. 1,2:4,5-Dibenzopyrene
779. 4,5,6,7-Dibenzopyrene
780. 3,4:9,10-Dibenzopyrene
781. 1,2:9,10-Dibenzopyrene
782. 4,5,8,9-Dibenzopyrene
783. 1.2,9.10-Dibenzotetracene
784. 1.2,7.8-Dibenzotetracene
785. 1.2,5.6-Dibenzotetraphene
786. 1,2:7,8-Dibenzphenanthrene
787. 3,4:8,9-Dibenzpyrene
788. 1,2:3,4-Dibenzpyrene
789. 1,2:7,8-Dibenzpyrene
790. 1,2:6,7-Dibenzpyrene
791. Dicoronylene
792. Dicyclopenta[a,c]naphthacene
793. Dicyclopenta[a,j]coronene
794. Difluorenylene
795. Di-fluorantheno[3.5,4.6],[4'.6',9.11]coronene
796. 1,2-Dihydroacenaphthylene
797. 1,2-Dihydroben[j]aceanthrylene
798. 3,4-Dihydrocyclopenta[cd]pyrene
799. 10,15-Dihydrotribenzo[a,fk]trindene
800. Diindeno[1,2,3-cd:1',2',3'-jk]pyrene
801. Diindeno[1,2,3-de,1',2',3'-kl]anthracene
802. Dinaphth[1,2-a:1',2'-h]anthracene
803. Dinaphth[1,2-a:2',1'-j]anthracene 804. Dinaphth[2,3-a,2',3'-c]anthracene
805. peri-Dinaphthalene
806. lin-Dinaphthanthracene
807. Dinaphtho[1,2-b:2',1'-n]perylene
808. Dinaphtho[1,2,3-cd,1',2',3'-lm]perylene
809. Dinaphtho[1,2,3-cd,3',2',1'-lm]perylene
810. Dinaphtho[1,2,3-fg:1',2',3'-qr]pentacene
811. Dinaphtho[1,2,3-fg:3',2',1'-qr]pentacene
812. Dinaphtho[1,2-b,2',1'-n]perylene
813. Dinaphtho[1,2-b:1',2'-k]chrysene
814. Dinaphtho[1,8-ab:8',1',2',3'-fghi]perylene
815. Dinaphtho[1,8-bc:1',8'-mn]picene
816. Dinaphtho[2,1-a:2',1'-j]perylene
817. Dinaphtho[2,1,8,7-defg:2',1',8',7'-ijkl]pentaphene
818. Dinaphtho[2,1,8,7-defg:2',1',8',7'-opqr]pentacene
819. Dinaphtho[2,1,8,7-defg:2',1',8',7'-qrst]pentacene
820. Dinaphtho[2,1,8-cde,2',1',8'-lmn]perylene
821. Dinaphtho[2,1,8-fgh:3',2',1',8',7'-rstuv]pentaphene
822. Dinaphtho[2,1,8-fgh:7',8',1',2',3'-pqrst]pentaphene
823. Dinaphtho[2,1,8,7-hijk:2',1',8',7'-wxyz]heptacene
824. Dinaphtho[2,1,8-jkl:2',1',8'-uva]pentacene
825. Dinaphtho[2,1-a:1',2'-l]naphthacene
826. Dinaphtho[2,1-a:2',1'-j]naphthacene
827. Dinaphtho[2,1-c 1',2'-g]phenanthrene
828. Dinaphtho[2,3-c:2',3'-m]pentaphene
829. Dinaphtho[3,2,1-fg:1',2',3'-ij]pentaphene
830. Dinaphtho[3,2,1-fg:3',2',1'-qr]pentacene
831. Dinaphtho[2,3-a:2,3-e}pyrene
832. Dinaphtho[8,1,2-abc:2',1',8'-efg]coronene
833. Dinaphtho[8,1,2-abc:2',1',8'-hij]coronene
834. Dinaphtho[8,1,2-abc:2',1',8'-klm]coronene
835. Dinaphtho[8,1,2-abc:2',1',8'-nop]coronene
836. Dinaphtho[8,1,2-abc:8',1',2'-ghi]coronene
837. Dinaphtho[8,1,2-abc:8',1',2'-jkl]coronene
838. Dinaphtho[8,1,2-cde:7',8',1',2',3'-pqrst]pentaphene
839. Dinaphtho[8,1,2-lmn:2',1',8'-qra]naphthacene
840. alpha,alpha'-Dinaphthofluorene
841. 2.3,7.8-Di-(peri-naphthylene)-pyrene
842. Diphenaleno[4,3,2,1,9-hijklm:4',3',2',1',9'-tuvwxa]rubicene
843. Diphenanthro[3,4-c:4',3'-g]phenanthrene
844. Diphenanthro[5,4,3-abcd:5',4',3'-jklm]perylene
845. 2,7-Diphenylbenzo[ghi]fluoranthene
846. 2,9-Diphenylcoronene
847. Diphenylenemethane
848. 9,10-Diphenylenephenanthrene
849. Dipyreno[1'.3',4.6],[10'.2',9.11]coronene
850. 2,3,3',2'-Dipyrenylene
851. 1,8-Ethylenenaphthalene
852. Fluoranthene
853. Fluorantheno[8,9-b]triphenylene
854. 9H-Fluorene
855. Fluorene
856. Fluoreno[2,1-a]fluorene
857. Fluoreno[2,3-a]fluorene
858. Fluoreno[3,2,1,9-defg]chrysene
859. Fluoreno[3,2-b]fluorene
860. Fluoreno[3,4-b]fluorene
861. Fluoreno[4,3,2-de]anthracene
862. Fluoreno[4,3-c]fluorene
863. Fluoreno[9,1-ab]triphenylene
864. [6] Helicene
865. Heptacene
866. Heptaphene
867. Hexabenzobenzene
868. 1.12,2.3,4.5,6.7,8.9,10.11-Hexabenzocoronene
869. Hexacene
870. Hexahelicene
871. Hexaphene
872. Idryl
873. as-Indacene
874. s-Indacene
875. as-Indaceno[2,3-a]phenanthrene
876. 1H-Indene
877. Indene
878. Indeno-2',3'-3,4-pyrene
879. Indeno[1,2,3-cd]fluoranthene
880. Indeno[1,2,3-cd]perylene
881. Indeno[1,2,3-cd]pyrene
882. Indeno[1,2,3-de]naphthacene
883. Indeno[1,2,3-fg]naphthacene
884. Indeno[1,2,3-hi]chrysene
885. 8H-Indeno[1,2-a]anthracene
886. Indeno[1,2-a]phenalene
887. 7H-Indeno[1,2-a]phenanthrene
888. 7H-Indeno[1,2-a]pyrene
889. 11H-Indeno[1,2-a]triphenylene
890. 13H-Indeno[1,2-b]anthracene
891. 12H-Indeno[1,2-b]phenanthrene
892. 13H-Indeno[1,2-c]phenanthrene
893. 9H-Indeno[1,2-e]pyrene
894. 13H-Indeno[1,2-l]phenanthrene
895. Indeno[1,7,6,5-cdef]chrysene
896. Indeno[1,7-ab]chrysene
897. Indeno[1,7-ab]pyrene
898. Indeno[1,7-ab]triphenylene
899. Indeno[1,7a-a]phenanthrene
900. 3H-Indeno[2,1,7-cde]pyrene
901. 11H-Indeno[2,1,7-cde]pyrene
902. 13H-Indeno[2,1,7-qra]naphthacene
903. 13H-Indeno[2,1-a]anthracene
904. 5H-Indeno[2,1-a]chrysene
905. Indeno[2,1-a]phenalene
906. 11H-Indeno[2,1-a]phenanthrene
907. 11H-Indeno[2,1-a]pyrene
908. 8H-Indeno[2,1-b]phenanthrene
909. 9H-Indeno[2,1-c]phenanthrene
910. Indeno[3,2,1,7-defg]chrysene
911. Indeno[4,3,2,1-cdef]chrysene
912. Indeno[5,6,7,1-defg]chrysene
913. Indeno[5,6,7,1-pqra]perylene
914. Indeno[6,7,1,2-defg]naphthacene
915. 1H-Indeno[6,7,1-mna]anthracene
916. Indeno[7,1,2,3-cdef]chrysene
917. 4H-Indeno[7,1,2-ghi]chrysene
918. Indeno[7,1-ab]naphthacene
919. Indeno[7,1-ab]triphenylene
920. Indeno[7,1-bc]chrysene
921. Isochrysene
922. Isochrysofluorene
923. Isonaphthofluorene
924. Isorubicene
925. Isotruxene
926. Isoviolanthrene
927. 1',9-Methylene-1,2,5,6-dibenzanthracene
928. 1',9-Methylene-1,2-benzanthracene
929. 2,2'-Methylenebiphenyl
930. 4,5-Methylenephenanthrene
931. 1,9,8-(diperi)-Naphth-2,9-dihydroanthracene
932. Naphth[1',2':5,6]indeno[1,2,3-cd]pyrene
933. Naphth[1,2-a]aceanthrylene
934. Naphth[1,2-a]acephenanthrylene
935. Naphth[1,2-a]anthracene
936. Naphth[1,2-d]acenaphthylene 937. Naphth[1,2-e]acephenanthrylene
938. Naphth[1,2-j]aceanthrylene
939. Naphth[1,2-k]acephenanthrylene
940. Naphth[2',1':4,5]indeno[1,2,3-cd]pyrene
941. Naphth[2,1-a]aceanthrylene
942. Naphth[2,1-a]anthracene
943. Naphth[2,1-d]acenaphthylene
944. Naphth[2,1-e]aceanthrylene
945. Naphth[2,1-e]acephenanthrylene
946. Naphth[2,1-k]acephenanthrylene
947. Naphth[2,1-l]aceanthrylene
948. Naphth[2,1-l]acephenanthrylene
949. Naphth[2,1,8-uva]ovalene
950. Naphth[2,3-a]aceanthrylene
951. Naphth[2,3-e]acenaphylene
952. Naphth[2,3-e]acephenanthrylene
953. Naphth[2,3-l]acephenanthrylene
954. Naphth[2',1',8',7':4,10,5]anthra[1,9,8-abcd]coronene (Circobiphenyl)
955. 5H-Naphth[3,2,1-de]anthrene
956. 2',1'-Naphtha-1,2-fluorene
957. 1',2'-Naphtha-2,3-fluorene
958. 1',3'-Naphtha-3,4-pyrene
959. Naphthacene
960. Naphthaceno[2,1,12,11-opqra]naphthacene
961. Naphthaceno[4,5,6,7,8-defghij]naphthacene
962. peri-Naphthacenonaphthacene
963. Naphthalene
964. 1,2-(1,8-Naphthalenediyl)benzene
965. Naphthanthracene
966. Naphthanthracene
967. 8H-meso-alpha-Naphthanthrene
968. 1,8,9-Naphthanthrene
969. Naphthanthrene
970. lin-Naphthanthrene
971. 13H-meso-alpha-Naphthanthrene
972. 1H-alpha-Naphthindene
973. 1H-beta-Naphthindene
974. 3H-alpha-Naphthindene
975. Naphtho(2',3':7,8)fluoranthene
976. Naphtho(2',3':8,9)fluoranthene
977. Naphtho-(2'3':4,5)pyrene
978. 1',2'-Naphtho-1,2-fluoranthene
979. Naphtho[1'.2',1.2]anthracene
980. Naphtho-2',3',1,2-anthracene
981. Naphtho-2',3',1,2-phenanthrene
982. Naphtho-2',3',2,3-phenanthrene
983. Naphtho-2',3',3,4-phenanthrene
984. Naphtho [1,2,3,4-def]chrysene
985. Naphtho[1,2,3,4-ghi]fluoranthene
986. Naphtho[1,2,3,4-ghi]perylene
987. Naphtho[1,2,3,4-rst]pentaphene
988. 9H-Naphtho[1,2,3-cd]perylene
989. 6H-Naphtho[1,2,3-cd]pyrene
990. Naphtho[1,2-a]coronene
991. Naphtho[1,2-a]fluoranthene
992. Naphtho[1,2-a]naphthacene
993. Naphtho[1,2-a]pentacene
994. Naphtho[1,2-a]pentaphene
995. Naphtho[1,2-a]pyrene
996. Naphtho[1,2-a]tetracene
997. Naphtho[1,2-a]tetraphene
998. Naphtho[1,2-b]chrysene
999. Naphtho[1,2-b]fluoranthene
1000. 12H-Naphtho[1,2-b]fluorene
1001. Naphtho[1,2-b]perylene
1002. Naphtho[1,2-b]picene
1003. Naphtho[1,2-b]triphenylene
1004. Naphtho[1,2-c]chrysene
1005. Naphtho[1,2-c]pentaphene
1006. Naphtho[1,2-e]pyrene
1007. Naphtho[1,2-f]picene
1008. Naphtho[1,2-g]chrysene
1009. Naphtho[1,2-h]pentaphene
1010. Naphtho[1,2-j]fluoranthene
1011. Naphtho[1,2-k]fluoranthene
1012. Naphtho[1,8,7,6-cdef]fluorene
1013. Naphtho[2',3':2,3]fluoranthene
1014. Naphtho[2'.1',1.2]tetracene
1015. Naphtho[2'.3',1.2]pyrene
1016. Naphtho[2,1,8-def]picene
1017. Naphtho[2,1,8-fgh]pentaphene
1018. Naphtho[2,1,8-hij]anthanthrene
1019. Naphtho[2,1,8-qra]naphthacene
1020. Naphtho[2,1,8-uva]pentacene
1021. Naphtho[2,1,8-uva]pentaphene
1022. Naphtho[2,1,8-yza]hexacene
1023. Naphtho[2,1-a]fluoranthene
1024. 11H-Naphtho[2,1-a]fluorene
1025. Naphtho[2,1-a]naphthacene
1026. Naphtho[2,1-a]pentaphene
1027. Naphtho[2,1-a]perylene
1028. Naphtho[2,1-a]picene
1029. Naphtho[2,1-a]pyrene
1030. Naphtho[2,1-a]tetraphene
1031. Naphtho[2,1-b]chrysene
1032. Naphtho[2,1-b]fluoranthene
1033. Naphtho[2,1-b]perylene
1034. Naphtho[2,1-b]picene
1035. Naphtho[2,1-c:7,8-c']diphenanthrene
1036. Naphtho[2,1-c]chrysene
1037. Naphtho[2,1-c]pentaphene
1038. Naphtho[2,1-c]picene
1039. Naphtho[2,1-c]tetraphene
1040. Naphtho[2,1-j]fluoranthene
1041. Naphtho[2,3-a]coronene
1042. Naphtho[2,3-a]fluoranthene
1043. 13H-Naphtho[2,3-a]fluorene
1044. Naphtho[2,3-a]pentaphene
1045. Naphtho[2,3-a]picene
1046. Naphtho[2,3-a]pyrene
1047. Naphtho[2,3-a]tetraphene
1048. Naphtho[2,3-b]fluoranthene
1049. Naphtho[2,3-b]picene
1050. Naphtho[2,3-b]pyrene
1051. Naphtho[2,3-c]chrysene
1052. 8H-Naphtho[2,3-c]fluorene
1053. Naphtho[2,3-c]pentaphene
1054. Naphtho[2,3-e]pyrene
1055. Naphtho[2,3-g]chrysene
1056. Naphtho[2,3-h]pentaphene
1057. Naphtho[2,3-j]fluoranthene
1058. Naphtho[2,3-k]fluoranthene
1059. Naphtho[2,3-s]picene
1060. Naphtho[2'.8',2.4]coronene
1061. Naphtho[3',4':3,4]pyrene
1062. Naphtho[3,2,1,8,7-defgh]pyranthrene
1063. Naphtho[3,2,1,8,7-vwxyz]hexaphene
1064. Naphtho[3,2,1-jk]fluorene
1065. Naphtho[4,5,6-abc]aceanthrylene
1066. Naphtho[5,4,3-abc]coronene
1067. Naphtho[7,8,1,2,3-pqrst]pentaphene
1068. Naphtho[7,8,1,2,3-tuvwx]hexaphene
1069. Naphtho[8,1,2-abc]coronene 1070. Naphtho[8,1,2-cde]naphthacene
1071. Naphtho[8,1,2-cde]pentaphene
1072. Naphtho[8,1,2-efg]anthanthrene
1073. Naphtho[8,1,2-ghi]chrysene
1074. Naphtho[b',b]chrysene
1075. Naphtho[d]coronene
1076. Naphthobenzanthrene
1077. lin-Naphthofluorene
1078. 2,3-beta-Naphthofluorene
1079. Nonacene
1080. Octacene
1081. Ovalene
1082. Paranaphthalene
1083. Pentacene
1084. peri-Pentacenopentacene
1085. Pentalene
1086. Pentaleno[1,2-b:4,5-b']dinaphthalene
1087. Pentanthrene
1088. Pentanthrene
1089. Pentaphene
1090. Periflanthene
1091. Perinaphthene
1092. 2,3-Peri-naphthylene-pyrene
1093. Peropyrene
1094. Perylene
1095. Perylo[3,2,1,12-pqrab]perylene
1096. 1H-Phenalene
1097. Phenalene
1098. Phenaleno[12,3,4-ghij]perylene
1099. 2',3'-Phenanthra-1,2-anthracene
1100. 2',3'-Phenanthra-2,3-phenanthrene
1101. Phenanthrene
1102. [Phenanthreno-9',10':9,10]phenanthrene-1,1'methylene
1103. Phenanthrin
1104. Phenanthrindene
1105. Phenanthro[1,10,9-abc]coronene
1106. Phenanthro[1,10,9,8-opqra]perylene
1107. Phenanthro[1,2,3,4-def]chrysene
1108. Phenanthro[1,2,3,4-ghi]perylene
1109. Phenanthro[1,2-a]naphthacene
1110. Phenanthro[1,2-b]chrysene
1111. Phenanthro[1,2-b]triphenylene
1112. Phenanthro[10,1,2,3-cdef]fluorene
1113. Phenanthro[10,1,2-abc]coronene
1114. Phenanthro[2,1,10,9,8,7-pqrstuv]pentaphene
1115. Phenanthro[2,1,10,9,8,7-tuvwxyz]hexaphene
1116. Phenanthro[2,1-b]chrysene
1117. Phenanthro[2,1-f]picene
1118. Phenanthro[2,3,4,5-tuvab]picene
1119. Phenanthro[2,3-c]chrysene
1120. Phenanthro[2,3-g]chrysene
1121. Phenanthro[3,2-b]chrysene
1122. Phenanthro[3,2-g]chrysene
1123. Phenanthro[3,4-a]anthracene
1124. Phenanthro[3,4-a]naphthacene
1125. Phenanthro[3,4-b]chrysene
1126. Phenanthro[3,4-b]triphenylene
1127. Phenanthro[3,4-c]chrysene
1128. Phenanthro[3,4-c]phenanthrene
1129. Phenanthro[3,4,5,6-bcdef]ovalene
1130. Phenanthro[4,3,2,1-def]chrysene
1131. Phenanthro[4,3-a]anthracene
1132. Phenanthro[4,3-b]chrysene
1133. Phenanthro[5,4,3,2-abcde]perylene
1134. Phenanthro[9,10,1,2,3-pqrst]pentaphene
1135. Phenanthro[9,10,1-qra]naphthacene
1136. Phenanthro[9,10-a]naphthacene
1137. Phenanthro[9,10-b]chrysene
1138. Phenanthro[9,10-b]triphenylene
1139. 4,5-Phenanthrylenemethane
1140. 7-Phenylbenzo[a]coronene
1141. 2-Phenylbenzo[b]fluoranthene
1142. 2-Phenylbenzo[j]fluoranthene
1143. 5-Phenylbenzo[j]fluoranthene
1144. 5,6-(1,2-Phenylene)naphthacene
1145. 1,10-(1,2-Phenylene)pyrene
1146. 1,10-(o-Phenylene)pyrene
1147. 2,3-(o-Phenylene)pyrene
1148. 1,9-Phenyleneanthracene
1149. 5,6-o-Phenylenenaphthacene
1150. 10,11-Phenylenenaphthacene
1151. 2,3-Phenylenepyrene
1152. o-Phenylenepyrene
1153. Picene
1154. Pyranthrene
1155. Pyrene
1156. peri-Pyrene-1,10(CH2)-indene
1157. Pyrenindene
1158. Pyreno[1,10,9-abc]coronene
1159. Pyreno[10,1,2-abc]coronene
1160. Pyreno[2,1-b]picene
1161. Pyreno[5,4,3,2,1-pqrst]pentaphene
1162. Rubicene
1163. Rubrene
1164. Quaterrylene
1165. Terrylene
1166. 1.2,3.4,5.6,10.11-Tetrabenzanthanthrene
1167. Tetrabenz[a,c,h,j]anthracene
1168. Tetrabenzo[a,c,hi,mn]naphthacene
1169. Tetrabenzo[a,c,hi,qr]pentacene
1170. Tetrabenzo[a,c,j,l]naphthacene
1171. Tetrabenzo[a,c,l,n]pentacene
1172. Tetrabenzo[a,cd,f,lm]perylene
1173. Tetrabenzo[a,cd,j,lm]perylene
1174. Tetrabenzo[a,e,j,o]perylene
1175. Tetrabenzo[a,fj,o]perylene .1176. Tetrabenzo[a,fk,n]perylene
1177. Tetrabenzo[bc,efhi,kl]coronene
1178. Tetrabenzo[bc,ef,kl,no]coronene
1179. Tetrabenzo[de,h,kl,rst]pentaphene
1180. Tetrabenzo[de,hi,rn,qr]naphthacene
1181. Tetrabenzo[de,hi,op,st]pentacene
1182. Tetrabenzo[de,jk,op,uv]pentacene
1183. Tetrabenzo[de,lm,uv,albl ]heptacene
1184. tetrabenzo[de,lm,st,cldl ]heptacene
1185. Tetrabenzo[fg,ij,pq,uv]pentaphene
1186. Tetrabenzo[a,c,hi,qr]pentacene
1187. Tetrabenzo[gh,jk,tu,wx]pyranthrene
1188. 1,2:3,4:5,6:7,8-Tetrabenzonaphthalene
1189. Tetracene
1190. Tetrahelicene
1191. 1.2,3.4,5.6,7.8-Tetra(peri-naphthylene)anthracene
1192. Tetraphene
1193. N,N,N',N'-Tetraphenyl-tetrabenzo[a,cd,j,lm]perylene-1,10-diamine
1194. Tribenz[a,c,h]anthracene
1195. 1,2,3,4,5,6-Tribenzanthracene
1196. Tribenzo[a,c,j]naphthacene
1197. 8H-Tribenzo[a,cd,l]pyrene
1198. Tribenzo[a,cd,lm]perylene
1199. Tribenzo[a,e,ghi]perylene
1200. Tribenzo[a,efhi]coronene
1201. Tribenzo[a,efno]coronene 1202. Tribenzo[a,fj]perylene
1203. Tribenzo[a,ghi,k]perylene
1204. Tribenzo[a,hi,kl]coronene
1205. Tribenzo[a,hi,mn]naphthacene
1206. Tribenzo[a,i,l]pyrene
1207. Tribenzo[anjk,v]phenanthro[8,9,10,1,2-cdefgh]pyranthrene
1208. Tribenzo[1,2:4,5:8,9]pyrene
1209. Tribenzo[b,defp]chrysene
1210. Tribenzo[b,e,ghi]perylene
1211. Tribenzo[b,g,k]chrysene
1212. Tribenzo[b,g,l]chrysene
1213. Tribenzo[b,g,p]chrysene
1214. Tribenzo[b,n,pqr]perylene
1215. Tribenzo[c,g,mno]chrysene
1216. Tribenzo[de,ij,rst]pentaphene
1217. Tribenzo[de,kl,rst]pentaphene
1218. Tribenzo[fgh,pqr,zalbl]trinaphthylene
1219. Tribenzo[fg,ij,o]benzo[5,6]naphthaceno[10,11,12,1,2,3-qrstuvwx]hexaphene
1220. 1H-Tribenzo[fg,jk,uv]hexacene
1221. Tribenzo[fg,q,vwx]benzo[5,6]naphthaceno[2,1,12,11,10-ijklmno]hexaphene
1222. Tribenzo[jk,qr,uv]naphtho[2,1,8,7-defg]pentacene
1223. Tribenzobicyclo[2.2.2]octatriene
1224. Triindeno[2,3:2',3':2',3']benzene
1225. Trinaphthylene
1226. Trinaphthylenebenzene
1227. Triphenylene
1228. Triptycene
1229. Truxene
1230. Zethrene The list of preferred heterocyclic compounds or alkyl, alkenyl, alkynyl, aryl, substituted aryl, silyl, ace, indeno, 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, fluoro, cyano, alkoxy, aryloxy, amino, aza, oxo, thia, heterocyclic, keto, and dicyanomethyl derivatives thereof as materials for the first host component of the luminescent layer of this invention includes:

1231. Benz[a]acridine
1232. Benz[b]acridine
1233. Benz[c]acridine
1234. Dibenz[a,c]acridine
1235. Dibenz[a,i]acridine
1236. Dibenz[c,h]acridine
1237. Dibenz[a,h]acridine
1238. Dibenz[a,j]acridine
1239. 7H-Benzo[c]carbazole
1240. 1 1H-Benzo[a]carbazole
1241. Dibenzo[a,i]carbazole
1242. 7H-Dibenzo[c,g]carbazole
1243. Benzo[b]naphtho[2,3-d]furan
1244. Benzo[b]naphtho[2,1-d]furan
1245. Dinaphtho[2,1-b:1',2'-d]furan
1246. Dinaphtho[1,2-b:2',1'-d]furan
1247. Dinaphtho[1,2-b:2',3'-d]furan
1248. Dinaphtho[2,1-b:2',3'-d]furan
1249. Dinaphhto[2,3-b:2',3'-d]furan
1250. Benzo[1,2-b:3,4-b']bisbenzofuran
1251. Benzo[1,2-b:3,4-b']bisbenzofuran
1252. Benzo[1,2-b:4,5-b']bisbenzofuran
1253. Benzo[g]quinoline
1254. Naphtho[2,3-g]quinoline
1255. Naphtho[1,2-g]quinoline
1256. Phenazine
1257. Benzo[b]phenazine
1258. Dibenzo[b,g][1,5]naphthyridine
1259. Dibenzo[b,g][1,8]naphthyridine
1260. Dibenzo[a,i]phenazine
1261. Dibenzo[a,h]phenazine
1262. Dibenzo[a,j]phenazine
1263. Phenanthrazine
1264. Benz[g]isoquinoline
1265. Benz[h]isoquinoline
1266. Benz[f]isoquinoline
1267. 1,10-Phenanthroline
1268. 1,7-Phenanthroline
1269. 4,7-Phenanthroline
1270. Benzo[b][1,10]phenanthroline
1271. Dibenzo[b,j][1,10]phenanthroline
1272. Naphtho[2,3-f][1,10]phenanthroline
1273. Benzo[f][1,10]phenanthroline
1274. 1,9-Phenanthroline
1275. Benzo[h]-1,6-naphthyridine
1276. Phenaleno[1,2,3-de]quinoline (3-Azaperylene)
1277. Benzo[1,2,3-de:4,5,6-d'e']diquinoline (3,9-Diazaperylene)
1278. Dibenzo[de,gh][1,10]phenanthroline
1279. Benz[de]isoquino[1,8-gh]quinoline
1280. Dibenzo[f,h]quinoline (1-Azatriphenylene)
1281. Dibenzo[f,h]quinoxaline (1,4-Diazatriphenylene)
1282. Pyrido[2,3-f][1,7]phenanthroline
1283. Dibenz[a,c]acridine (1,2:3,4-Dibenzacridine)
1284. Tetrabenz[a,c,h,j]acridine
1285. 8,8'-Biquinoline
1286. 8,8'-Biquinoline
1287. 2,4'-Biquinoline
1288. 2,2'-Biquinoline
1289. 3,3'-Biisoquinoline
1290. Phenanthridine
1291. Benzo[i]phenanthridine
1292. Benzo[b]phenanthridine
1293. Benzo[c]phenanthridine (5-Azachrysene)
1294. Thebenidine (4-Azapyrene)
1295. Naphth[2,1,8-def]isoquinoline (2-Azapyrene)
1296. Naphtho[2,1,8-def]quinoline (1-Azapyrene)
1297. Benzo[lmn][3,8]phenanthroline (2,7-Diazapyrene)
1298. Naphth[2,1,8-mna]acridine
1299. Benzo[g]quinazoline
1300. Dibenzo[f,h]quinazoline
1301. 2,2'-Biquinazoline
1302. 3,3'-Bicinnoline
1303. Benzo[c]cinnoline
1304. Dibenzo[c,g]cinnoline (Naphtho[2,3-c]cinnoline)
1305. Benzo[h]naphtho[1,2-c]cinnoline
1306. 3-Phenyl-3H-naphth[1,2-d]imidazole
1307. Phenanthro[9,10-d]oxazole
1308. Anthra[2,3-d]oxazole
1309. 3-Phenyldibenzofuran
1310. Benzo(1,2-b:4,5-b')bisbenzofuran
1311. 1,4-Diazatriphenylene
1312. 5,12-Diazatriphenylene
1313. 2,12-Dioxadibenzo[jk,uv]biscyclopenta[3,4]naphtho[2,1,8,7-defg:2',1',8',7'-opqr]pentacene
1314. Dinaphtho[1',2':2,3;2",1":10,11]perylo[1,12]furan
1315. Diphenaleno[9',1',2':3,4,5:9",1",2":9,10,11]coroneno[1,2-c:7,8-c']difuran Any of the above listed PAH, and any benzenoid compounds formed by the combination of one or more of the above listed PAH which may or may not be chemically linked, are useful as the first host component, and importantly, the compounds do not have to be film forming materials at room temperature. The mixture of the second host component and the first host component must be capable of forming continuous amorphous films.

In benzenoid and heterocyclic compounds formed by combination of two or more PAH, two or more heterocyclic compounds, or at least one PAH and at least one heterocycle, the constituent PAH's and heterocycles may or may not be not chemically connected together via a single chemical bond or linked via a saturated or unsaturated hydrocarbon group or by a heteroatom N, O, or S. Examples of useful compounds formed by chemically connected combination of two or more the same or different PAH (aforementioned PAH's 1 through 39), two or more the same or different heterocyclic compounds (aforementioned heterocycles 40 through 102), or at least one PAH 1 through 39 and at least one heterocycle 40 through 102 include:

1316. Pyrene-pyrene
1317. Pyrene-benzene-pyrene
1318. Perylene-benzene-perylene
1319. Perylene-perylene
1320. Pyrene-perylene
1321. Benzopyrene-benzopyrene
1322. Coronene-perylene
1323. Benzo[ghi]perylene-pyrene
1324. Naphthopyrene-pyrene
1325. Perylene-naphthacene
1326. Naphthacene-pyrene
1327. Naphthacene-perylene
1328. Fluoranthene-benzopyrene
1329. Fluoranthene-perylene
1330. Anthanthrene-anthracene
1331. Anthracene-perylene
1332. Coronene-anthracene
1333. Triphenylene-anthracene
1334. Triphenylene-perylene
1335. Perylene-acridine
1336. Pyrene-carbazole
1337. Anthracene-oxadiazole
1338. Perylene-imidazole
1339. Triphenylene-pyridine
1340. Pyridine-perylene
1341. Coronene-naphthyridine
1342. Quinoline-perylene
1343. Quinoline-anthracene
1344. Furan-binaphthyl
1345. Isoquinoline-anthanthrene In the above examples 1316 through 1345, a hyphen represents a single chemical bond or a linkage via a saturated or unsaturated hydrocarbon group including alkenyl, alkynyl, PAH, and heterocycle or by a heteroatom N, O, or S between PAH moieties, heterocyclic moieties, or PAH and heterocyclic moieties. Useful benzenoid compounds include compounds such as PAH and/or heterocyclic groups linked by one or more linkage groups. Any of the above listed benzenoid compounds 1 through 1315 substituted with one or more fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl, alkenyl, alkynyl, aryl, substituted aryl, heterocycle containing at least one nitrogen atom, or at least one oxygen atom, or at least one sulfur atom, or at least one boron atom, or at least one phosphorus atom, or at least one silicon atom, or any combination thereof, benzo-, naphtho-, anthra-, phenanthro-, fluorantheno-, pyreno-, triphenyleno-, or peryleno-, 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent are useful.

Particularly preferred materials for the first host component of the luminescent layer of this invention include benzenoid compounds of the following structures:

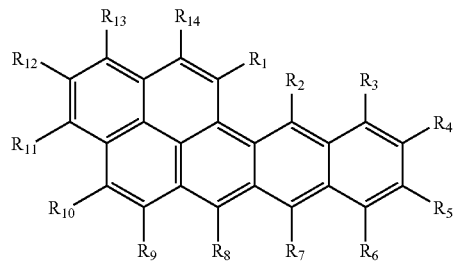

(a)

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

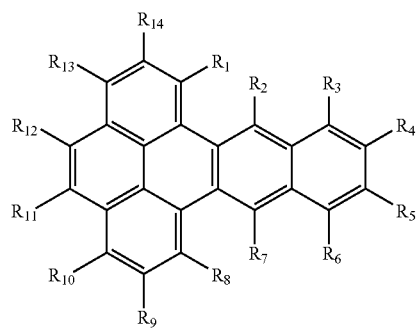

(b)

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

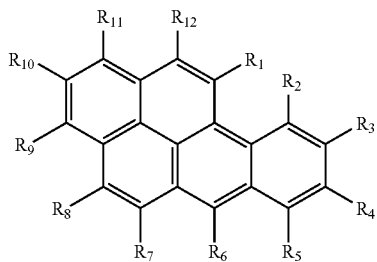

(c)

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

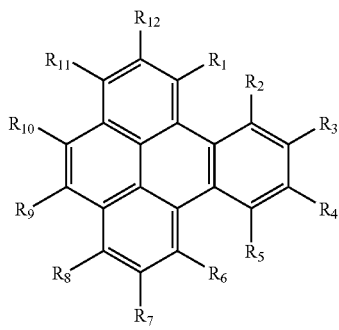

(d)

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

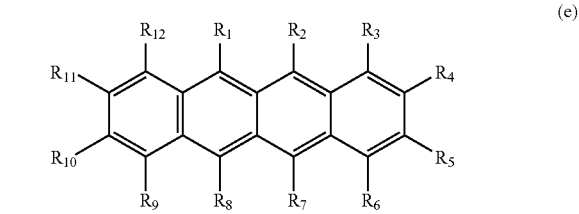

(e)

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

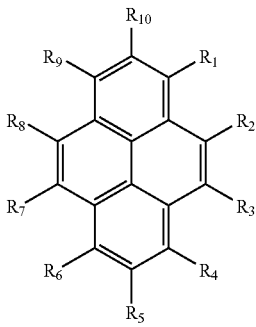

(f)

wherein:

substituents $R_1$ through $R_{10}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through R10 substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{10}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

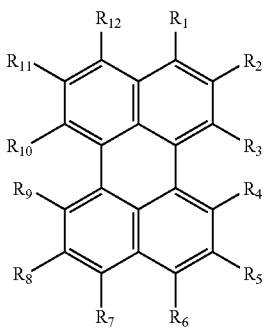

(g)

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

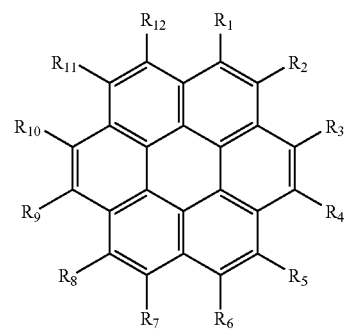

(h)

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-,anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

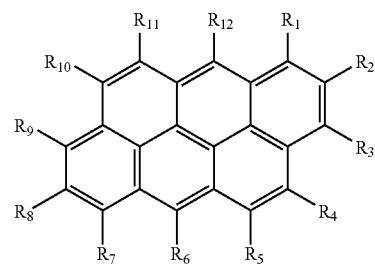

(i)

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof, or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

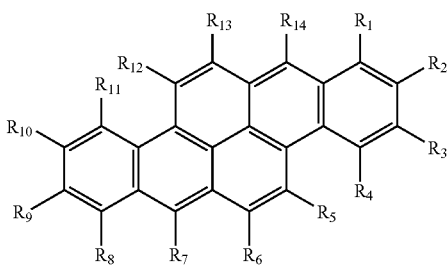

(j)

wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof, or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

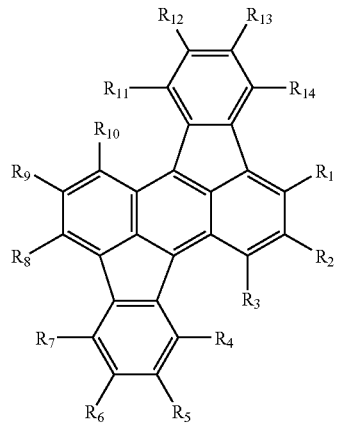

(k)

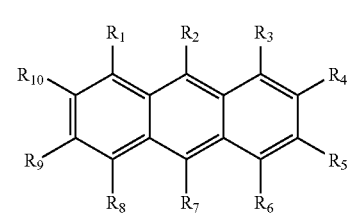

(l)

wherein:

substituents $R_1$ through $R_{10}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{10}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{10}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

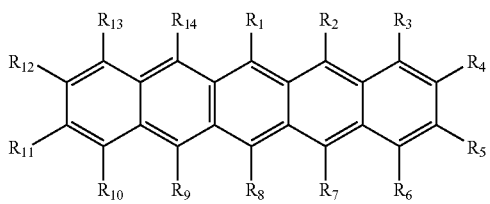

(m)

wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

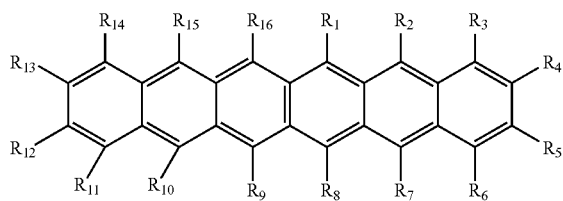

(n)

wherein:

substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

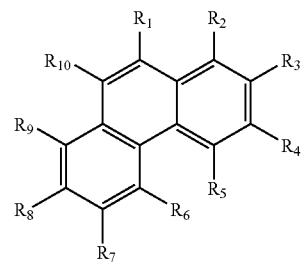

(o)

wherein:

substituents $R_1$ through $R_{10}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{10}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{10}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

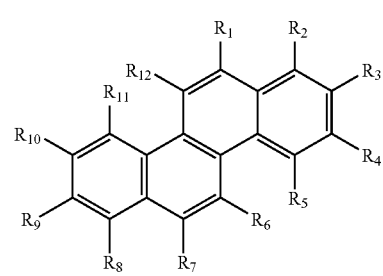

(p)

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

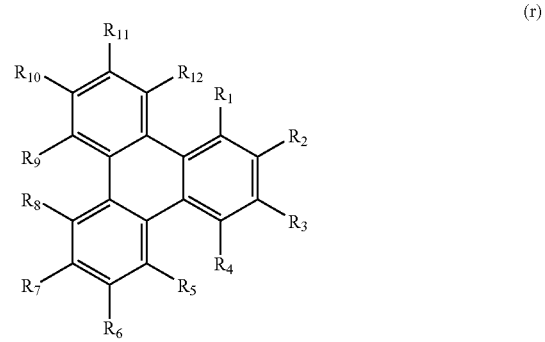

(r)

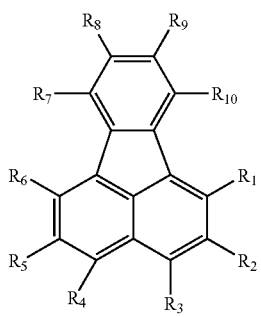

(q)

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

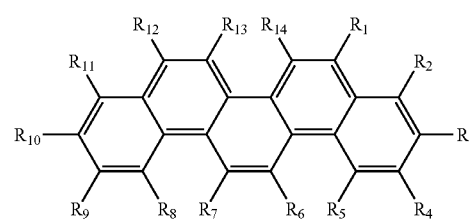

(s)

wherein:

substituents $R_1$ through $R_{10}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{10}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{10}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2- benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

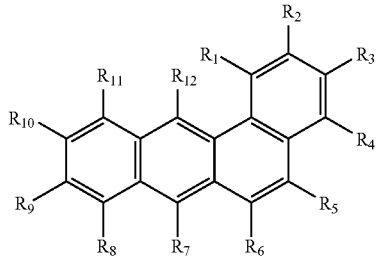

(t)

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

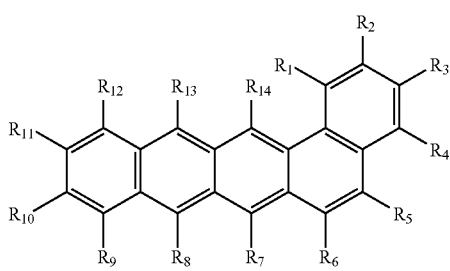

(u)

wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

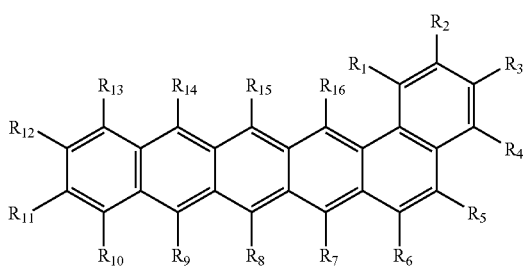

(v)

wherein:

substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

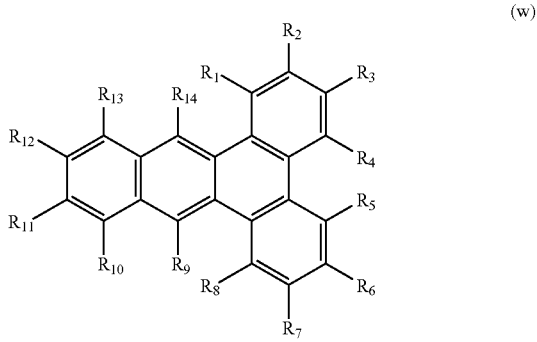

(w)

wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

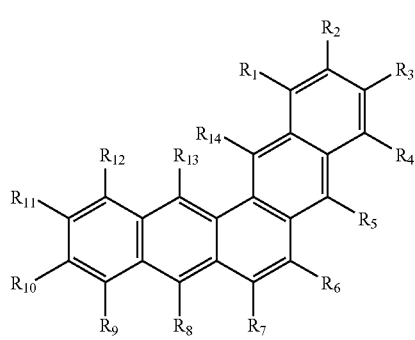

(x)

wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

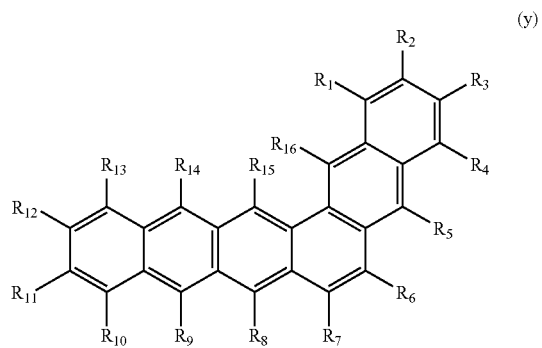

(y)

wherein:

substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or

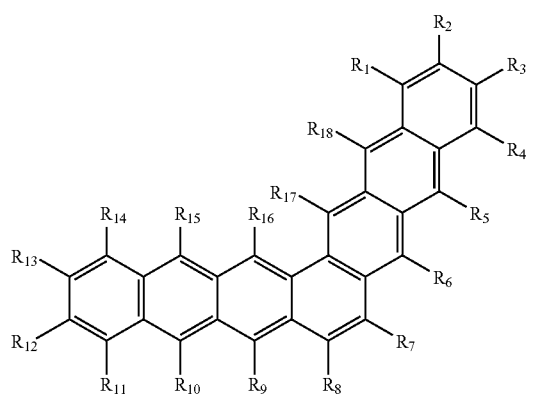

(z)

wherein:

substituents $R_1$ through $R_{18}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{18}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{18}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or (aa)

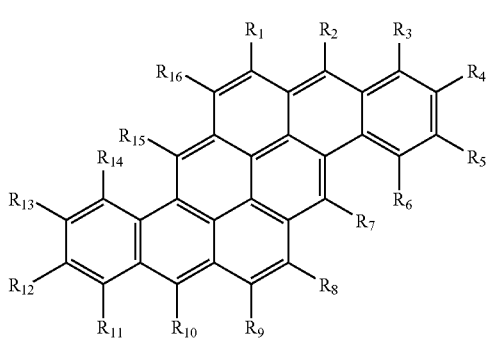

wherein:

substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or (ab)

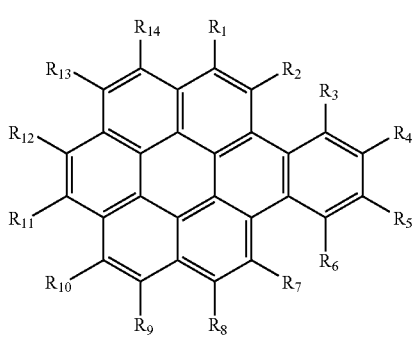

wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or (ac) PAH compounds that can be drawn using only fully aromatic benzene rings so as to form graphite-like segments in the following fashion:

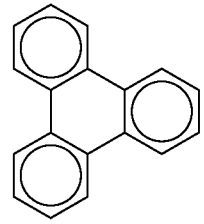

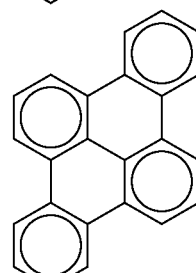

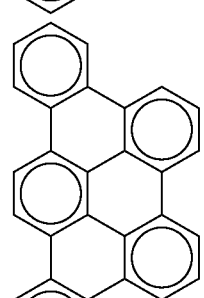

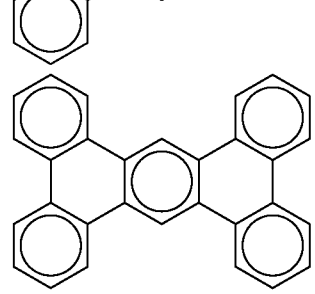

-continued
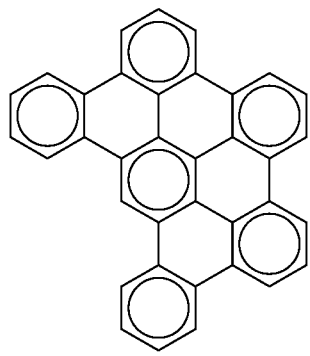
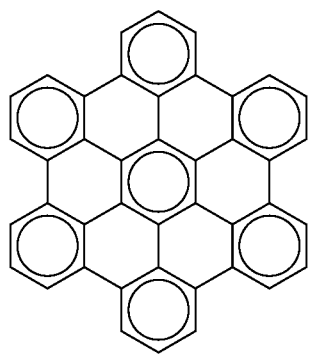
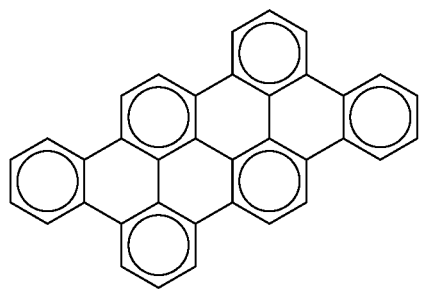
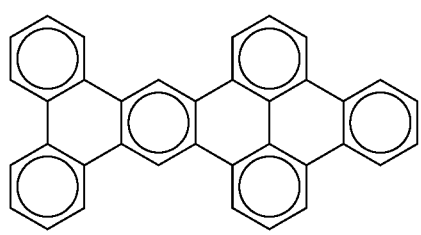
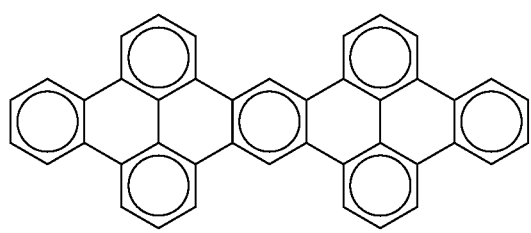
-continued
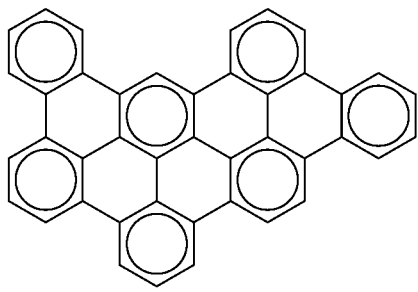
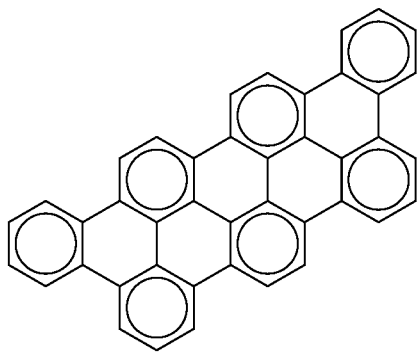
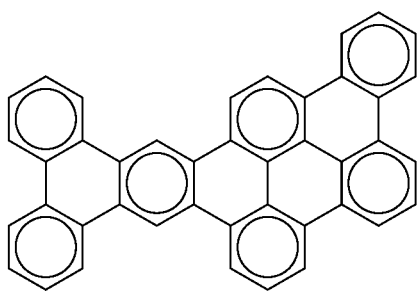
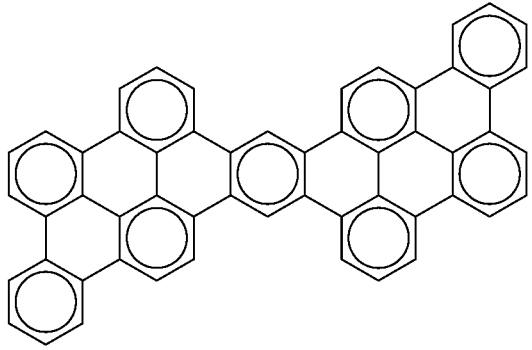
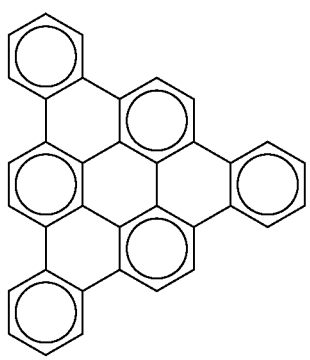

-continued
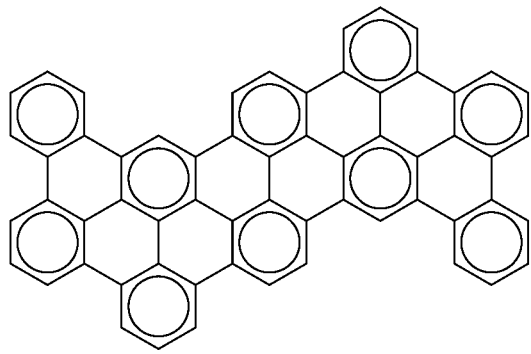
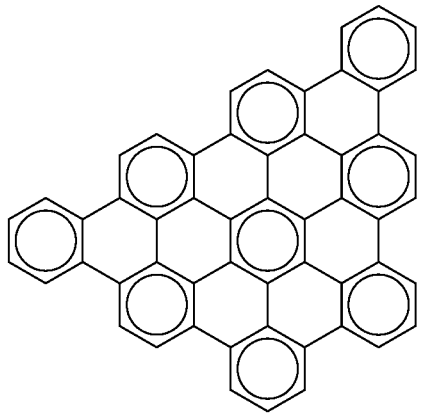
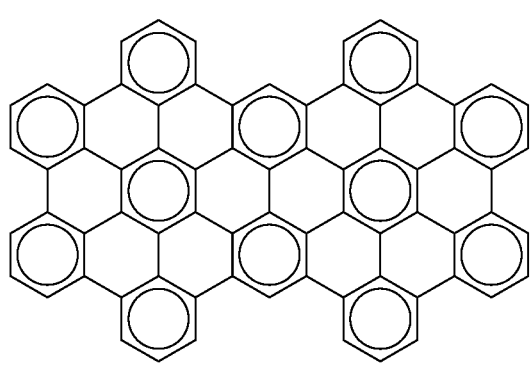
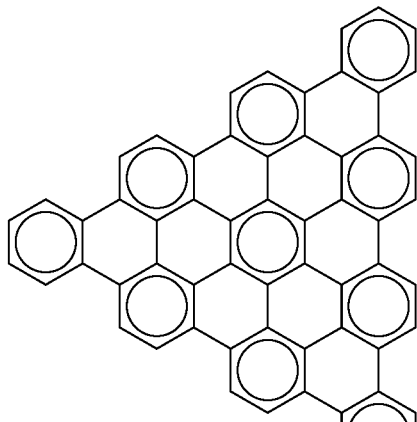
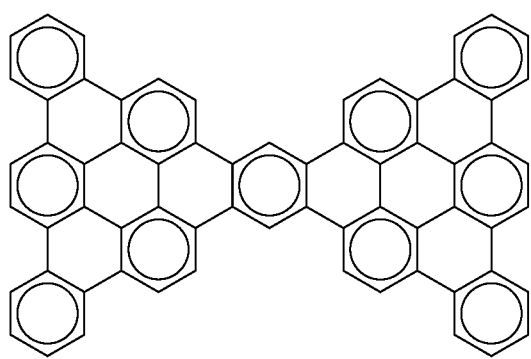
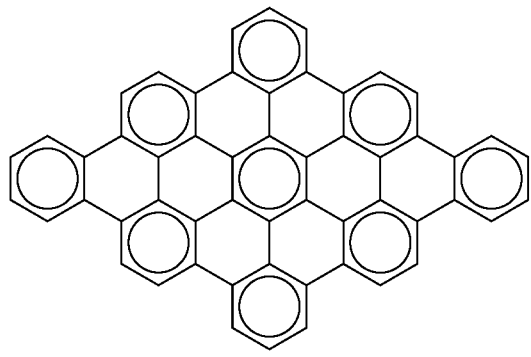
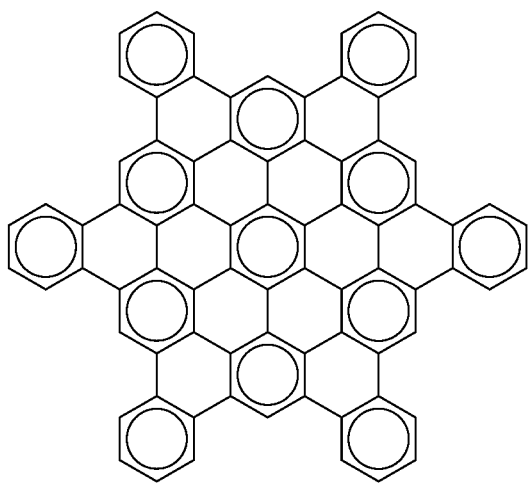

-continued

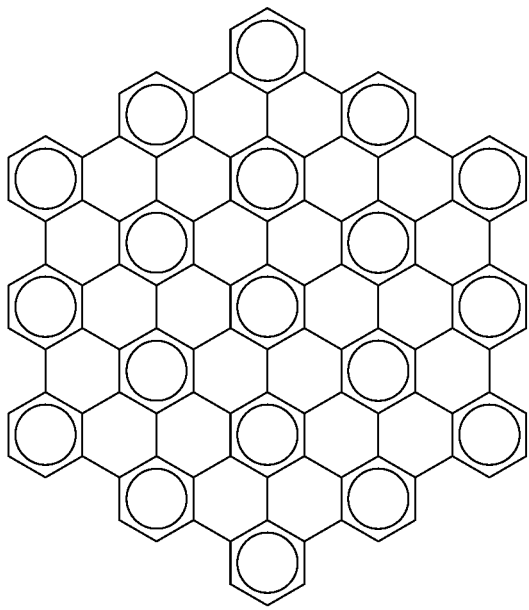

wherein:

substituents in each position for each compound and analogous compounds of the homological series are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent substituents form an annelated benzo-, naphtho-, anthra-, phenanthro-, fluorantheno-, pyreno-, triphenyleno-, or peryleno-substituent or its alkyl or aryl substituted derivative; or any two substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative; or (ad) any of the compounds 2 through 1315.

One particular selection criterion for the first host component is that the organic compound should have a molecular structure that enables it to form both monomer state and aggregate state. The aggregate state can be formed by at least two molecules of the same compound, such as the first host component, or by at least two molecules of two different compounds, such as the first and second host components or first component and the luminescent dopant. All these aggregate states are useful in the present invention. However, the following discussion will be focused on the first case. The monomer state is defined as a state where molecules of the first host component do not interact with each other in either ground or excited electronic state and thus behave as single molecules in a solid solution of the second component. Thus, in particular their absorption and emission processes involve just one molecule. The absence of the interaction can evolve e.g. due to the intrinsic lack of forces that enable the interaction, distances between the molecules being too large, improper geometry, steric hindrance, and other reasons. The aggregate state is defined as a state formed by an interaction, for example such as commonly known in the art van der Waals forces or by commonly known in the art charge-transfer interactions, of at least two molecules. It has physical and chemical properties different from those of the monomer state. In particular, two or more molecules can participate in cooperative absorption or emission or both, that is absorption or emission or both can only be understood as arising from molecular complexes or molecular aggregates. When two or more molecules act cooperatively to absorb a photon, it is said that the absorption aggregate exists in the ground electronic state. When two or more molecules act cooperatively to emit a photon, it is said that the exciplex, or a molecular complex or molecular aggregate, exists in the excited electronic state. The absorption aggregate need not form an exciplex upon excitation and the exciplex need not emit to produce a ground state aggregate. Thus, the aggregate state can exist in either ground electronic state or excited electronic state or both. An aggregate state can be only weakly associated in the ground electronic state (the energy of van der Waals interactions ~1–3 kcal/mol) but more strongly associated in its excited electronic state (the energy of van der Waals interactions ~3–10 kcal/mol). The simplest aggregate state in the ground electronic state is often called a dimer, that is an aggregate state formed by two molecules in their ground electronic states. The aggregate state in the excited electronic state is called an excimer and in the simplest case is formed by two molecules one of which prior to formation of the exciplex was in the ground electronic state and the other was in the excited electronic state. One of the most commonly observed features of aggregate states is that either their absorption spectrum or their emission spectrum or both are shifted compared to the absorption spectrum or emission spectrum or both, respectively, of the monomer state. The shift can occur to the red or to the blue. On the other hand, the absorption or emission spectra or both of aggregate states can contain new features such as peaks and shoulders positioned to either red or blue compared to the absorption or emission spectrum or both of the monomer state, respectively. Another most commonly observed characteristic of aggregate states is that the intensity and sometimes the position (wavelength) of the new or shifted absorption or emission or both depend on concentration of molecules that form the aggregate state. With increasing concentration, the intensity of shifted absorption or emission features or both can increase due to the increasing concentration of the aggregate states, while the position, or wavelength, can shift too due to the increase in the size (number of molecules involved in the formation) of the aggregate states. Another common characteristic of aggregate states which is observed in the absence of readily detectable changes in the monomer absorption or emission spectrum or both is the change in the intensity (quantum yield of luminescence) of the monomer emission. For reference, these definitions can be found in N.J. Turro, Modern Molecular Photochemistry, University Science Books, Sausalito, Calif. 1991.

For some organic compounds, their molecular structure is such that their aggregates in excited electronic states are emissive, and thus can be readily observed by measuring fluorescence emission spectra as a function of concentration, for example FIGS. 4–16; Table 1. Compounds that form emissive and highly emissive aggregate states are potentially the most useful as first host components. However, there are many organic compounds that form aggregate states which are not emissive or only weakly emissive. Formation of completely or essentially non-emissive aggregate states (that is those with the quantum yield of luminescence of zero or near zero) can lead to a decrease in the efficiency of electroluminescence and photoluminescence due to insufficient efficiency of electronic excitation energy transfer to the luminescent dopant. Nevertheless, for certain types of compounds, especially the ones listed above, the quantum yield of luminescence of an aggregate state is most often found to be non-zero. This can be sufficient to sustain a sufficient rate of electronic excitation energy to the luminescent dopant, if the latter acts as a sufficiently strong acceptor in the well known in the art Foerster energy transfer process. Therefore, such compounds would not compromise the electroluminescence efficiency and could also be useful as first host components. Their use would result not only in improved operational lifetimes but also in excellent EL efficiencies. On the other hand, if the acceptor (luminescent dopant) of the excitation energy transfer is strong and its concentration is sufficiently high so that the quantum efficiency of the energy transfer is ~100% then even if the quantum yield of luminescence of the donor decreases by 10–15 times (given that everything else remains equal) the quantum efficiency of the energy transfer, and thus of the acceptor luminescence, decreases only by ~10%.

Another important criteria for selection of compounds as first host components is that the aggregate states of this compound should have spectroscopic characteristics, namely absorption and emission spectra, excited state lifetime, quantum yield of luminescence, and oscillator strength, such that efficient transfer of electronic excitation energy to the luminescent dopant of appropriate color is insured.

Many of the benzenoid compounds found useful as the first host component in the present invention have a flat rigid geometry, which encourages formation of aggregate states. Many representative benzenoids, such as pyrene, perylene, coronene, naphthacene, anthracene, pentacene, anthanthrene, picene, triphenylene, chrysene, fluoranthene, benzo[ghi]perylene, ovalene, etc. and their mono- and poly-substituted benzo, naphtho, anthra, phenanthro, triphenyleno, and other derivatives have been shown in the common literature to possess a pronounced propensity for aggregate state formation. The aggregate states of these compounds are extensively characterized in common literature. If the PAH compound is emissive in its monomer state, it is most often found to be emissive in its aggregate state also, especially in the solid solutions and in the absence of oxygen (exactly as found in an OLED device). Other organic compounds meeting such a planar geometry criteria are useful as well.

Although aggregate states including two molecules are most often found and described in the literature, often it is found that compounds such as disclosed in the present invention are capable of forming aggregate states including not only two molecules, but of three, four, five, ten, hundred, thousand and more molecules as the volume % increases. With sufficiently high number of molecules of the first host component participating in the formation of an aggregate state, a domain could be formed where certain degree of order or degree of crystallinity could be found. The size of these domains could be in the range of nanometers (nanocrystalline domain) or even micrometers (microcrystalline domain).

Materials for the second host component of the luminescent layer of the present invention include organic compounds that are capable of forming a continuous and substantially pin-hole-free thin film upon mixing with the first host component. They can be polar, such as (i) the common host for green, yellow, orange, and red OLEDs $AlQ_3$ and other oxinoid and oxinoid-like materials and metal complexes, and (ii) common hosts of heterocyclic family for blue, blue-green, green, yellow, orange, and red OLEDs such as those based on oxadiazole, imidazole, pyridine, phenanthroline, triazine, triazole, quinoline and other moieties. They also can be nonpolar, such as (i) the common hosts of anthracene family for blue, blue-green, green, yellow, orange, and red OLEDs, such as 2-(1,1-dimethyl-ethyl)-9,10-bis(2-naphthalenyl)anthracene (TBADN), 9,10-Bis[4-(2,2-diphenylethenyl)phenyl]anthracene, and 10,10'-Diphenyl-9,9'-bianthracene; (ii) common hosts of rubrene family for yellow, orange, and red OLEDs, such as rubrene and 5,6,11,12-tetrakis(2-naphthyl)tetracene; and (iii) common hosts of triarylamine family for blue, blue-green, green, yellow, orange, and red OLEDs such as NPB, TNB, and TPD. The second host component can have a bandgap that is less than, more than, or equal to that of the first host component in either its monomer state or aggregate state. The bandgap (or energy gap) is defined as the energy needed to bring an electron from the highest occupied molecular orbital to the lowest unoccupied molecular orbital of the molecule. When the bandgap of the first host component in its monomer state is approximately equal to that of the second host component and the dopant is absent, the photoluminescence (PL) and electroluminescence (EL) spectra are composed of the emission spectra of both species. This can be seen in FIG. 4 and FIG. 6, the curves corresponding to 2% and 4% cases. This can be further seen in FIGS. 8, 10, 11, and 12. When the bandgap of the first host component in its monomer state is approximately equal to that of the first host component in its aggregate state and to that of the second host component (while the dopant is absent), the PL and EL spectra are composed of the emission spectra of all three species. This can be seen for example in FIG. 4 and FIG. 6, the curves corresponding to 6% and 10% cases. When the bandgap of the first host component in its aggregate state is smaller than that of the second host component and the dopant is absent, the PL and EL spectra are dominated by the emission spectrum of the first host component in its aggregate state. This can be seen in FIG. 4 and FIG. 6, the curves corresponding to 15% case. Note that in all these cases the composition of the PL and EL spectra is also a subject to concentration, particularly of the aggregates of the first host component, and to quantum yield of luminescence and lifetime of the singlet excited states of all the species involved.

The necessary condition is that the bandgap of the luminescent dopant be smaller than the bandgap of the second host component, the bandgap of first host component in its monomer state, and the bandgap of the first host component in its aggregate state. This ensures that electronic excitation energy transfer from the first and second host components, resulting from the recombination of electrons and holes in the first and second host components, to the light-producing dopants is favorable.

Any one of the following three—second host component, the first host component in its monomer state, and the first host component in its aggregate state—can have the lowest bandgap between the three. The lowest bandgap material can also serve as a hole trap, an electron trap, or both but so can the species that does not necessarily have the lowest bandgap. Trapping injected and transported carriers directly on the molecules of a single host component can be beneficial as it promotes electron-hole recombination in this host component, shortcutting the need for carrier recombination in the other host component which can have implications for the size, density distribution, and geometry of the recombination zone as well as operational stability of OLED devices. Under this condition, the other host component is needed for carrier transport only and not for charge carrier recombination.

The first preferred class of materials for the second host component is the oxinoid compounds. Exemplary of contemplated oxinoid compounds are those satisfying the following structural formula:

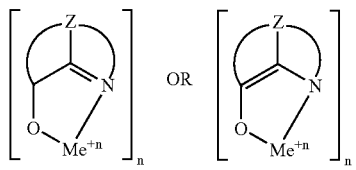

wherein:

Me represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, rubidium, cesium, or potassium; an alkaline earth metal, such as magnesium, strontium, barium, or calcium; or an earth metal, such as boron or aluminum, gallium, and indium. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds and their abbreviated names are the following:

Tris(8-quinolinol)aluminum (AlQ$_3$)

Bis(8-quinolinol)magnesium (MgQ$_2$)

Tris(8-quinolinol)gallium (GaQ$_3$)

8quinolinol lithium (LiQ)

The list further includes InQ$_3$, ScQ$_3$, ZnQ$_2$, BeBq$_2$ (bis(10-hydroxybenzo[h]quinolinato)beryllium), Al(4-MeQ)$_3$, Al(2-MeQ)$_3$, Al(2,4-Me$_2$Q)$_3$, Ga(4-MeQ)$_3$, Ga(2-MeQ)$_3$, Ga(2,4-Me$_2$Q)$_3$, and Mg(2-MeQ)$_2$. The list of oxinoid compounds further includes metal complexes with two bi-dentate ligands and one mono-dentate ligand, for example Al(2-MeQ)$_2$(X) where X is any aryloxy, alkoxy, arylcaboxylate, and heterocyclic carboxylate group.

Another class of materials useful as the second host component includes structures having an anthracene moiety. Exemplary of contemplated anthracene compounds are those satisfying the following structural formula:

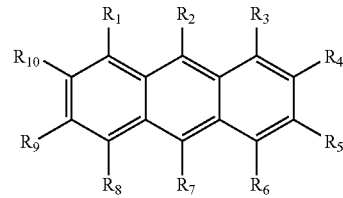

wherein substituents R$_2$ and R$_7$ are each individually and independently alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; and substituents R$_1$ through R$_{10}$ excluding R$_2$ and R$_7$ are of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent R$_1$ through R$_{10}$ substituents excluding R$_2$ and R$_7$ form an annelated benzo-, naphtho-, anthra-, phenanthro-, fluorantheno-, pyreno-, triphenyleno-, or peryleno-substituent or its alkyl or aryl substituted derivative;or any two adjacent R$_1$ through R$_{10}$ substituents excluding R$_2$ and R$_7$ form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, form a 1,2-benzo, 1,2-naphtho, 2,3-naphtho, 1,8-naphtho, 1,2-anthraceno, 2,3-anthraceno, 3,4-Per, 7,8-FlAn, 8,9-FlAn, 2,3-TriP, 1,2-TriP, ace, or indeno substituent or their alkyl or aryl substituted derivative.

Illustrative of useful anthracene compounds and their abbreviated names are the following:

2-(1,1-dimethylethyl)-9,10-bis(2-naphthalenyl)anthracene (TBADN), 9,10-bis(2-naphthalenyl)anthracene (ADN), 9,10-bis(1-naphthalenyl)anthracene, 9,10-bis[4-(2,2-diphenylethenyl)phenyl]anthracene, 9,10-Bis([1,1':3',1'-terphenyl]-5'-yl)anthracene, 9,9'-Bianthracene, 10,10'-Diphenyl-9,9'-bianthracene, 10,10'-Bis([1,1':3',1'''-terphenyl]-5'-yl)-9,9'-bianthracene, 2,2'-Bianthracene, 9,9',10,10'-Tetraphenyl-2,2'-bianthracene, 9,10-Bis(2-phenylethrnyl)anthracene, or 9-Phenyl-10-(phenylethynyl)anthracene.

Another class of materials useful as the second host component includes structures having an amine moiety. Exemplary of contemplated amino compounds are those satisfying structural formula:

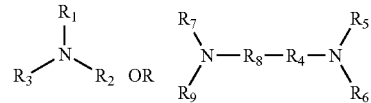

wherein:

substituents $R_4$ and $R_8$ are each individually and independently aryl, or substituted aryl of from 5 to 30 carbon atoms, heterocycle containing at least one nitrogen atom, or at least one oxygen atom, or at least one sulfur atom, or at least one boron atom, or at least one phosphorus atom, or at least one silicon atom, or any combination thereof; substituents $R_4$ and $R_8$ each or together ("$R_4$–$R_8$") representing an aryl group such as benzene, naphthalene, anthracene, tetracene, pyrene, perylene, chrysene, phenanthrene, triphenylene, tetraphene, coronene, fluoranthene, pentaphene, ovalene, picene, anthanthrene and their homologs and also their 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituted derivatives; and substituents $R_1$ through $R_9$ excluding $R_4$ and $R_8$ are each individually hydrogen, silyl, alkyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, of at least one silicon atom, or any combination thereof.

Illustrative of useful amino compounds and their abbreviated names are the following:

N,N'-bis(1-naphthalenyl)-N,N'-diphenylbenzidine (NPB),

N,N'-bis(1-naphthalenyl)-N,N'-bis(2-naphthalenyl)benzidine (TNB),

N,N'-bis(3-methylphenyl)-N,N'-diphenylbenzidine (TPD), or

N,N'-Bis(N'',N'''-diphenylaminonaphthalen-5-yl)-N,N'-diphenyl-1,5-diaminonaphthalene (CAS 503624-47-3).

Another class of materials useful as the second host component includes structures having a fluorene moiety. Exemplary of contemplated fluorene compounds are those satisfying the following structural formula:

OR wherein:

substituents $R_1$ through $R_{25}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{25}$ substituents excluding $R_9$ and $R_{10}$ form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{25}$ substituents excluding $R_9$ and $R_{10}$ form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

Illustrative of useful fluorene compounds and their abbreviated names are the following:

2,2',7,7'-Tetraphenyl-9,9'-spirobi[9H-fluorene], 2,2',7,7'-Tetra-2-phenanthrenyl-9,9'-spirobi[9H-fluorene], 2,2'-Bis (4-N,N-diphenylaminophenyl)-9,9'-spirobi[9H-fluorene] (CAS 503307-40-2), 4'-Phenyl-spiro[fluorene-9,6'-[6H]indeno[1,2-j]fluoranthene], 2,3,4-Triphenyl-9,9'-spirobifluorene, 11,11'-Spirobi[11H-benzo[b]fluorene], 9,9'-Spirobi[9H-fluorene]-2,2'-diamine, 9,9'-Spirobi[9H-fluorene]-2,2'-dicarbonitrile, 2',7'-Bis([1,1'-biphenyl]-4-yl)-N,N,N',N'-tetraphenyl-9,9'-spirobi[9H-fluorene]-2,7-diamine, 9,9,9',9'',9'''-Hexaphenyl-2,2':7',2''-ter-9H-fluorene, 2,7-Bis([1,1'-biphenyl]-4-yl)-9,9'-spirobi[9H-fluorene], 2,2',7,7'-tetra-2-Naphthalenyl-9,9'-spirobi[9H-fluorene], or 9,9'-[(2,7-Diphenyl-9H-fluoren-9-ylidene)di-4,1-phenylene]bis-anthracene.

Another class of materials useful as the second host component includes structures having a naphthacene moiety. Exemplary of contemplated naphthacene compounds are those satisfying the following structural formula:

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

Illustrative of useful naphthacene compounds and their abbreviated names are the following:

5,6,11,12-Tetraphenylnaphthacene (rubrene),
5,12-Bis(2-naphthyl)-6,11-diphenyltetracene,
5,12-Bis(2-mesityl)-6,11-diphenyltetracene,
5,12-Bis(1-naphthyl)-6,11-diphenyltetracene,
5,6,11,12-Tetrakis(2-naphthyl)tetracene,
10,10'-[(6,11-Diphenyl-5,12-naphthacenediyl)di-4,1 phenylene]bis[2,3,6,7-tetrahydro-1H,5H-benzothiazolo[5,6,7-ij]quinolizine,
9,10,15,16-Tetraphenyl-dibenzo[a,c]naphthacene,
5,6,13,14-Tetraphenylpentacene,
4,4'-(8,9-Dimethyl-5,6,7,10,11,12-hexaphenyl-1,4-naphthacenediyl)bis-benzonitrile,
4,4'-(8,9-Dimethoxy-5,6,7,10,11,12-hexaphenyl-1,4-naphthacenediyl)bis[N,N-diphenylbenzenamine],
1,2,3,5,6,11,12-Heptaphenylnaphthacene,
1,4,5,6,7,10,11,12-Octaphenylnaphthacene,
6,11-diphenyl-5,12-bis(4'-N,N-diphenylaminophenyl) naphthacene,
7,8,15,16-Tetraphenyl-benzo[a]pentacene,
2,3,5,6,11,12-Hexaphenylnaphthacene,
6,11-diphenyl-5,12-bis(4'-cyanophenyl)naphthacene,
6,11-diphenyl-5,12-bis(4'-(2-thienyl)phenyl)naphthacene, or
9,10,19,20-Tetraphenyl-tetrabenzo[a,c,j,l]naphthacene.

Another class of materials useful as the second host component includes benzenoids that contain other heterocyclic structures. These structures include benzoxazolyl, and thio and amino analogs of benzoxazolyl of following general molecular structure:

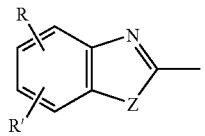

wherein:

Z is O, NR" or S; R and R', are individually hydrogen, alkyl of from 1 to 24 carbon atoms, aryl or hetero-atom substituted aryl of from 5 to 20 carbon atoms, fluoro, cyano, alkoxy, aryloxy, diarylamino, arylalkylamino, dialkylamino, trialkylsilyl, triarylsilyl, diaryalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or atoms necessary to complete a fused aromatic ring; and R" is hydrogen; alkyl of from 1 to 24 carbon atoms; or aryl of from 5 to 20 carbon atoms. These structures further include alkyl, alkenyl, alkynyl, aryl, substituted aryl, benzo-, naphtho-, anthra-, phenanthro-, fluorantheno-, pyreno-, triphenyleno-, or peryleno-, 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, indeno, fluoro, cyano, alkoxy, aryloxy, amino, aza, heterocyclic, keto, or dicyanomethyl derivatives thereof.

The material selection criteria for the dopant in the luminescent layer are: 1) the dopant molecule has a high efficiency of fluorescence or phosphorescence in the luminescent layer, and 2) it has a bandgap (singlet bandgap for the case of fluorescent dopants and triplet bandgap for the case of phosphorescent dopants) smaller than that of the both first and second host materials, the first component being either in its monomer state or its aggregate state.

For red-emitting OLEDs, a preferred class of dopants of this invention is the DCM class and has the general formula:

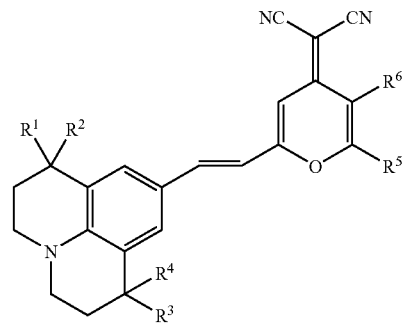

wherein:

$R^1$, $R^2$, $R^3$, and $R^4$ are individually alkyl of from 1 to 10 carbon atoms; $R^5$ is alkyl of from 2 to 20 carbon atoms, aryl, sterically hindered aryl, or heteroaryl; and $R^6$ is alkyl of from 1 to 10 carbon atoms, or a 5- or 6-membered carbocyclic, aromatic, or heterocyclic ring connecting with $R^5$.

These materials possess fluorescence efficiencies as high as unity in solutions and emit in the orange and red spectral region. Representative materials of this class and their abbreviated names include:

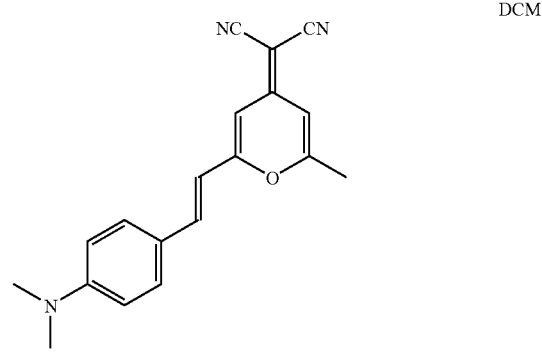

DCM

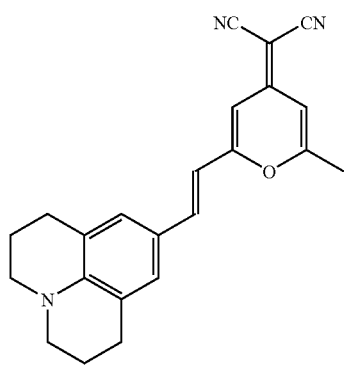
DCJ
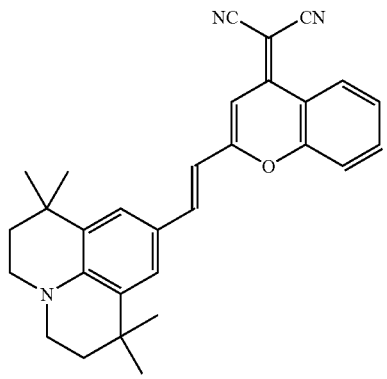
DCJTBz
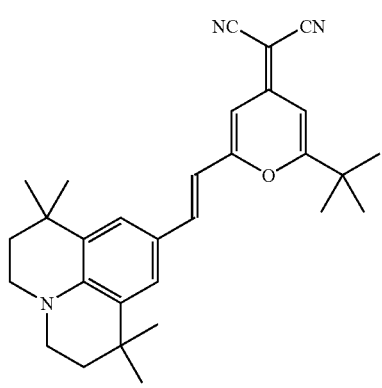
DCJTB
DCJT
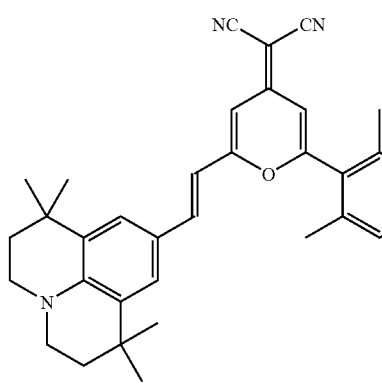
DCJTMes
DCJTE
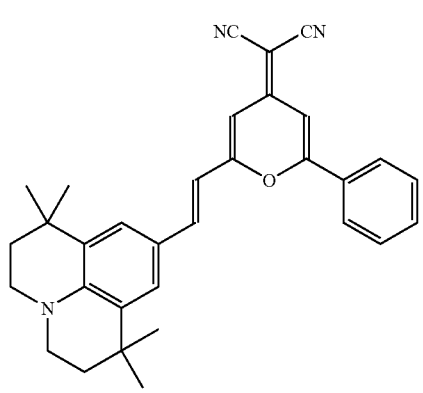
DCJTP
For red-emitting OLEDs, another preferred class of dopants of this invention comprises compounds having a periflanthene moiety:
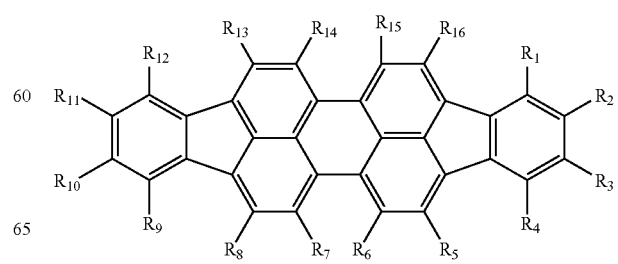

wherein:

substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions and emit in the orange and red spectral region. One representative material of this class is:

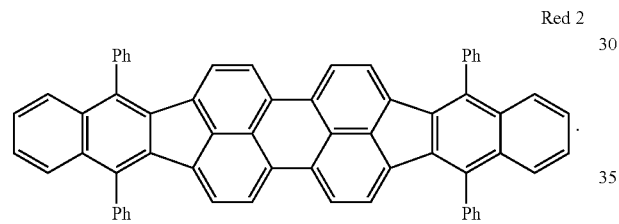

Red 2

For green-emitting OLEDs, a class of fluorescent materials is useful as the dopants in the present invention, which includes compounds having a coumarin moiety:

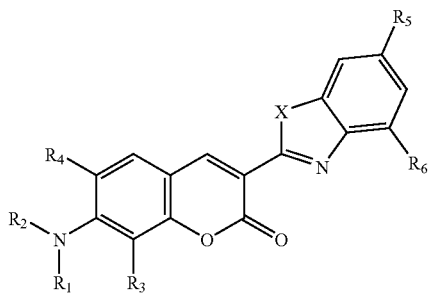

wherein:

X=S, O, or $NR_7$; $R_1$ and $R_2$ are individually alkyl of from 1 to 20 carbon atoms, aryl or carbocyclic systems; $R_3$ and $R_4$ are individually alkyl of from 1 to 10 carbon atoms, or a branched or unbranched 5 or 6 member substituent ring connecting with $R_1$ and $R_2$, respectively; $R_5$ and $R_6$ are individually alkyl of from 1 to 20 carbon atoms, which are branched or unbranched; and $R_7$ is any alkyl or aryl group.

These materials possess fluorescence efficiencies as high as unity in solutions. Representative materials of this class and their abbreviated names include:

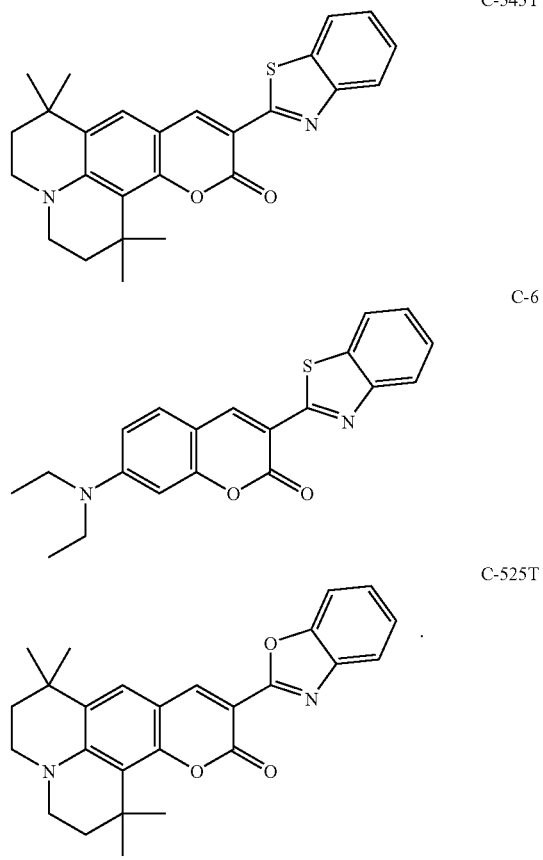

For green-emitting OLEDs, another class of fluorescent materials is useful as the dopants in the present invention, which includes compounds having a quinacridone moiety:

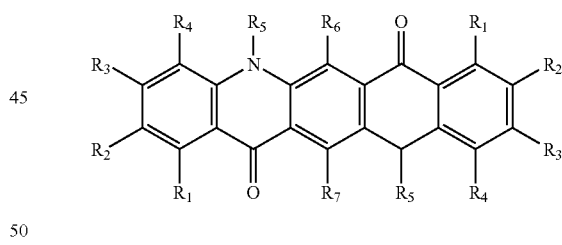

wherein:

substituents $R_1$ through $R_7$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_4$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_4$ substituents form a 1,2- benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class and their abbreviated names include:

Quinacridone, QA

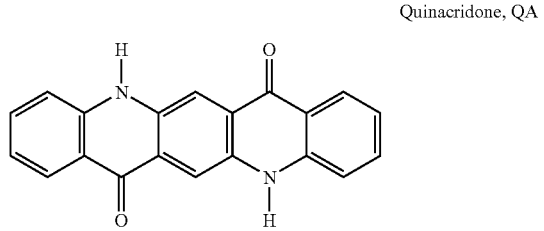

Dimethylquinacridone, DMQA

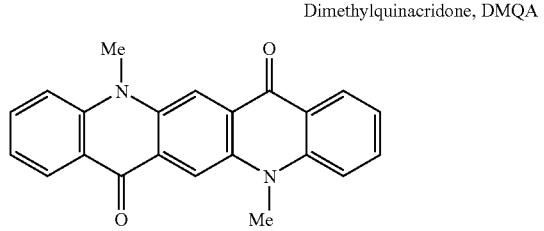

Diphenylquinacridone, DPQA

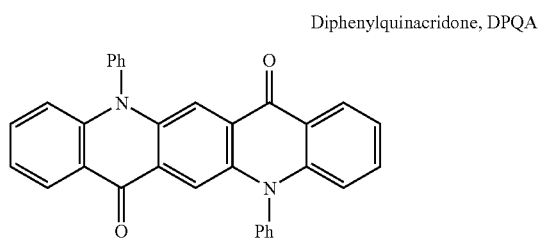

CFDMQA

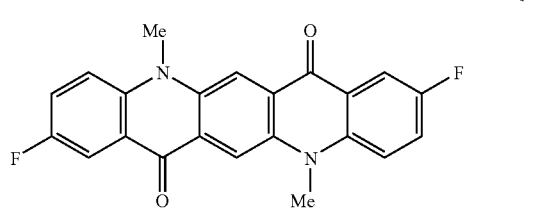

For green, green-yellow, and yellow emitting OLEDs, another class of fluorescent materials is useful as the dopants in the present invention, which includes compounds having a DPMB (dipyridinomethene borate) moiety:

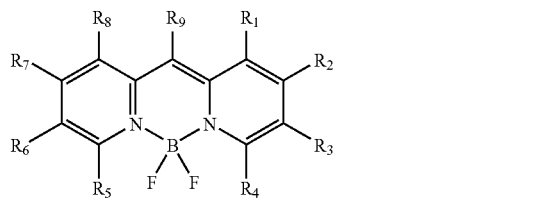

wherein:

substituents $R_1$ through $R_9$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof, or any two adjacent $R_1$ through $R_9$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_9$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class include:

DPMB 1

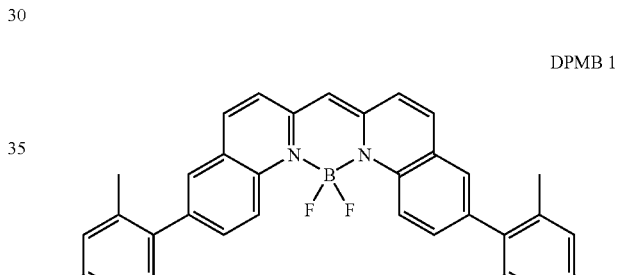

DPMB 2

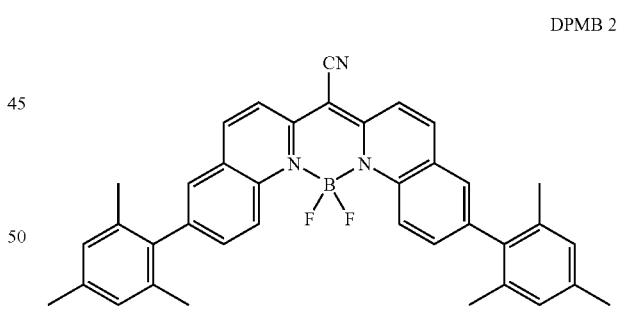

DPMB 3

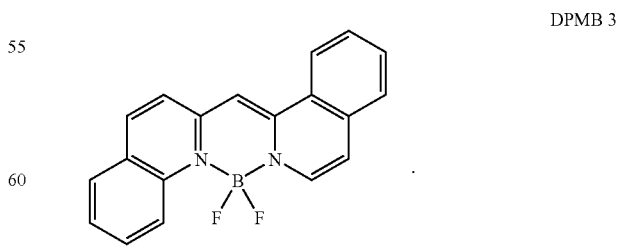

For yellow- and orange-emitting OLEDs, a preferred class of dopants for this invention includes compounds having an indenoperylene moiety:

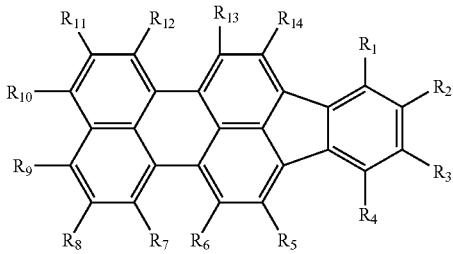

wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. One representative material of this class is:

Yellow-green 2

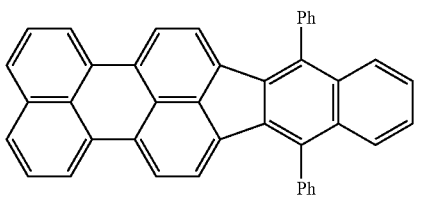

For yellow- and orange-emitting OLEDs, another preferred class of dopants for this invention includes compounds having a naphthacene moiety:

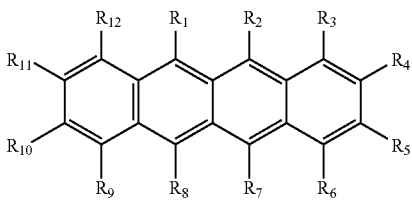

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions and emit in the spectral region from greenish-yellow to red. Representative materials of this class and their abbreviated names include:

5,6,11,12-Tetraphenylnaphthacene (rubrene), 2,2'-[(6,11-diphenyl-5,12-naphthacenediyl)di-4,1-phenylene]bis(6methylbenzothiazole) (Orange 2), 5,12-Bis(2-mesityl)-6,11-diphenyltetracene, 5,6,11,12-Tetrakis(2-naphthyl)tetracene, 10,10'-[(6,11-Diphenyl-5,12-naphthacenediyl)di-4,1 phenylene]bis[2,3,6,7-tetrahydro-1H,5H-benzothiazolo[5,6,7-ij]quinolizine, 5,6,13,14-Tetraphenylpentacene, 4,4'-(8,9-Dimethoxy- 5,6,7,10,11,12-hexaphenyl-1,4-naphthacenediyl)bis[N,N-diphenylbenzenenamine], 6,11-diphenyl-5,12-bis(4'-N,N-diphenylaminophenyl) naphthacene, 7,8,15,16-Tetraphenyl-benzo[a]pentacene, or 6,11-diphenyl-5,12-bis(4'-cyanophenyl)naphthacene.

For green-blue, blue-green, and blue-emitting OLEDs, a preferred class of dopants for this invention includes compounds having a BASB (bisaminostyrylbenzene) moiety:

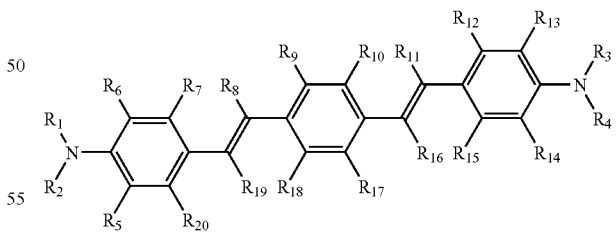

wherein:

each double bond can be either E or Z independently of the other double bond; substituents $R_1$ through $R_4$ are each individually and independently alkyl of from 1 to 24 carbon atoms, aryl, or substituted aryl of from 5 to 30 carbon atoms, heterocycle containing at least one nitrogen atom, or at least one oxygen atom, or at least one sulfur atom, or at least one boron atom, or at least one phosphorus atom, or at least one silicon atom, or any combination thereof; and substituents $R_5$ through $R_{20}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_5$ through $R_{20}$ substituents form an annelated benzo-, naphtho-, anthra-, phenanthro-, fluorantheno-, pyreno-, triphenyleno-, or peryleno-substituent or its alkyl or aryl substituted derivative; or any two $R_5$ through $R_{20}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class include:

4-(Diphenylamino)-4'-[4-(diphenylamino)styryl]stilbene,
4-(Di-p-Tolylamino)-4'-[(di-p-tolylamino)styryl]stilbene (Blue-green 2),
4,4'-[(2,5-Dimethoxy-1,4-phenylene)di-2,1-ethenediyl]bis[N,N-bis(4-methylphenyl)benzenamine,
4,4'-(1,4-Naphthalenediyldi-2,1-ethenediyl)bis[N,N-bis(4-methylphenyl)benzenamine,
3,3'-(1,4-Phenylenedi-2,1-ethenediyl)bis[9-(4-ethylphenyl)-9H-carbazole,
4,4'-(1,4-Phenylenedi-2,1-ethenediyl)bis[N,N-diphenyl-1-naphthalenamine,
4,4'-[1,4-Phenylenebis(2-phenyl-2,1-ethenediyl)]bis[N,N-diphenylbenzenamine],
4,4',4''-(1,2,4-Benzenetriyltri-2,1-ethenediyl)tris[N,N-diphenylbenzenamine],
9,10-Bis[4-(di-p-tolylamino)styryl]anthracene, or
α,α'-(1,4-Phenylenedimethylidyne)bis[4-(diphenylamino)-1-naphthaleneacetonitrile.

For blue-emitting OLEDs, a preferred class of dopants for this invention includes compounds having a perylene moiety:

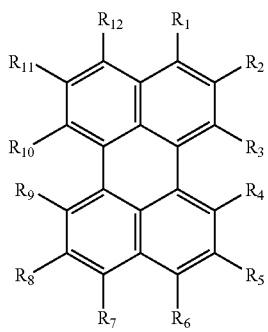

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class include:

Perylene
2,5,8,11-Tetra-tert-butylperylene (TBP)
2,8-Di-tert-Butylperylene
Benzo[b]perylene
Dibenzo[b,k]perylene For blue-emitting OLEDs, another preferred class of dopants for this invention includes compounds having a ADPMB (aza-DPMB) moiety:

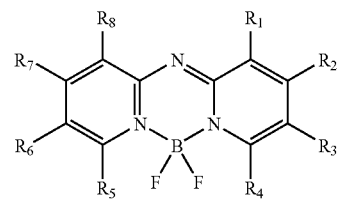

wherein:
substituents $R_1$ through $R_8$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_8$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_8$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their alkyl or aryl substituted derivative.

These materials possess fluorescence efficiencies as high as unity in solutions. Representative materials of this class include:

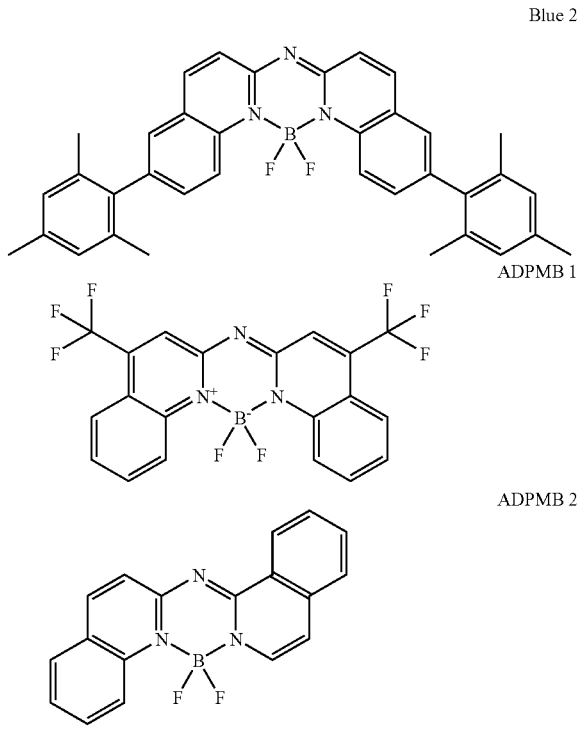

Blue 2

ADPMB 1

ADPMB 2

The composition of the luminescent layer of this invention is such that either the first host component or the second host component can constitute the largest volume fraction of the luminescent layer. The dopant usually constitutes the smallest volume fraction. The range for the first host component is from 1 to 99 volume % of the luminescent layer. The preferred range for the first host component is from 5 to 95% by volume. The range for the second host component is from 1 to 99 volume % of the luminescent layer. The preferred range for the second host component is from 5 to 95% by volume. The concentration range for the dopant is from 0.1% to 10% by volume. The preferred concentration range for the dopant is from 0.5% to 5% by volume. The thickness of the luminescent layer useful in this invention is between 50 Angstroms and 5000 Angstroms. A thickness in this range is sufficiently large to enable recombination of charge carriers and, therefore, electroluminescence to take place exclusively in this layer. A preferred range is between 100 Angstroms and 1000 Angstroms, where the overall OLED device performance parameters, including drive voltage, are optimal.

A useful method for forming the luminescent layer of the present invention is by vapor deposition in a vacuum chamber. This method is particularly useful for fabricating OLED devices, where the layer structure, including the organic layers, can be sequentially deposited on a substrate without significant interference among the layers. The thickness of each individual layer and its composition can be precisely controlled in the deposition process. To produce the desired composition of the luminescent layer, the rate of deposition for each component is independently controlled using a deposition rate monitor.

Another useful method for forming the luminescent layer of the present invention is by spin-coating or by ink-jet printing. This method is particularly useful for fabricating lower-cost OLED devices. Composition of the luminescent layer is determined by the concentration of each component in the solutions being coated.

Returning to FIG. 2, hole-transport layer 231 and electron-transport layer 233 provide the functions of transporting holes and electrons, respectively, to the luminescent layer 232. The use of these layers and their material compositions in OLED devices have been disclosed by Tang et al. in commonly assigned U.S. Pat. No. 4,769,292, included herein by reference. A typical hole-transport layer includes the hole-transporting compounds such as N,N'-bis(1-naphthyl)-N,N'-diphenylbenzidine (NPB), N,N'-bis(1-naphthyl)-N,N'-bis(2-naphthyl)benzidine (TNB), and N,N'-bis(3-tolyl)-N,N'-diphenylbenzidine (TPD).

Returning to FIG. 3, hole-injection layer 331 and electron-injection layer 335 provide the functions of improving the hole-injection from the anode and electron-injection from the cathode 340, respectively. The use of a hole-injection layer in OLED devices has been disclosed by Van Slyke et al. in commonly assigned U.S. Pat. No. 4,720,432, included herein by reference. The use of an electron-injection layer has been disclosed by Hung et al. in commonly assigned U.S. Pat. No. 5,776,622, also included herein by reference.

WORKING EXAMPLES 1–19

Electroluminescence of Aggregates of Various Materials

OLED devices were prepared as follows. A glass substrate coated with about 850 Å transparent indium-tin-oxide (ITO) conductive layer was cleaned and dried using a commercial glass scrubber tool. The ITO surface was subsequently treated with an oxidative plasma to condition the surface as an anode. Over the ITO was deposited a 10 Å thick hole-injecting layer of fluorocarbon (CFx) by plasma-assisted deposition of $CHF_3$. The following layers were deposited in the following sequence by sublimation from heated crucible boats in a conventional vacuum deposition chamber under a vacuum of approximately $10^{-6}$ Torr: (1) a hole-transport layer, 750 Å thick, including NPB, (2) a luminescent layer, 350 Å thick, including the first and second host components in certain ratio (indicated in Table 1) and not containing luminescent dopants, (3) an electron-transport layer, 350 Å thick, including $AlQ_3$, and (4) a cathode, approximately 2200 Å thick, including an alloy of magnesium and silver with a Mg:Ag volume ratio of about 10:1. Following that the devices were encapsulated in nitrogen atmosphere along with calcium sulfate as a desiccant.

The EL characteristics of these devices were evaluated using a constant current source and a photometer. The drive voltage, EL efficiency in cd/A and W/A, CIE coordinates, peak wavelength, $\lambda_{max}$, full spectral width at half-maximum, FWHM, and loss or gain in EL efficiency as current density, J, increases from 0.5 to 100 $mA/cm^2$, $\Delta$ cd/A vs J, at current densities ranging from relatively low, 0.5 $mA/cm^2$, to relatively high, 100 $mA/cm^2$, were measured. The EL efficiency in W/A, CIE coordinates, $\lambda_{max}$, FWHM, and description of the EL color and spectrum at 20 $mA/cm^2$ are given in Table 1.

As can be seen from Table 1 it is common for materials luminescent in their monomer state to form the aggregate states which are also luminescent in both polar and nonpolar environments and electroluminescence for the aggregate states of these materials is readily observed. It further can be seen that the range of aggregate electroluminescence spans the whole visible spectrum and can be tuned by proper choice of materials.

FIGS. 4 through 16 illustrate photoluminescence and electroluminescence spectra for many of the Examples 1–19.

forward bias at 80 mA/cm² alternating with the 0.5 ms of reverse bias of −14V) and at room temperature and at average current density of 20 mA/cm² (0.5 ms forward bias at 40 mA/cm² alternating with the 0.5 ms of reverse bias of −14V) and at 70° C., and the effects of addition of the 1$^{st}$ host component on the operational stability of the OLED devices. The devices were permitted to run for 250–2000 hours, after which time the aging was stopped and if $T_{50\%}$ was not

TABLE 1

OLED data at 20 mA/cm²: electroluminescence for aggregates of various materials ($\lambda_{max}$ is peak wavelength, nm; FWHM is full spectral width at half-maximum, nm)

| Example # | 1$^{st}$ host component (1$^{st}$ hc)/2$^{nd}$ host component (2$^{nd}$ hc) | % 1$^{st}$ hc | Aggregate color/spectrum description | CIE$_x$ CIE$_y$ | $\lambda_{max}$/FWHM nm | Efficiency W/A |
|---|---|---|---|---|---|---|
| 1 | Naphtho[2,3-a]pyrene/Alq | 15 | greenish-yellow; wide (Alq-like shape) | 0.361 0.560 | 536/100 | 0.024 |
| 2 | Naphtho[2,3-a]pyrene/TBADN | 20 | greenish-yellow; wide (DCJTB-like shape) | 0.451 0.527 | 560/104 | 0.027 |
| 3 | Benzo[ghi]perylene/Alq | 40 | not readily visible in Alq | ~same as Alq | ~same as Alq | 1.3x higher than Alq |
| 4 | Benzo[ghi]perylene/TBADN | 25 | blue-green | ~0.200 0.300 | 480/~65 | 0.033 |
| 5 | Coronene/TBADN | 25 | blue-green; long tail into the red | ~0.300 0.400 | 510/~86 | ~0.012 |
| 6 | Perylene/Alq | 25 | green-yellowish | 0.420 0.550 | 540/88 | 0.018 |
| 7 | Perylene/TBADN | 25 | green; symmetric; pointy | 0.336 0.572 | 532/84 | 0.025 |
| 8 | 2,5,8,11-Tetra-tert-butylperylene/TBADN | 40 | blue-green; structured with long tail into the red | ~0.200 0.400 | 500/~65 | 0.017 |
| 9 | Peropyrene/TBADN | 25 | yellow; wide (DCJTB-like shape) | 0.504 0.487 | 576/108 | 0.027 |
| 10 | Benzo[a]pyrene/TBADN | 10 | blue-green, low and wide | — | ~480/— | 0.024 |
| 11 | Dibenzo[b,k]perylene/Alq | 35 | not clearly visible in Alq | ~same as Alq | narrower than Alq | 1.2x higher than Alq |
| 12 | Dibenzo[b,k]perylene/TBADN | 10 | green, similar to perylene but bluer | 0.268 0.524 | 512/88 | 0.032 |
| 13 | Dibenzo[b,def]chrysene/TBADN | 5 | green | 0.350 0.580 | 528/86 | 0.010 |
| 14 | B-Truxene/TBADN | 30 | blue-green; wide | ~0.300 0.400 | 508/~110 | ~0.015 |
| 15 | Decacyclene/Alq | 30 | yellow; wide | ~0.450 0.450 | 570/~100 | ~0.005 |
| 16 | Decacyclene/TBADN | 5 | green-blue | 0.283 0.531 | 516/88 | 0.013 |
| 17 | Rubicene/Alq | 35 | red; very wide | ~0.660 0.340 | 650/136 | 0.005 |
| 18 | Dibenzo[a,l]pentacene/Alq | 40 | red | ~0.650 0.350 | 640/~100 | 0.005 |
| 19 | Indeno[1,2,3-cd]perylene/Alq | 45 | red | ~0.660 0.330 | 640/~100 | 0.006 |

COMPARATIVE EXAMPLE 20

OLED device 20 was constructed similar to the devices of Examples 1–19, except that the luminescent layer (2) was 450 Å thick, including AlQ$_3$ as the sole material. The EL characteristics of device 20 are shown in Table 2.

Table 2 also contains values of lifetimes, which were measured at average current density of 40 mA/cm² (0.5 ms reached a plot of luminance versus time was fitted with stretched exponential function of the following form:

$$L_t = L_0 \times \exp(A \times t^B),$$

where $L_t$ is luminance at time t, $L_0$ is initial luminance, A and B are empirical fit parameters, often found to be on the ragen of −0.011 and 0.59, respectively. Half-lifetime, $T_{50\%}$, of the device was found by calculating time at which $L_t/L_0 = 0.5$.

WORKING EXAMPLES 21–25

OLED devices 21–25 similar to the device of Comparative Example 20 were constructed, except that in the luminescent layer (2) naphtho[2,3-a]pyrene was used as the material for the first host component and AlQ$_3$ as the material for the second host component. The relative amounts of naphtho[2,3-a]pyrene and AlQ$_3$ on a volume basis were in the ratio 1:99, 2:98, 4:96, 10:90, and 15:85 for Examples 21, 22, 23, 24, and 25, respectively. The EL characteristics of the devices 21–25 are shown in Table 2. As can be seen from Table 2, devices 21–25 demonstrate as volume % of naphtho[2,3-a]pyrene increases:1) slight decrease in luminance efficiency followed by an increase; 2) shift of the emission color from green to green-yellow; 3) change in the Δ cd/A vs J behavior from gain to larger loss followed by a smaller loss; 4) from 300% to 1,000% improvement in lifetime relative to the Comparative Device 20.

COMPARATIVE EXAMPLE 26

An OLED device 26 similar to that of Comparative Example 20 was constructed, except that the sole material of the luminescent layer was TBADN. The EL characteristics of this device are shown in Table 2.

WORKING EXAMPLES 27–29

OLED devices 27–29 similar to the device of Comparative Example 26 were constructed, except that in the luminescent layer (2) naphtho[2,3-a]pyrene was used as the material for the first host component and TBADN as the material for the second host component. The relative amounts of naphtho[2,3-a]pyrene and TBADN on a volume basis were in the ratio 2:98, 6:94, and 20:80 for Examples 27, 28, and 29, respectively. The EL characteristics of the devices 27–29 are shown in Table 2. As can be seen, devices 27–29 demonstrate as volume % of naphtho[2,3-a]pyrene increases:1) about 15% decrease in the drive voltage; 2) no change in luminance efficiency; 3) shift in color of emission from blue-green to yellow; 4) change in the Δ cd/A vs J behavior from loss first to larger loss and then to smaller loss; 5) from 550% to 1,700% improvement in lifetime relative to the Comparative Device 26.

COMPARATIVE EXAMPLE 30

An OLED device 30 such as that of Comparative Example 20 was constructed. The EL characteristics of this device are shown in Table 2.

WORKING EXAMPLES 31–33

OLED devices 31–33 similar to the device of Comparative Example 30 were constructed, except that in the luminescent layer (2) naphthacene, was used as the material for the first host component and AlQ$_3$ as the material for the second host component. The relative amounts of naphthacene and AlQ$_3$ on a volume basis were in the ratio 1:99, 2:98, and 4:96 for Examples 31, 32 and 33, respectively. The EL characteristics of the devices 31–33 are shown in Table 2. As can be seen, devices 131–33 demonstrate as volume % of naphthacene increases: 1) no significant change in the drive voltage or luminance efficiency; 2) change in the Δ cd/A vs J behavior from gain to loss; 3) from 40% to 120% improvement in lifetime relative to the Comparative Device 30.

COMPARATIVE EXAMPLE 34

An OLED device 34 such as that of Comparative Example 26 was constructed. The EL characteristics of this device are shown in Table 2.

WORKING EXAMPLES 35–38

OLED devices 35–38 similar to the device of Comparative Example 34 were constructed, except that in the luminescent layer (2) pyrene was used as the material for the first host component and TBADN as the material for the second host component. The relative amounts of pyrene and TBADN on a volume basis were in the ratio 2:98, 6:94, 13:87, and 33:77 for Examples 35, 36, 37, and 38, respectively. The EL characteristics of the devices 35–38 are shown in Table 2. As can be seen, devices 35–38 demonstrate from 150% to 180% improvement in lifetime relative to the Comparative Device 34.

TABLE 2

Compositions and EL properties (at 20 mA/cm$^2$) of OLED devices of Examples 20–38[a]

| Example or Device # | First host component N[2,3-a]P, vol % | Second host component AlQ$_3$, vol % | Dopant, vol % | Drive voltage, V | Efficiency, cd/A, W/A | CIEx | CIEy | $\lambda_{max}$, FWHM, nm | Δ cd/A vs J, % from 0.5 to 100 mA/cm$^2$ | $T_{50\%}$, h @40 mA/cm$^2$, AC, RT |
|---|---|---|---|---|---|---|---|---|---|---|
| 20 | 0 | 100 | 0 | 8.2 | 2.43, 0.018 | 0.334 | 0.551 | 528, 104 | +14 | 1,100 |
| 21 | 1 | 99 | 0 | 8.3 | 2.27, 0.017 | 0.309 | 0.552 | 520, 100 | −20 | 3,200 |
| 22 | 2 | 98 | 0 | 8.4 | 2.03, 0.016 | 0.277 | 0.537 | 516, 92 | −31 | 4,700 |
| 23 | 4 | 96 | 0 | 8.3 | 2.33, 0.018 | 0.287 | 0.548 | 516, 92 | −40 | 7,000 |
| 24 | 10 | 90 | 0 | 8.4 | 3.14, 0.022 | 0.361 | 0.560 | 536, 108 | −37 | 8,200 |
| 25 | 15 | 85 | 0 | 8.3 | 3.49, 0.024 | 0.402 | 0.551 | 548, 104 | −31 | 10,000 |

TABLE 2-continued

Compositions and EL properties (at 20 mA/cm$^2$) of OLED devices of Examples 20–38[a]

| Example or Device # | First host component N[2,3-a]P, vol % | Second host component TBADN, vol % | Dopant, vol % | Drive voltage, V | Efficiency, cd/A, W/A | CIEx | CIEy | $\lambda_{max}$, FWHM, nm | Δ cd/A vs J, % from 0.5 to 100 mA/cm$^2$ | $T_{50\%}$, h @40 mA/cm$^2$, AC, RT |
|---|---|---|---|---|---|---|---|---|---|---|
| 26 | 0 | 100 | 0 | 8.5 | 1.20, 0.026 | 0.149 | 0.135 | 460, 68 | −21 | 550 |
| 27 | 2 | 98 | 0 | 7.9 | 2.59, 0.024 | 0.229 | 0.458 | 476, 84 | −37 | 3600 |
| 28 | 6 | 94 | 0 | 7.4 | 3.21, 0.023 | 0.340 | 0.543 | 532, 104 | −23 | 6200 |
| 29 | 20 | 80 | 0 | 7.5 | 3.73, 0.027 | 0.451 | 0.527 | 560, 104 | −11 | 10,000 |

| Example or Device # | First host component N, vol % | Second host component AlQ$_3$, vol % | Dopant, vol % | Drive voltage, V | Efficiency, cd/A, W/A | CIEx | CIEy | $\lambda_{max}$, FWHM, nm | Δ cd/A vs J, % from 0.5 to 100 mA/cm$^2$ | $T_{50\%}$, h @40 mA/cm$^2$, AC, RT |
|---|---|---|---|---|---|---|---|---|---|---|
| 30 | 0 | 100 | 0 | 7.6 | 2.96, 0.021 | 0.365 | 0.554 | 540, 108 | +24 | 800 |
| 31 | 1 | 99 | 0 | 8.0 | 3.13, 0.022 | 0.308 | 0.592 | 532, 88 | −25 | 1,100 |
| 32 | 2 | 98 | 0 | 8.2 | 3.09, 0.021 | 0.306 | 0.597 | 532, 84 | −34 | 1,400 |
| 33 | 4 | 96 | 0 | 8.1 | 3.04, 0.021 | 0.311 | 0.600 | 532, 84 | −35 | 1,700 |

| Example or Device # | First host component pyrene, vol % | Second host component TBADN, vol % | Dopant, vol % | Drive voltage, V | Efficiency, cd/A, W/A | CIEx | CIEy | $\lambda_{max}$, FWHM, nm | Δ cd/A vs J, % from 0.5 to 100 mA/cm$^2$ | $T_{50\%}$, h @40 mA/cm$^2$, AC, RT |
|---|---|---|---|---|---|---|---|---|---|---|
| 34 | 0 | 100 | 0 | 8.7 | 1.33, 0.026 | 0.166 | 0.163 | 460, 68 | −12 | 225 |
| 35 | 2 | 98 | 0 | 9.0 | 1.28, 0.026 | 0.161 | 0.156 | 460, 68 | −12 | 620 |
| 36 | 6 | 94 | 0 | 9.2 | 1.30, 0.027 | 0.162 | 0.151 | 456, 68 | −16 | 570 |
| 37 | 13 | 87 | 0 | 9.0 | 1.29, 0.027 | 0.162 | 0.152 | 460, 68 | −13 | 570 |
| 38 | 33 | 77 | 0 | 9.4 | 1.24, 0.023 | 0.165 | 0.177 | 464, 72 | −11 | 590 |

[a]N[2,3-a]P - naphtho[2,3-a]pyrene; N - naphthacene; $\lambda_{max}$ - peak wavelength, nm; FWHM - full spectral width at half-maximum, nm; Δ cd/A vs
[b]J - loss or gain in EL efficiency as current density, J, increases from 0.5 to 100 mA/cm$^2$; RT - room temperature.

WORKING AND COMPARATIVE EXAMPLES 39–116

Stabilization Effects of Various Aggregate-Forming Materials

For thicknesses and concentrations of materials in multi-component layers of each device see Table 3. OLED devices were prepared similar to Examples 1–38. The following organic layers were deposited in the following sequence by sublimation from heated crucible boats in a conventional vacuum deposition chamber under a vacuum of approximately 10$^{-6}$ Torr: (1) a hole-transport layer, either 750 or 1,500 Å thick, including NPB, (2) a luminescent layer, from 100 to 2,000 Å thick, including the 1$^{st}$ host component, 2$^{nd}$ host component, and most often a luminescent dopant, and (3) an electron-transport layer, from 0 to 500 Å thick, including AlQ$_3$. In some cases 1$^{st}$ host component was added also to the NPB hole-transporting layer, whole or part of it and with or without a luminescent dopant, or a part of the AlQ$_3$ electron-transporting layer, or both. In the cases of white OLEDs, structure utilizing two emissive layers was used where a part of the NPB hole-transporting layer doped with Orange 2 dopant served as a yellow-orange-emitting layer and TBADN doped with Blue-green 2 served as a blue-green-emitting layer.

The values for CIE coordinates and EL efficiency in W/A at 20 mA/cm$^2$ and for operational stabilities expressed as values of $T_{90\%}$ and $T_{50\%}$ at RT-40 mA/cm$^2$ and 70° C.-20 mA/cm$^2$ for Working and Comparative Examples are shown in Table 3. Table 3 further lists the effects of addition of the 1$^{st}$ host component on the CIE coordinates, EL efficiency in W/A, and operational stability for Working Examples relative to the corresponding Comparative Examples.

Table 4 compiles various aging test data including aging at direct current conditions for Examples 47, 48, 49, 61, and 63-dibenzo[b,k]perylene as a first host component for red and green OLEDs.

As can be seen from Tables 3 and 4, Working Examples demonstrate from 50% to 10,000% improvements in lifetime relative to the respective Comparative Devices for a wide range of materials as 1$^{st}$ host components, various 2$^{nd}$ host components, various luminescent dopants of all colors, device configurations, compositions and thicknesses of emissive and charge-transporting layers, and testing conditions.

TABLE 3

OLED device data: red, yellow-orange, green, blue-green, blue, and white OLEDs.*,,*

| 1st host component (1st hc) | 1st hc % | dopant % | EML thickness, Å | CIE_x, CIE_y | Effect on color | Efficiency, W/A | Efficiency effect | Stability, AC, RT, @40 mA/cm² (ref.) T_90%, h | T_50%, h | Stability, AC, 70° C., @20 mA/cm² (ref.) T_90%, h | T_50%, h | Stability effect at RT | Stability effect at 70° C. |
|---|---|---|---|---|---|---|---|---|---|---|---|---|---|
| Red OLEDs reference cells: 750 Å NPB|300–450 Å Alq + 0.5–2% dopant|300–375 Å Alq (no NP) sample cells: 750 Å NPB|varied thickness of Alq + varied % of Naphtho[2,3-a]pyrene|300–375 Å Alq | | | | | | | | | | | | | |
| Example 39: 750 Å NPB|550–800 Å Alq + 0.5–0.8% DCJTB + x % Naphtho[2,3-a]pyrene|300 Å Alq | | | | | | | | | | | | | |
| Naphtho[2,3-a]pyrene | 19 | 0.8 | 557 | 0.651, 0.345 (0.645, 0.351) | small | 0.045 (0.027) | +67% | 605 (190) | 5,000–10,000* (1,400)* | | | ~3–6x increase | |
| | 31 | 0.7 | 650 | 0.657, 0.341 | small | 0.056 | +110% | 645 | 5,000–10,000* | | | ~3.5–6x increase | |
| | 43 | 0.57 | 785 | 0.656, 0.342 | small | 0.057 | +110% | 665 | 5,000–10,000* | | | 4–6x increase | |
| Example 40: 750 Å NPB|350–550 Å Alq + 0.5–1% DCJTB + x % Naphtho[2,3-a]pyrene|300 Å Alq | | | | | | | | | | | | | |
| Naphtho[2,3-a]pyrene | 17 | 0.83 | 360 | 0.638, 0.357 (0.621, 0.373) | better | 0.041 (0.032) | +28% | 450 (130) | 6,000* (1,200)* | 35 (25) | 1,000 (425) | ~3–5x increase | 2.4x increase |
| | 29 | 0.71 | 420 | 0.641, 0.356 | better | 0.057 | +78% | 625 | 6,000* | 55 | 1,050 | ~5x increase | 2.5x increase |
| | 38 | 0.63 | 480 | 0.641, 0.356 | better | 0.058 | +81% | 700 | 7,000* | 40 | 550 | ~5x increase | 1.3x increase |
| | 44 | 0.56 | 540 | 0.641, 0.357 | better | 0.055 | +72% | 700 | 6,000* | 25 | 380 | ~5x increase | ~none |

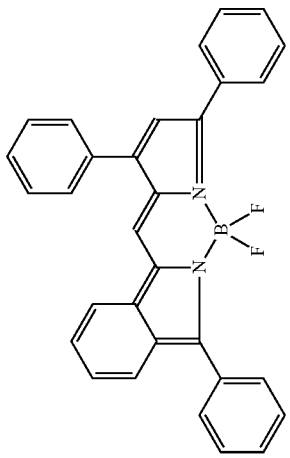

Example 41: 750 Å NPB|300–525 Å Alq + 0.35% + x % Naphtho[2,3-a]pyrene|300 Å Alq

| 1st host component | % 1st hc | dopant % | EML thickness, Å | CIE_x, CIE_y | Effect on color | Efficiency, W/A | Efficiency effect | T_90%, h | T_50%, h | T_90%, h | T_50%, h | Stability effect at RT | Stability effect at 70° C. |
|---|---|---|---|---|---|---|---|---|---|---|---|---|---|
| Naphtho[2,3-a]pyrene | 17–43 | 0.42–0.29 | 330–525 | ~0.615, 0.363 (0.496, 0.424) | far better | 0.010 (0.009) | ~0 | 1,500–2,000* (590)* | | | | ~3x increase | |

TABLE 3-continued

OLED device data: red, yellow-orange, green, blue-green, blue, and white OLEDs.*,**

| 1st host component (1st hc) | 1st hc % | dopant % | EML thickness, Å | Effect on color | Efficiency, W/A (ref.) | Efficiency effect | CIE_x, CIE_y (ref.) | Stability, AC, RT @40 mA/cm² (ref.) T₉₀%, h T₅₀%, h | Stability, AC, 70° C., @20 mA/cm² (ref.) T₉₀%, h T₅₀%, h | Stability effect at RT | Stability effect at 70° C. |
|---|---|---|---|---|---|---|---|---|---|---|---|

Example 42: 750 Å NPB|375–650 Å Alq + 0.3–0.5% + x % Naphtho[2,3-a]pyrene|375 Å Alq

| Naphtho[2,3-a]pyrene | 5, 13 | 0.45 | 390–430 | better | 0.022 (0.022) | none | ~0.580, 0.385 (0.574, 0.392) | | 600–1,200* (~300) | | ~3x increase |
| | 20–43 | 0.35 | 450–655 | far better | 0.030 | +36% | 0.630, 0.360 | | 1,500–2,000* | | 6x increase |

Green OLEDs reference cells: 750 Å NPB|375–450 Å Alq + 0.5% C545T or DPQA (or CFDMQA)|300–375 Å Alq (no NP)
sample cells: 750 Å NPB|varied thickness of Alq + varied % of C545T or DPQA (or CFDMQA)|300–375 Å Alq + varied % of NP|300–375 Å Alq
Example 43: 750 Å NPB|450–500 Å Alq + 0.45% C545T + x % Naphtho[2,3-a]pyrene|300 Å Alq

| Naphtho[2,3-a]pyrene | 1 | 0.48 | 455 | small | 0.032 (0.055) | –42% | 0.289, 0.639 (0.290, 0.645) | 12,200* (700) | 180 (35) | 3.1x increase | |
| | 8 | 0.40 | 488 | mild | 0.031 | –44% | 0.310, 0.625 | 6,000* | 400 | 8.6x increase | |

Example 44: 750 Å NPB|450–500 Å Alq + 0.5% CFDMQA + x % Naphtho[2,3-a]pyrene|300 Å Alq

| Naphtho[2,3-a]pyrene | 1 | 0.55 | 456 | small | 0.018 (0.028) | –36% | 0.336, 0.614 (0.323, 0.633) | 2,600* (1,000) | 200 (60) | 2.6x increase | |
| | 8 | 0.48 | 487 | strong | 0.017 | –39% | 0.386, 0.578 | 5,900* | 400 | 5.9x increase | |

Example 45: 750 Å NPB|375–400 Å Alq + 0.5% DPQA + x % Naphtho[2,3-a]pyrene 375 Å Alq

| Naphtho[2,3-a]pyrene | 0.5 | 0.5 | 375 | small | 0.044 (0.063) | –30% | 0.317, 0.636 (0.323, 0.640) | | 120 (65) | 2x increase | |
| | 1–3 | 0.5 | 385 | small | 0.038–0.031 (0.063) | –45% | 0.320, 0.631 (0.323, 0.640) | | 170 (65) 450 (130) | 2.6–3.5x | increase |
| | 5–7 | 0.49 | 400 | mild | 0.025 (0.045) | –44% | 0.330, 0.625 (0.306, 0.651) | | 550* (105) | 5.2x | increase |
| | 8–9 | 0.45 | 410 | strong | 0.024 (0.045) | –47% | 0.342, 0.618 (0.306, 0.651) | | 600* | 4.6x increase | increase |

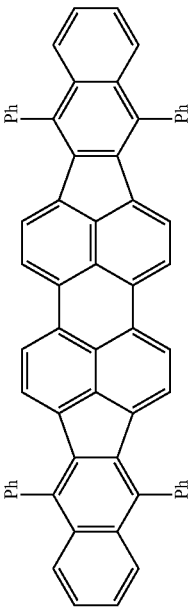

TABLE 3-continued

OLED device data: red, yellow-orange, green, blue-green, blue, and white OLEDs.*,**

| 1st host component (1st hc) | 1st hc % | dopant % | EML thickness, Å | CIE_x, CIE_y | Effect on color | Efficiency, W/A | Efficiency effect | Stability, AC, RT @40 mA/cm² (ref.), h T₉₀%, T₅₀% | Stability, AC, 70° C. @20 mA/cm² (ref.), h T₉₀%, T₅₀% | Stability effect at RT | Stability effect at 70° C. |
|---|---|---|---|---|---|---|---|---|---|---|---|

Example 46: 750 Å NPB|450–550 Å TBADN + x %
Naphtho[2,3-a]pyrene|300 Å Alq (no luminescent dopant; reference cell is undoped TBADN)

Blue OLEDs

| Naphtho[2,3-a]pyrene | 2 | 0 | 460 | 0.229, 0.458 (0.149, 0.135) | blue-green | 0.024 (0.028) | −15% | 550 (70) | | 7.8x increase | |
| | 6 | 0 | 475 | 0.340, 0.543 | green | 0.023 | −18% | 700 | | 10x increase | |
| | 17 | 0 | 540 | 0.451, 0.527 | green–yellow | 0.027 | ~0 | 500 | | 7.1x increase | |

Dibenzo[b,k]perylene (DBP) as a first host component
Red OLEDs
reference cells: 750 Å NPB|300 Å Alq + 1–2% DCJTB|300 Å Alq (no DBP)
sample cells: 750 Å NPB|varied thickness of Alq + varied % of DCJTB + varied % of Dibenzo[b,k]perylene|300 Å Alq
Example 47: 750 Å NPB|400–252 Å Alq + 1–1.5% DCJTB + x % DBP|300 Å Alq

| Dibenzo[b,k]perylene | 23 | 1.52 | 390 | 0.663, 0.334 (0.649, 0.347) | better | 0.041 (0.019) | +115% | 800 (120) | 125 (30) 3,000* (475) | 6.7x increase | 4–6x increase |
| | 31 | 1.38 | 435 | 0.664, 0.334 | better | 0.044 | +130% | 750 | 140 3,000*i | 6.3x increase | 5–6x increase |
| | 38 | 1.26 | 480 | 0.664, 0.334 | better | 0.044 | +130% | 900 | 145 3,500* | 7.5x increase | 6–8x increase |
| | 43 | 1.14 | 525 | 0.660, 0.336 | better | 0.040 | +110% | 500 | 45 550 | 4.2x increase | none |

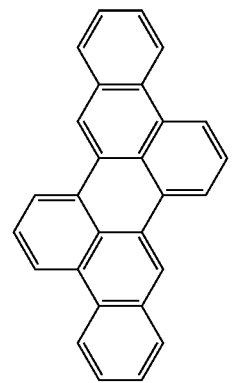

Example 48: 750 Å NPB|400–525 Å Alq + 0.6–1.4% DCJTB + x % DBP|300 Å Alq

| Dibenzo[b,k]perylene | 23 | 0.76 | 390 | 0.642, 0.354 | better | 0.045 | +120% | 540 | | ~5x increase | |
| | 31 | 0.69 | 435 | 0.645, 0.352 | better | 0.048 | +130% | 620 | | ~6x increase | |
| | 33 | 1.34 | 450 | 0.666, 0.332 | better | 0.042 | +100% | 640 | | ~6x increase | |
| | 38 | 0.63 | 480 | 0.645, 0.351 | better | 0.049 | +95% | 730 | | ~7x increase | |
| | 43 | 0.57 | 525 | 0.645, 0.351 | better | 0.051 | +120% | 720 | | ~7x increase | |

TABLE 3-continued

OLED device data: red, yellow-orange, green, blue-green, blue, and white OLEDs.*,**

| 1st host component (1st hc) | 1st hc % | % dopant | EML thickness, Å | CIE$_x$, CIE$_y$ | Effect on color | Efficiency, W/A | Efficiency effect | Stability, AC, RT @40 mA/cm² (ref.) T$_{90\%}$, h T$_{50\%}$, h | Stability, AC, 70° C., @20 mA/cm² (ref.) T$_{90\%}$, h T$_{50\%}$, h | Stability effect at RT | Stability effect at 70° C. |
|---|---|---|---|---|---|---|---|---|---|---|---|
| Example 49: 750 Å NPB450 Å Alq + 0.7% DCJTB + 35% DBP|300 Å Alq |
| Dibenzo[b,k]perylene | 135 | 0.67 | 450 | 0.640, 0.332 | better | 0.052 | +140% | 900* | | ~9x increase | |
| Example 50: 750 Å NPB300 Å Alq + 1% DCJTB + x % DBP|300 Å Alq |
| Dibenzo[b,k]perylene | 20 | 1.0 | 308 | 0.623, 0.370 (0.610,0.381) | better | 0.046 (0.031) | +50% | 1,100* (1,300) | 315 (60) | 8x increase | 5.5x increase |
| | 30 | 1.0 | 303 | 0.630, 0.365 | better | 0.050 | +61% | 2,000* | 435 | ~14x increase | 10x increase |
| Example 51: 750 Å NPB150–900 Å Alq + 1% DCJTB + 35% DBP|500–0 Å Alq (reference cell has the same structure as sample cells but 300 Å EML thickness) |
| Dibenzo[b,k]perylene | 33 | 0.63 | 150 | 0.618, 0.376 | worse | 0.045 | −9% | 1,000* | 100 | none | 1.3–1.7x decrease |
| | 33 | 0.62 | 305 | 0.630, 0.366 | small | 0.052 | ~0 | 900* | 135 | none | 1.1–1.3x decrease |
| | 33 | 0.64 | 450 | 0.635, 0.361 | ref. | 0.050 | ref. | 1,000* | 175 | reference cell | reference cell |
| ETL thickness, Å | | | | | | | | | | | |
| 500 | 33 | 0.64 | 605 | 0.639, 0.357 | small | 0.047 | −6% | 1,200* | 275 | ~1.2x increase | 1.1–1.6x increase |
| 400 | 33 | 0.63 | 755 | 0.640, 0.357 | small | 0.041 | −18% | 1,700* | 380 | ~1.7x increase | 1.3–2.2x increase |
| 300 | | | | | | | | | | | |
| 200 | | | | | | | | | | | |
| 100 | | | | | | | | | | | |
| 0 | 33 | 0.63 | 910 | 0.640, 0.357 | small | 0.037 | −26% | 2,500* | 410 | ~2.5x increase | 2.3–2.7x increase (T$_{80\%}$~2,000 h) |
| Example 52: 750 Å NPB300–525 Å Rubrene-Alq 3:1 (as 2nd host component) + 0.5–1% DCJTB + x % DBP|300 Å Alq |
| Dibenzo[b,k]perylene | 9 | 0.86 | 330 | 0.598, 0.394 (0.589, 0.402) | small | 0.029 (0.023) | +26% | | 100 (80) | | ~1.3x increase |
| | 17 | 0.83 | 360 | 0.604, 0.389 | better | 0.032 | +39% | | 200 | | ~2.5x increase |
| | 29 | 0.71 | 420 | 0.610, 0.385 | better | 0.037 | +61% | | 150 | | ~2x increase |
| | 38 | 0.63 | 480 | 0.615, 0.382 | better | 0.043 | +87% | | 300 | | ~3.8x increase |
| | 43 | 0.57 | 525 | 0.617, 0.380 | better | 0.042 | +80% | | 300 | | ~3.8x increase |

TABLE 3-continued

OLED device data: red, yellow-orange, green, blue-green, blue, and white OLEDs.*,**

| 1st host component (1st hc) | 1st hc % | dopant % | EML thickness, Å | CIE$_x$, CIE$_y$ | Effect on color | Efficiency, W/A | Efficiency effect | Stability, AC, RT, @40 mA/cm² (ref.) T$_{90\%}$, h T$_{50\%}$, h | Stability, AC, 70° C., @20 mA/cm² (ref.) T$_{90\%}$, h T$_{50\%}$, h | Stability effect at RT | Stability effect at 70° C. |
|---|---|---|---|---|---|---|---|---|---|---|---|
| Example 53: 750 Å NPB/300 Å Alq + 1% DCJTB + x % DBP/300 Å Alq ||||||||||||
| Dibenzo[b,k]perylene | 20 | 1.0 | 303 | 0.627, 0.367 (0.608, 0.383) | better | 0.047 (0.037) | +27% (ref.) | 380 (165) | | 2–6x increase | |
| | 30 | 1.0 | 305 | 0.632, 0.363 | better | 0.052 | +41% | 500 | ~5,000–10,000* (1,100)* | 3–6x increase | |
| | 40 | 1.0 | 304 | 0.635, 0.360 | better | 0.051 | +38% | 800 | ~5,000–10,000* | ~5x increase | |
| | 50 | 1.0 | 305 | 0.638, 0.357 | better | 0.049 | +32% | 700 | | ~5x increase | |
| | 60 | 1.0 | 300 | 0.643, 0.355 | better | 0.044 | +20% | 900 | | ~6–8x increase | |
| Example 54: 750 Å NPB/200–900 Å Alq + 1% DCJTB + 35% DBB/300 Å Alq (reference cell has 300 Å thick EML) ||||||||||||
| Dibenzo[b,k]perylene drive voltage | 35 | 0.96 | 200 | 0.641, 0.354 | small | 0.035 | −15% | 1,000 | ~15,000 | none | |
| 6.5 | 35 | 0.99 | 300 | 0.647, 0.349 | — | 0.041 | — | 1,000 | ~15,000 | reference cell | |
| 7.0 | 35 | 1.04 | 400 | 0.651, 0.346 | small | 0.047 | +15% | 1,400 | ~25,000* | 1.5x increase | |
| 7.5 | 35 | 1.01 | 500 | 0.652, 0.345 | small | 0.051 | +24% | 1,700 | ~30,000* | 1.7x increase | |
| 8.4 | 35 | 1.04 | 700 | 0.656, 0.341 | better | 0.058 | +41% | 2,000* | ~40,000* | 2x increase | |
| 10.0 | 35 | 1.04 | 900 | 0.660, 0.338 | better | 0.064 | +56% | 2,500* | ~45,000* | 3x increase | |
| 11.7 | | | | | | | | | | | |
| Example 55: 750 Å NPB/300 Å Rubrene (as the 2nd host component) + 0.5% + x % DBP/300 Å Alq ||||||||||||
| Dibenzo[b,k]perylene | 10 | 0.44 | 305 | 0.639, 0.349 (0.628, 0.361) | better | 0.037 (0.033) | +12% | 850* (400) | 650 (350) | 2–4x increase | ~2x increase |

TABLE 3-continued

OLED device data: red, yellow-orange, green, blue-green, blue, and white OLEDs.*,**

| 1st host component (1st hc) | 1st hc % | dopant % | EML thickness, Å | CIE$_x$, CIE$_y$ | Effect on color | Efficiency, W/A | Efficiency effect | Stability, AC, RT @40 mA/cm² (ref.) T$_{90\%}$, h | T$_{50\%}$, h | Stability, AC, 70° C., @20 mA/cm² (ref.) T$_{90\%}$, h | T$_{50\%}$, h | Stability effect at RT | Stability effect at 70° C. |
|---|---|---|---|---|---|---|---|---|---|---|---|---|---|
| | 20 | 0.44 | 303 | 0.644, 0.346 (ref.) | better | 0.037 (ref.) | +12% | 1,100* | | 1,000 | | 3–7x increase | ~3x increase |
| | 30 | 0.44 | 303 | 0.648, 0.342 | better | 0.038 | +15% | 1,400* | | 2,000* | | 3–10x increase | ~6x increase |
| | 40 | 0.44 | 300 | 0.655, 0.337 | better | 0.037 | +12% | 2,500* | | 2,200* | | 5–15x increase | ~7x increase |
| | 50 | 0.44 | 312 | 0.663, 0.332 | better | 0.033 | none | 4,000* | | 3,500* | | 8–30x increase | ~10x increase |

Example 56: EML is 300 Å Alq + 1.5% DCJTB; reference cell is 750 Å NPB|EML|300 Å Alq

| 450 Å NPB|300 Å NPB + 1.5% DCJTB| EML|300 Å Alq | | | | 0.640, 0.357 (0.637, 0.358) | ~0 | 0.022 (0.022) | none | 155 (125) | 1,400* (1,200)* | | | 2x increase | |
| 450 Å NPB|300 Å NPB + 1.5% DCJTB + 35% DBP|EML|300 Å Alq | | | | 0.642, 0.355 | small | 0.024 | +10% | 160 | 1,900* | | | 2.5x increase | |
| 450 Å NPB|300 Å NPB + 35% DBP| EML|300 Å Alq | | | | 0.626, 0.368¹ | worse | 0.023 | +5% | 200 | 2,200* | | | 2.7x increase | |
| 150 Å NPB|500 Å NPB + 35% DBP|100 Å NPB|EML|300 Å Alq | | | | 0.637, 0.359 | ~0 | 0.022 | none | 160 | 1,700* | | | 2.4x increase | |
| 750 Å NPB|EML|250 Å Alq + 35% DBP 50 Å Alq | | | | 0.635, 0.361 | ~0 | 0.020 | −10% | 135 | 1,500 | | | 2.3x increase | |

Example 57: 750 Å NPB|375 Å Alq + 1% DCJTB + x % of mixture of dibenzo[b,k]perylene & dibenzo[b,h]perylene (as 1st host component)|375 Å Alq

| Mixture of dibenzo[b,k]- & dibenzo[b,h] perylene | 0.25–8 | 0.9–1.0 | 375–405 | 0.626, 0.366 (0.620, 0.374) | small | 0.035 (0.038) | −8% | 100–400 (40) | | 1,200–5,000* (660) | | | 2–7x increase |
| 0.25% in Alq (no DCJTB) | 0.25 | 0 | 375 | 0.341, 0.548 | — | 0.020 | — | 100 | | 1,300* | | | 2x increase |

Green OLEDs reference cells: 750 Å NPB|375 Å Alq + 0.5% C545T or DPQA (or CFDMQA)|375 Å Alq (no DBP)
sample cells: 750 Å NPB|varied thickness of Alq + varied % of C545T or DPQA (or CFDMQA) + varied % of DBP|375 Å Alq
Example 58: 750 Å NPB|450–575 Å Alq + 0.5% C545T + x % DBP|375 Å Alq

| Dibenzo[b,k] perylene | 17 | 0.47 | 450 | 0.289, 0.644 (0.287, 0.645) | ~0 | 0.059 (0.080) | −26% | 70 (5) | 5,000* (280) | | | 18x increase | |
| | 33 | 0.35 | 575 | 0.308, 0.635 | small | 0.060 | −25% | 95 | 14,500* | | | 50x increase | |

Example 59: 750 Å NPB|570 Å Alq + 0.2–0.4% C545T + 35% DBP|375 Å Alq

| Dibenzo[b,k] perylene | 35 | 0.18 | 571 | 0.334, 0.619 | — | 0.045 | — | 1,000* | 10,000–50,000* | | | ~20–50x increase | |

TABLE 3-continued

OLED device data: red, yellow-orange, green, blue-green, blue, and white OLEDs.*,**

| 1st host component (1st hc) | % 1st hc | % dopant | EML thickness, Å | CIE$_x$, CIE$_y$ | Effect on color | Efficiency, W/A | Efficiency effect | Stability, AC, RT, @40 mA/cm² (ref.) T$_{90\%}$, h T$_{50\%}$, h | Stability, AC, 70° C., @20 mA/cm² (ref.) T$_{90\%}$, h T$_{50\%}$, h | Stability effect at RT | Stability effect at 70° C. |
|---|---|---|---|---|---|---|---|---|---|---|---|
| | 35 | 0.42 | 570 | 0.340–0.369 0.611–0.584 | — | 0.042–0.032 | (ref.) | 1,000–1,300* | | ~20–50x increase | |
| Example 60: 750 Å NPB560 Å Alq + 0.35% C545T + 35% DBP|375 Å Alq | | | | | | | | | | | |
| Dibenzo[b,k] perylene | 33 | 0.36 | 565 | 0.328, 0.629 (0.285, 0.654) | strong | 0.055 (0.067) | −18% | 900 20,000* | 300 (350) (20) | ~20–50x increase | ~15x increase |
| | 33 | 0.35 | 570 | 0.358–0.371 0.601–0.586 | — | 0.040–0.033 | — | 850–1,600 10,000–100,000* | 515 ~ 10,000–20,000* | ~20–50x increase | 20–50x increase |
| Example 61: 750 Å NPB400–525 Å Alq + 0.3–0.45% DPQA + x % DBP|375 Å Alq | | | | | | | | | | | |
| Dibenzo[b,k] perylene | 9 | 0.44 | 412 | 0.312, 0.643 (0.312, 0.647) | ~0 | 0.039 (0.051) | −22% | 700 (800) (65) (800) | 180–430 5,000* (35–75) (650) | 10.8x increase | 5–8x increase |
| | 17 | 0.41 | 450 | 0.326, 0.633 | small | 0.037 | −27% | 740 10,000–20,000* | 430–660 5,000–20,000* | ~13x increase | ~10–15x increase |
| | 29 | 0.35 | 525 | 0.343, 0.622 | strong | 0.032 | −37% | 1,000 | 430 | | |
| | 41 | 0.28 | 510 | 0.375, 0.597 | strong | 0.022 | −56% | 1,000 | 340–920 | | |
| Example 62: 750 Å NPB|375–410 Å Alq + 0.5% DPQA + x % DBP|375 Å Alq | | | | | | | | | | | |
| Dibenzo[b,k] perylene | 1 | 0.5 | 375 | 0.305, 0.642 (0.307, 0.649) | small | 0.033 (0.049) | −33% | 230 3,000* (75) (800) | | 3.4x increase | |
| | 2, 4 | 0.5 | 385 | 0.305, 0.643 | small | 0.033 | −33% | 350 4,000* | | 5x increase | |
| | 7, 9 | 0.48 | 410 | 0.308, 0.643 | small | 0.035 | −29% | 540 7,000* | | 8.8x increase | |
| Example 63: 750 Å NPB|450 Å Alq + 0.4% DPQA + 15% DBP|375 Å Alq | | | | | | | | | | | |
| Dibenzo[b,k] perylene | 16 | 0.38 | 454 | 0.328, 0.625 | — | 0.038 | — | 970 7,000–25,000* | | ~9x increase | |
| Example 64: 750 Å NPB|375 Å Alq + 0 or 0.5% C545T + 0 or 33% DBP|375 Å Alq | | | | | | | | | | | |
| 375 Å Alq, undoped | | | | 0.348, 0.563 | — | 0.022 | — | 120 | | undoped ref. cell | |
| 375 Å Alq + 33% DBP | | | | 0.368, 0.583 | small | 0.040 | +82% | 1,000* | | ~10x increase | |

TABLE 3-continued

OLED device data: red, yellow-orange, green, blue-green, blue, and white OLEDs.*,**

| 1st host component (1st hc) | 1st hc dopant % | % | EML thickness, Å | Effect on color | Efficiency, W/A | Efficiency effect | Stability, AC, RT, @40 mA/cm² (ref.) T₉₀%, h | T₅₀%, h | Stability, AC, 70° C., @20 mA/cm² (ref.) T₉₀%, h | T₅₀%, h | Stability effect at RT | Stability effect at 70° C. |
|---|---|---|---|---|---|---|---|---|---|---|---|---|
| 375 Å Alq + 33% DBP + 0.5% C545T | | 0.2 | | worse than 0% DBP | 0.324, 0.628 (ref.) | — | 1,000* | | | | ~10x increase | |
| 50 Å Alq + 33% DBP + 0.5% C545T 325 Å Alq + 33% DBP | | 1–8 | 375 | more host EL | 0.349, 0.603 | 0.044 | 1,200* | | | | 10x increase | |
| 160 Å Alq + 33% DBP 50 Å Alq + 33% C545T 160 Å Alq + 33% DBP + 0.5% C545T 325 Å Alq + 33% DBP | | 0.53 0.53–0.49 | 380–405 | more host EL | 0.358, 0.593 | 0.040 | 950* | | | | ~10x increase | |
| 50 Å Alq + 33% DBP + 0.5% C545T | | 0.3 | 375 | more host EL | 0.361, 0.592 | 0.039 | 1,300* | | | | 10x increase | |

Example 65: 750 Å NPB|375–400 Å Alq + 0.5% CFDMQA + x % of mixture of dibenzo[b,k]perylene & dibenzo[b,h]perylene|375 Å Alq

| Mixture of dibenzo[b,k]- & dibenzo[b,h] perylene 0.25% in Alq (no CFDMQA) | | 0.2 | | small | 0.321, 0.629 (0.316, 0.633) | ~0 | 80 (40) | 1,500* (850) | 50 (15) | 800 (400) | 1.4x increase | 2x increase |
| | | 1–8 | | small | 0.330, 0.620 | –29% | 130 | 2,000* | 30–90 | 750–1,200* | 3–5x increase | ~3x increase |
| | | 0.3 | | — | 0.342, 0.547 | — | 150 | 3,000* | 50 | 2,000* | 4x increase | 5x increase |

Blue OLEDs

Example 66: 750 Å NPB|300–340 Å TBADN + 1.5% TBP + x % Dibenzo[b,k]perylene|450 Å Alq

| Dibenzo[b,k] perylene | | 1 | 310 | greenish EL | 0.166, (0.151, 0.260) | –10% | 150 (90) | 700 (580) | | | 1.2x increase | |
| | | 1.5 | 0.297 | green | 0.038 (0.042) | –26% | 525 | | | | 6x increase | |
| | | 8 | 335 | | 0.268, 0.524 | | | | | | | |

Example 67: 750 Å NPB|200 Å TBADN + 0.75% (Blue 2) + x % Dibenzo[b,k]perylene|350 Å Alq

| Dibenzo[b,k] perylene | | 0.35 | 0.73 | 200 | 0.149, 0.136 (0.149, 0.126) | small | 0.053 (0.054) | none | 120 (80) | 900* (800*) | | in-signi-ficant |

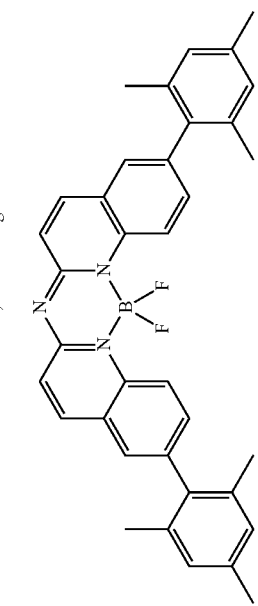

TABLE 3-continued

OLED device data: red, yellow-orange, green, blue-green, blue, and white OLEDs.*,**

| 1st host component (1st hc) | % 1st hc | % dopant | EML thickness, Å | CIE$_x$, CIE$_y$ | Effect on color | Efficiency, W/A | Efficiency effect | Stability, AC, RT @40 mA/cm² (ref.) T$_{90\%}$, h  T$_{50\%}$, h | | Stability, AC, 70° C., @20 mA/cm² (ref.) T$_{90\%}$, h  T$_{50\%}$, h | | Stability effect at RT | Stability effect at 70° C. |
|---|---|---|---|---|---|---|---|---|---|---|---|---|---|
| | 0.5 | 0.74 | 205 | 0.152, 0.153 | mild | 0.053 | none | 130 | 1,000* | | | 1.25x increase | |
| | 1–4 | 0.69 | 210 | 0.162–0.225, 0.202–0.427 | strong | 0.044 0.031 | −18 to −42% | 170– 365 | 1,200– 3,500* | | | 1.5– 4.4x increase | |
| Example 68: 750 Å NPB/200 Å TBADN + x % Dibenzo[b,k]perylene + 400 Å Alq (reference cell contains no DBP and 1% TBP) | | | | | | | | | | | | | |
| Dibenzo[b,k] perylene | 0.5 | 0 | 200 | 0.154, 0.154 (0.144, 0.179) | better | 0.044 (0.041) | +7% | 35 (120) | 700* (750)* | | | ~0 | |
| | 1 | 0 | 200 | 0.162, 0.201 | worse | 0.041 | 0 | 45 | 1,000* | | | 1.3x increase | |
| | 2 | 0 | 200 | 0.181, 0.292 | greenish | 0.035 | −14% | 55 | 2,000* | | | 2.7x increase | |
| | 4 | 0 | 200 | 0.208, 0.384 | blue-green | 0.031 | −24% | 55 | ~5,000* | | | 6.7x increase | |
| Example 69: 750 Å NPB/250 Å TBADN + 0.25% mixture of dibenzo[b,k]perylene & dibenzo[b,h]perylene/350 Å Alq | | | | | | | | | | | | | |
| Mixture of dibenzo[b,k]- & dibenzo[b,h] perylene | 0.3 | 0 | 250 | 0.154, 0.170 | — | 0.042 | — | 200 | 1,000* | 45 | 950* | 2x increase | ~3–4x increase |
| Example 70: 1,500 Å NPB/200 Å TBADN + 2.5% 4-(di-p-tolylamino)-4′-[di-p-tolylamino)styryl]stilbene(Blue-green 2) + x % DBP/350 Å Alq | | | | | | | | | | | | | |
| Dibenzo[b,k] perylene | 0.55 | 2.4 | 210 | 0.189, 0.372 (0.185, 0.365) | small | 0.073 (0.075) | ~0 | 600 (275)* | | | | 2.5x increase | |
| | 0.88 | 2.4 | 210 | 0.191, 0.372 | small | 0.071 | −5% | 800* | | | | 3x increase | |
| | 1.72 | 2.4 | 210 | 0.201, 0.384 | red edge increase | 0.062 | −17% | 1,000* | | | | 4x increase | |
| | 4.20 | 2.3 | 215 | 0.234, 0.447 | dopant+ aggre- gate EL | 0.053 | −29% | 1,500* | | | | 5.5x increase | |
| | 9.33 | 2.2 | 225 | 0.295, 0.515 | aggre- gate EL | 0.042 | −44% | 2,200* | | | | 7–10x increase | |
| Example 71: 1,500 Å NPB + x % DBP/EML is 200 Å TBADN + 2% 4-(di-p-tolylamino)-4′-[(di-p-tolylamino)styryl]stilbene (Blue-green 2) + 0.5% DBP/200 Å Alq + xx % DBP/150 Å Alq | | | | | | | | | | | | | |
| 1500 Å NPB + 1% DBP/EML 200 Å Alq/150 Å Alq | | | | 0.187, 0.271 | | 0.040 | — | 250 (150) | 1,500* | | | 1.7x increase | |

TABLE 3-continued

OLED device data: red, yellow-orange, green, blue-green, blue, and white OLEDs.*,**

| 1st host component (1st hc) | 1st hc dopant % | % | EML thickness, Å | CIE$_x$, CIE$_y$ | Effect on color | Efficiency, W/A | Efficiency effect | Stability, AC, RT, @40 mA/cm² (ref.) T$_{90\%}$, h | T$_{50\%}$, h | Stability, AC, 70° C., @20 mA/cm² (ref.) T$_{90\%}$, h | T$_{50\%}$, h | Stability effect at RT | Stability effect at 70° C. |
|---|---|---|---|---|---|---|---|---|---|---|---|---|---|
| 1500 Å NPB|EML| | | | 200 | 0.174, 0.243 | — | 0.047 | (ref.) | 300 | 1,500* | | | | |
| 200 Å Alq + 0.5% DBP|150 Å Alq | | | 200 | 0.174, 0.249 | — | 0.045 | — | 300 | 1,500* | | | 2x increase | 2x increase |
| 1500 Å NPB|EML| | | | 200 205 | | | | | | | | | | |
| 200 Å Alq + 1.0% DBP|150 Å Alq | | | 200 | 0.178, 0.255 | — | 0.035 | — | 550 | 2,500* | | | 4x increase | |
| 1500 Å NPB + 0.5% DBP|EML| | | | 200 | | | | | | | | | | |
| 200 Å NPB + 0.5% DBP|150 Å Alq | | | 200 | | | | | | | | | | | |

White OLEDs

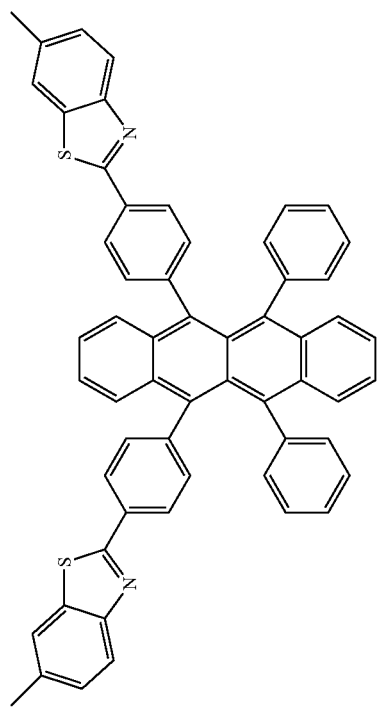

Example 72: 1,300 Å NPB|200 Å NPB + 2% (Orange 2)|200 Å TBADN + 2% 4-(di-p-tolylamino)-4'-[(di-p-tolylamino)styryl]stilbene (Blue-green 2) + x % DBP|350 Å Alq (DBP in blue-green EML)

| Dibenzo[b,k] perylene | 0.5 | 2|2 | 200 | 0.257, 0.328 | small | 0.053 | ~0 | 40 | 550* | | | 1.4x increase | |
| | 1.0 | 2|2 | 200 200 | (0.252, 0.326) 0.277, 0.367 | ~30% less blue | (0.051) 0.050 | ~0 | (35) 45 | (400)* 900* | | | 2.3x increase | |
| | 2.0 | 2|2 | 200 205 | 0.301, 0.425 | 1.7x less blue | 0.046 | −10% | 80 | 1,300 | | | 3.3x increase | |
| | 5.2 | 2|2 | 200 210 | 0.343, 0.504 | 2x less blue | 0.043 | −16% | 150 | 1,700* | | | 4.3x increase | |
| | 9.7 | 2|2 | 200 220 | 0.372, 0.540 | ~no blue | 0.044 | −14% | 200 | ~4,000* | | | 10x increase | |

TABLE 3-continued

OLED device data: red, yellow-orange, green, blue-green, blue, and white OLEDs.*,**

| 1st host component (1st hc) | 1st hc % | dopant % | EML thickness, Å | $CIE_x$, $CIE_y$ | Effect on color | Efficiency, W/A | Efficiency effect | Stability, AC, RT @40 mA/cm² $T_{90\%}$, h $T_{50\%}$, h (ref.) | Stability, AC, 70° C., @20 mA/cm² $T_{90\%}$, h $T_{50\%}$, h (ref.) | Stability effect at RT | Stability effect at 70° C. |
|---|---|---|---|---|---|---|---|---|---|---|---|

Example 73: 1,300 Å NPB|200–250 Å NPB + 2.5% Orange 2 + x % DBP|200 Å TBADN + 2.5% Blue-green 2|350 Å Alq
(DBP in yellow-orange EML)

| Dibenzo[b,k] perylene | 1 | 2.5| 2.5 | 200 200 | 0.384, 0.387 (0.356, 0.374) | 15% less blue | 0.044 (0.045) | (ref.) | ~0 | | 150 (30) | 2,500* (1,000)* | | 2.5x increase |
| | 2.5 | 2.5| 2.5 | 210 200 | 0.439, 0.426 | 3x less blue | 0.044 | ~0 | | 200 | 3,500* | | 3.5x increase |
| | 5 | 2.5| 2.5 | 215| 200 | 0.463, 0.442 | 4x less blue | 0.045 | none | | 170 | ~5,200* | | 5x increase |
| | 10 | 2.4| 2.5 | 225 200 | 0.487, 0.455 | 6.7x less blue | 0.046 | ~0 | | 120 | ~7,000* | | 7x increase |
| | 25 | 2.0| 2.5 | 255| 200 | 0.452, 0.435 | 3.5x less blue | 0.045 | none | | 100 | ~7,000* | | ~7x increase) |

Example 74: 1,300 Å NPB|200 Å NPB + 2% Orange 2 + x % DBP|200 Å TBADN + 2% Blue-green 2 + 0.5% DBP|200 Å Alq + xx % DBP|150 Å Alq (DBP in yellow-orange EML, blue EML, and in ETL; reference cell has no DBP in any layers)

| 200 Å NPB + 0.5% DBP|200 Å TBADN + 2% OP31 + 0.5% DBP|350 Å Alq | | | | 0.359, 0.378 (0.290, 0.334) | ~2x less blue/ more orange | 0.052 (0.048) | +8% | 135 (75) | 1,500* (800)* | | 1.9x increase | |
| 200 Å NPB + 1.0% DBP|200 Å TBADN + 2% OP31 + 0.5% DBP|350 Å Alq | | | | 0.375, 0.391 | ~3.5x less blue | 0.052 | +8% | 150 | 2,000* | | 2.5x increase | |
| 200 Å NPB|200 Å TBADN + 2% OP31 + 0.5% DBP|200 Å Alq + 0.5% DBP|150 Å Alq | | | | 0.322, 0.360 | ~1.6x less blue or more orange | 0.049 | ~0 | 115 | 1,600* | | 2x increase | |
| 200 Å NPB| 200 Å TBADN + 2% OP31 + 0.5% DBPA|200 | Alq + 1.0% DBP|150 Å Alq | | | | 0.332, 0.358 | 1.7x less blue or more orange | 0.047 | ~0 | 120 | 2,000* | | 2.5x increase | |
| 200 Å NPB + 1.0% DBP|200 Å TBADN + 2% OP31 + 0.5% DBP|200 Å Alq + 0.5 % DBP|150 Å Alq | | | | 0.400, 0.421 | ~4x less blue | 0.045 | −6% | 180 | 2,500* | | 3.1x increase | |

TABLE 3-continued

OLED device data: red, yellow-orange, green, blue-green, blue, and white OLEDs.*,**

| 1st host component (1st hc) | 1st hc % | dopant % | EML thickness, Å | CIE$_x$, CIE$_y$ (ref.) | Effect on color | Efficiency, W/A (ref.) | Efficiency effect | Stability, AC, RT, @40 mA/cm² (ref.) T$_{90\%}$, h  T$_{50\%}$, h | | Stability, AC, 70° C., @20 mA/cm² (ref.) T$_{90\%}$, h  T$_{50\%}$, h | | Stability effect at RT | Stability effect at 70° C. |
|---|---|---|---|---|---|---|---|---|---|---|---|---|---|
| Example 75: 1,300 Å NPB|200 Å NPB + 2.5% Orange 2|200 Å TBADN + 2.5% Blue-green 2|200 Å Alq + x % DBP|150 Å Alq (DBP in ETL) | | | | | | | | | | | | | |
| Dibenzo[b,k] perylene | 1–5 | 2.5| 2.5 | 200|200 | 0.467, 0.436 (0.462, 0.433) | small; less blue | 0.039 (0.040) | ~0 | | | 140–300 (85) | ~ 5,500* (2,000)* | | ~3x increase |
| | 10–25 | 2.5|2.5 | 200|200 | 0.457, 0.444 | more green | 0.037 | –8% | | | 200–360 | 6,000–8,000* | | ~4x increase |

Other materials as 1st host components
Red OLEDs
reference cells: 750 Å NPB|300–450 Å Alq + 1–2% DCJTB|300–375 Å Alq
sample cells: 750 Å NPB|varied thickness of Alq + varied % of DCJTB + varied % of the 1st host component|300–375 Å Alq
Example 76: 750 Å NPB|300–420 Å Alq + 0.7–1.0% DCJTB + x % Perylene|300 Å Alq

| Perylene | 9 | 0.9 | 330 | 0.636, 0.358 (0.621, 0.371) | better | 0.038 (0.026) | +46% | 190 (150) | 2,000* (1,300)* | | | 1.5x increase | |
| | 17 | 0.83 | 360 | 0.642, 0.353 | better | 0.050 | +92% | 220 | 2,300* | | | 1.8x increase | |
| | 23 | 0.76 | 390 | 0.642, 0.353 | better | 0.058 | +123% | 270 | 3,000* | | | 2.3x increase | |
| | 29 | 0.71 | 420 | 0.641, 0.354 | better | 0.060 | +131% | | | | | | |

Example 77: 750 Å NPB|390 Å Alq + 0 or 2% DCJTB + 23% Perylene|300 Å Alq

| Perylene | 23 | 1.52 | 390 | 0.665, 0.332 (0.647, 0.349) | better | 0.052 (0.019) | +170% | 180 (165) | 1,800* (1,300)* | | | 1.4x increase | |
| | 23 | 0 | 390 | 0.384, 0.562 (0.329, 0.543) | strong | 0.018 (0.020) | –10% | 900 (60) | 6.00* (1,100)* | | | 6–10x increase | |

TABLE 3-continued

OLED device data: red, yellow-orange, green, blue-green, blue, and white OLEDs.*,**

| 1st host component (1st hc) | 1st hc % | dopant % | EML thickness, Å | CIE$_x$, CIE$_y$ | Effect on color | Efficiency, W/A | Efficiency effect | Stability, AC, RT, @40 mA/cm² (ref.) T$_{90\%}$, h  T$_{50\%}$, h | Stability, AC, 70° C., @20 mA/cm² (ref.) T$_{90\%}$, h  T$_{50\%}$, h | Stability effect at RT | Stability effect at 70° C. |
|---|---|---|---|---|---|---|---|---|---|---|---|

Example 78: 750 Å NPB|390–525 Å Alq + 1–1.5% DCJTB + x % Decacyclene|300 Å Alq

| 23–31 | 1.52–1.38 | | 390–435 | 0.655, 0.342 (0.651, 0.346) | small | 0.018 (0.017) | ~0 | 400 (130) | | | ~3x increase |
| 38–43 | 1.26–1.14 | | 480–525 | 0.654, 0.344 | small | 0.014 | −18% | 450 | | | ~3.5x increase |

Example 79: 750 Å NPB|390–480 Å Alq + 1.4% DCJTB + x % Rubicene|300 Å Alq

| 23 | 1.52 | | 390 | 0.664, 0.332 (0.648, 0.348) | better | 0.007 (0.017) | −60% | 1,000–2,000* (160) | (1,200)* | 10–100x increase | |
| 38 | 1.26 | | 480 | 0.664, 0.331 | better | 0.005 | −70% | 1,000–2,000* | | 10–100x increase | |

Decacyclene

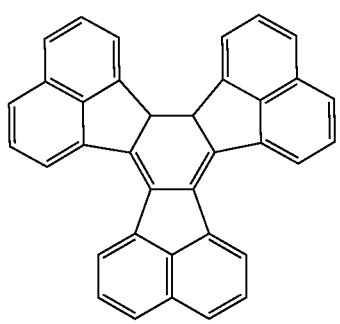

Rubicene

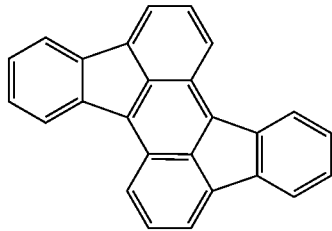

TABLE 3-continued

OLED device data: red, yellow-orange, green, blue-green, blue, and white OLEDs.*,**

| 1st host component (1st hc) | 1st hc % | dopant % | EML thickness, Å | $CIE_x$, $CIE_y$ | Effect on color | Efficiency, W/A | Efficiency effect | Stability, AC, RT, @40 mA/cm² (ref.) $T_{90\%}$, h  $T_{50\%}$, h | Stability, AC, 70° C., @20 mA/cm² (ref.) $T_{90\%}$, h  $T_{50\%}$, h | Stability effect at RT | Stability effect at 70° C. |
|---|---|---|---|---|---|---|---|---|---|---|---|
| *Example 80: 750 Å NPB|360–525 Å Alq + 0.5–1% DCJTB + x % Indeno[1,2,3-cd]perylene|300 Å Alq* ||||||||||||
| Indeno[8,1,2,3-cd]perylene | 17 | 0.83 | 360 | 0.651, 0.346 (0.625, 0.369) | better | 0.017 (0.025) | −32% | 105 (125) ~2,500* 1,200 | | ~2x increase | |
| | 23 | 0.76 | 390 | 0.653, 0.344 | better | 0.015 | −40% | 400 | | ~3x increase | |
| | 31–43 | 0.69– 0.57 | 435– 525 | ~0.659, 0.338 | better | 0.011– 0.006 | −56 to −76% | ~1,100* | | ~9x increase | |
| *Example 81: 750 Å NPB|375 Å Alq + 1% DCJTB + x % Benzo[f]-4,7-diphenylindeno[1,2,3-cd]perylene|375 Å Alq* ||||||||||||
| Benzo[f]-4,7-di phenylindeno[1,2,3-cd]perylene | 10 | 1.0 | 380 | 0.613, 0.381 (0.593, 0.396) | better | 0.019 (0.044) | −57% | 200 (150) | | 1.5x increase | |
| | 20–35 | 1.0 | 380 | 0.627, 0.367 | better | 0.021 | −52% | 1,000* | | 7x increase | |
| | 50–75 | 1.0 | 380 | 0.613, 0.367 | better | 0.014– 0.008 | −68 to −82% | 2,000* | | 15x increase | |
| *Example 82: 750 Å NPB|390 Å Alq + 1.5% DCJTB + x % Dibenzo[a,l]pentacene|300 Å Alq* ||||||||||||
| Dibenzo[a,l] pentacene | 23 | 1.52 | 390 | 0.660, 0.333 (0.650, 0.346) | better | 0.006 (0.019) | −68% | 250 (100) ~4,000* (900)* | | ~3–5x increase | |

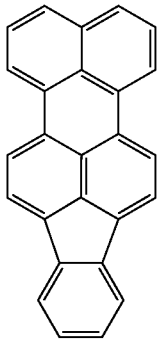

Indeno[8,1,2,3-cd]perylene

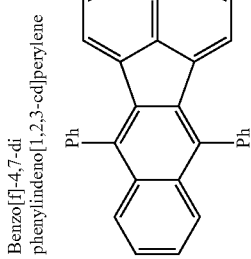

Benzo[f]-4,7-di phenylindeno[1,2,3-cd]perylene

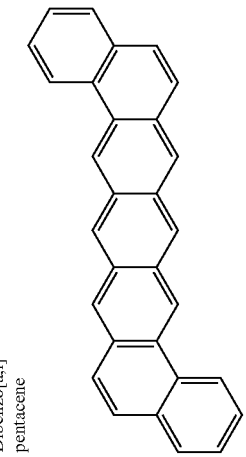

Dibenzo[a,l] pentacene

TABLE 3-continued

OLED device data: red, yellow-orange, green, blue-green, blue, and white OLEDs.*,**

| 1st host component (1st hc) | 1st hc % | dopant % | EML thickness, Å | $CIE_x$, $CIE_y$ (ref.) | Effect on color | Efficiency, W/A (ref.) | Efficiency effect | Stability, AC, RT, @40 mA/cm² (ref.) $T_{90\%}$, h $T_{50\%}$, h | | Stability, AC, 70° C., @20 mA/cm² (ref.) $T_{90\%}$, h $T_{50\%}$, h | | Stability effect at RT | Stability effect at 70° C. |
|---|---|---|---|---|---|---|---|---|---|---|---|---|---|
| Example 83: 750 Å NPB|390–525 Å Alq + 1–1.5% DCJTB + x % Coronene|300 Å Alq ||||||||||||
| Coronene | 23–31 | 1.52–1.38 | 390–435 | 0.647, 0.349 (0.649, 0.348) | small | 0.022 (0.018) | +22% | 200 (90) | 2,250* (950)* | | | 2.5x decrease | |
|  | 38–43 | 1.26–1.14 | 480–525 | 0.646, 0.351 | small | 0.022 | +22% | 300 | 5,000* | | | ~5x decrease | |
| Example 84: 750 Å NPB|300 Å Alq + 0.5–0.8% DCJTB + x % Tetracene|300 Å Alq ||||||||||||
| Tetracene | 10 | 0.83–0.59 | 300 | 0.631, 0.363 (0.617, 0.375) | better | −0.024 (0.024) | 0 | | | | | 3–5x increase | |
| Example 85: 750 Å NPB|300 Å Alq + 1% DCJTB + x % Pentacene|300 Å Alq ||||||||||||
| Pentacene | 0.5 | 1.0 | 300 | 0.642, 0.351 (0.622, 0.370) | better | 0.012 (0.023) | −48% | 195 (210) | 1,700* (1,500)* | | | small | |
|  | 1.0 | 1.0 | 300 | 0.649, 0.345 | better | 0.009 | −61% | 340 | ~3,500* | | | ~2x increase | |
| Example 86: 750 Å NPB|450–600 Å Alq + 1.3–1.7% DCJTB + x % TBP|375 Å Alq ||||||||||||
| TBP | 17 | 1.66 | 450 | 0.642, 0.353 (0.653, 0.344) | worse | 0.037 (0.022) | 70% | 190 (155) | 2,100* (1,300)* | | | 1.6x increase | |
|  | 29 | 1.42 | 525 | 0.634, 0.361 | worse | 0.043 | +95% | 130 | 1,700* | | | 1.3x increase | |
|  | 38 | 1.26 | 600 | 0.622, 0.731 | worse | 0.047 | +114% | 80 | 1,200* | | | small | |

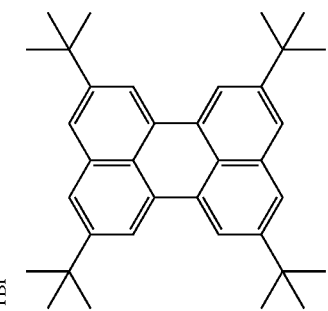

TABLE 3-continued

OLED device data: red, yellow-orange, green, blue-green, blue, and white OLEDs.*,**

| 1st host component (1st hc) | 1st hc % | dopant % | EML thickness, Å | $CIE_x$, $CIE_y$ (ref.) | Effect on color | Efficiency, W/A (ref.) | Efficiency effect | Stability, AC, RT, @40 mA/cm² (ref.) $T_{90\%}$, h / $T_{50\%}$, h | Stability, AC, 70° C., @20 mA/cm² (ref.) $T_{90\%}$, h / $T_{50\%}$, h | Stability effect at RT | Stability effect at 70° C. |
|---|---|---|---|---|---|---|---|---|---|---|---|

Green OLEDs reference cells: 750 Å NPB│375–450 Å Alq + 0.5% C545T or DPQA│300–375 Å Alq
sample cells: 750 Å NPB│varied thickness of Alq + varied % of C545T or DPQA + varied % of the 1st host component│300–375 Å Alq Example 87: 750 Å NPB│450–500 Å Alq + 0.5% C545T + x % Tetracene│300 Å Alq

| Tetracene | 2 | 0.50 | 460 | 0.291, 0.648 (0.292, 0.649) | ~0 | 0.039 (0.058) | −33% | 140 (35) / 2,500* (600) | | 4.2x increase | |
| | 8 | 0.47 | 494 | 0.302, 0.642 | small | 0.036 | −38% | 100 / 2,100 | | 3.5x increase | |

Example 88: 750 Å NPB│490–650 Å Alq + 0.3–0.4% C545T + x % Benzo[ghi]perylene│375 Å Alq

| Benzo[ghi] perylene | 23 | 0.38 | 490 | 0.294, 0.641 (0.292, 0.638) | ~0 | 0.067 (0.059) | +14% | 60 (20) / 850* (490) | | 1.7x increase | |
| | 41 | 0.26 | 656 | 0.294, 0.636 | ~0 | 0.058 | ~0 | 100 / 1,300* | | 2.7x increase | |

Example 89: 750 Å NPB│490–650 Å Alq + 0.3–0.4% C545T + x % Benzo[a]pyrene│375 Å Alq

| Benzo[a]pyrene | 23 | 0.36 | 490 | 0.279, 0.649 (0.283, 0.645) | small | 0.056 (0.058) | −3% | 80 (20) / 1,100* (350) | | 3.2x increase | |
| | 41 | 0.28 | 640 | 0.275, 0.636 | small | 0.042 | −28% | 30 / 740 | | 2.1x increase | |

Example 90: 750 Å NPB│375 Å Alq + 0.5% DPQA + x % Perylene│375 Å Alq

| Perylene | 2 | 0.5 | 385 | 0.311, 0.641 (0.311, 0.644) | ~0 | 0.033 (0.049) | −33% | 300 (85) / (800) | 55–200 (35–90) / 1,700* (690) | 3.5x increase | 2.5x increase |
| | 4 | 0.5 | 393 | 0.312, 0.641 | ~0 | 0.033 | −33% | 390 | 70–210 / 1,800* | 4.6x increase | 2.6x increase |
| | 7, 9 | 0.45 | 405 | 0.315, 0.641 | ~0 | 0.036 | −28% | 500–1,000* | 90–260 / 2,100* | 9x increase | 3x increase |
| | 17 | 0.42 | 455 | 0.322, 0.640 | small | 0.039 | −20% | 1,000–1,500* | 120–370 / 4,000* | ~15x increase | 3–6x increase |

Example 91: 750 Å NPB│450–590 Å Alq + 0.3–0.4% DPQA + x % 9-Phenyl-anthracene│375 Å Alq

| 9-Phenyl-anthracene | 16 | 0.34 | 445 | 0.304, 0.647 (0.304, 0.651) | ~0 | 0.048 (0.058) | −17% | 100 (85) / 1,900* (1,000)* | 35 (35) / 825* (700)* | 1.9x increase | 1.2x increase |
| | 35 | 0.27 | 586 | 0.307, 0.645 | ~0 | 0.049 | −16% | 65 / 1,800* | 35 / 640* | 1.8x increase | small |

TABLE 3-continued

OLED device data: red, yellow-orange, green, blue-green, blue, and white OLEDs.*,**

| 1st host component (1st hc) | 1st hc % | dopant % | EML thickness, Å | CIE$_x$, CIE$_y$ (ref.) | Effect on color | Efficiency, W/A (ref.) | Efficiency effect | Stability, AC, RT @40 mA/cm² (ref.) T$_{90\%}$, h | T$_{50\%}$, h | Stability, AC, 70° C., @20 mA/cm² (ref.) T$_{90\%}$, h | T$_{50\%}$, h | Stability effect at RT | Stability effect at 70° C. |
|---|---|---|---|---|---|---|---|---|---|---|---|---|---|
| *Example 92: 750 Å NPB|490–640 Å Alq + 0.3–0.4% DPQA + x % 9,10-Diphenylanthracene|375 Å Alq* | | | | | | | | | | | | | |
| 9,10-Diphenyl anthracene | 23 | 0.40 | 490 | 0.301, 0.650 (0.308, 0.645) | ~0 | 0.054 (0.052) | +4% | 220 (75) | 2,800* (1,200*) | 80 (25) | 1,400* (630)* | 2.3x increase | 2.2x increase |
| | 41 | 0.31 | 640 | 0.299, 0.648 | ~0 | 0.059 | +14% | 245 | 3,200* | 75 | 1,400* | 2.7x increase | 2.2x increase |
| *Example 93: 750 Å NPB|420–690 Å Alq + 0.3–0.4% DPQA + x % ADN|375 Å Alq* | | | | | | | | | | | | | |
| ADN,9,10-bis(2-naphthyl) anthracene | 9 | 0.43 | 414 | 0.305, 0.651 (0.305, 0.651) | ~0 | 0.047 (0.061) | –23% | 340 (100) | 2,300* (1,000)* | 100 (45) | 1,300* (650)* | 2.3–3.4x increase | 2x increase |
| | 17 | 0.40 | 455 | 0.304, 0.652 | ~0 | 0.053 | –13% | 345 | 2,800* | 120 | 1,300* | 2.8–3.5x increase | 2x increase |
| | 33–45 | 0.33–0.26 | 570–690 | 0.305, 0.650 | ~0 | 0.065 | +7% | 500 | 2,500* | 150 | 1,600–1,900* | 2.5–5x increase | 2.5–3x increase |
| *Example 94: 750 Å NPB|420–710 Å Alq + 0.3–0.5% DPQA + x % TBADN|375 Å Alq* | | | | | | | | | | | | | |
| TBADN,9,10-bis(2-naphthyl) 2-tert-butyl anthracene | 9 | 0.44 | 414 | 0.301, 0.650 (0.304, 0.651) | ~0 | 0.043 (0.059) | –27% | 260 (70) | 2,400* (800*) | 105 (35) | 1,100* (450)* | 3–4x increase | 2.5x increase |
| | 17 | 0.46 | 455 | 0.301, 0.653 | ~0 | 0.049 | –17% | 300 | 3,000* | 95 | 700* | 4x increase | 1.6x increase |
| | 33–47 | 0.35–0.28 | 565–710 | 0.301, 0.652 | ~0 | 0.060 | ~0 | 340–400 | 2,500* | 105–125 | 800–1,100* | 3–5x increase | 1.8–2.5x increase |
| *Example 95: 750 Å NPB|410–670 Å Alq + 0.3–0.4% DPQA + x % 1,3,6,8-Tetraphenylpyrene|375 Å Alq* | | | | | | | | | | | | | |
| 1,3,6,8-Tetra phenylpyrene | 9 | 0.39 | 410 | 0.303, 0.653 (0.312, 0.651) | small | 0.053 (0.052) | ~0 | 145 (70) | 2,000* (1,000*) | 95 (80) | 1,100* (980)* | 2x increase | ~0 |
| | 17 | 0.35 | 450 | 0.299, 0.655 | small | 0.055 | +6% | 145 | 2,500* | 100 | 1,400* | 2.5x increase | 1.4x increase |
| | 29–44 | 0.30–0.26 | 530–670 | 0.295, 0.656 | small | 0.060 | +15% | 130–75 | 2,500–2,000* | 75–90 | 1,200–1,500* | 2–2.5x increase | 1.2–1.5x increase |
| *Example 96: 750 Å NPB|520–630 Å Alq + 0.4% C545T + x % Decacyclene|300 Å Alq* | | | | | | | | | | | | | |
| Decacyclene | 13 | 0.46 | 520 | 0.335, 0.613 (0.286, 0.647) | strong | 0.019 (0.064) | –70% | 155 (30) | 2,000* (500) | | | ~4.5x increase | |
| | 29 | 0.39 | 630 | 0.385, 0.574 | strong | 0.008 | –88% | 400 | | | | ~10x increase | |

TABLE 3-continued

OLED device data: red, yellow-orange, green, blue-green, blue, and white OLEDs.*,**

| 1st host component (1st hc) | 1st hc % | dopant % | EML thickness, Å | CIE$_x$, CIE$_y$ | Effect on color | Efficiency, W/A | Efficiency effect | Stability, AC, RT, @40 mA/cm² (ref.) T$_{90\%}$, h | T$_{50\%}$, h | Stability, AC, 70° C., @20 mA/cm² (ref.) T$_{90\%}$, h | T$_{50\%}$, h | Stability effect at RT | Stability effect at 70° C. |
|---|---|---|---|---|---|---|---|---|---|---|---|---|---|

Example 97: 750 Å NPB│375 Å Alq + 0.5% DPQA + x % TBP│275 Å Alq

| TBP | 2 | 0.5 | 385 | 0.308, 0.638 (0.309, 0.646) | small | 0.032 (0.044) | −27% | 125 (95) | 2,000* (900)* | | | 2.2x increase | |
| | 5–10 | 0.5 | 390 | 0.304, 0.635 | small | 0.027 | −39% | 55–95 | 1,500–2,000* | | | ~2x increase | |
| | 20–50 | 0.5 | 370 | 0.289, 0.639 | bluer | 0.030 | −32% | 60–75 | 1,500* | | | 1.7x increase | |

BlueOLEDs

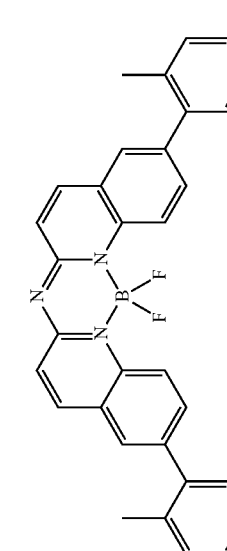

reference cells: 750 Å NPB│200–350 Å TBADN + 1–2% TBP or 0.75% (Blue 2)│350–450 Å Alq
sample cells: 750 Å NPB│varied thickness of TBADN + varied % of TBP or Blue 2 + varied % of the 1st host component│350–450 Å Alq Example 98: 750 Å NPB│260–350 Å TBADN + 1.1–1.6% TBP + x % 9,10-Diphenylanthracene│350 Å Alq

| 9,10-Diphenyl anthracene | 23 | 1.6 | 265 | 0.144, 0.188 (0.142, 0.183) | ~0 | 0.042 (0.044) | none | 130 (95) | 1,350* (890)* | 50–125 (50) | 920* (600) | 1.5x increase | 1.5x increase |
| | 41 | 1.1 | 345 | 0.144, 0.188 | ~0 | 0.044 | none | 190 | 1,850* | 60 | 850* | 2.1x increase | 1.4x increase |

Example 99: 750 Å NPB│330 Å TBADN + 2% TBP + x % Benzo[a]pyrene│450 Å Alq

| Benzo[a]pyrene | 5 | 2.0 | 320 | 0.160, 0.253 (0.152, 0.228) | worse | 0.037 (0.041) | −10% | 65 (60) | 675 (500)* | | | 1.4x increase | |
| | 9 | 1.8 | 340 | 0.166, 0.270 | worse | 0.036 | −12% | 95 | 780 | | | 1.6x increase | |

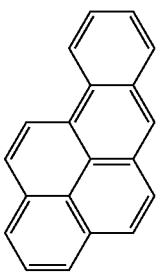

TABLE 3-continued

OLED device data: red, yellow-orange, green, blue-green, blue, and white OLEDs.*,**

| 1st host component (1st hc) | 1st hc % | dopant % | EML thickness, Å | $CIE_x$, $CIE_y$ | Effect on color | Efficiency, W/A | Efficiency effect | Stability, AC, RT @40 mA/cm² (ref.) $T_{90\%}$, h | $T_{50\%}$, h | Stability, AC, 70° C., @20 mA/cm² (ref.) $T_{90\%}$, h | $T_{50\%}$, h | Stability effect at RT | Stability effect at 70° C. |
|---|---|---|---|---|---|---|---|---|---|---|---|---|---|
| Example 100: 750 Å NPB330–400 Å TBADN + 1.5–2% TBP + x % Benzo[ghi]perylene450 Å Alq | | | | | | | | | | | | | |
| Benzo[ghi]perylene | 9 | 1.8 | 335 | 0.151, 0.244 (0.145, 0.214) | worse than ref. red edge is up | 0.042 (0.044) | none | 60 (45) | 360 (280) | | | 1.3x increase | |
| | 23 | 1.5 | 395 | 0.162, 0.281 | | 0.040 | −10% | 75 | 550 | | | 2x increase | |
| Example 101: 750 Å NPB350 Å TBADN + 1% CuPc400 Å Alq | | | | | | | | | | | | | |
| CuPc | 0.1, 0.2 | 1.0 | 350 | 0.147, 0.224 (0.145, 0.212) | small | −0.036 (0.042) | −10 to −20% | | | 135 (35) | 450 (340) | | 1.3x increase |
| | 0.4, 0.8 | 1.0 | 350 | 0.185, 0.300 | TBP + Alq | 0.010 | −67 to −83% | | | 60 | 1,700* | | 5x increase |
| Example 102: 750 Å NPB330–400 Å TBADN + 1.5–2% TBP + x % Coronene450 Å Alq | | | | | | | | | | | | | |
| Coronene | 9 | 1.8 | 335 | 0.150, 0.247 (0.148, 0.235) | slightly worse worse than ref. | 0.037 (0.039) | none | 100 (100) | 450 (450) | | | none | |
| | 23 | 1.6 | 395 | 0.179, 0.139 | | 0.030 | −23% | 100 | 570 | | | 1.4x increase | |

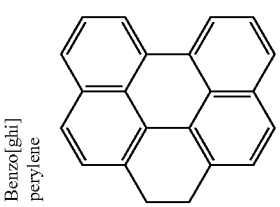

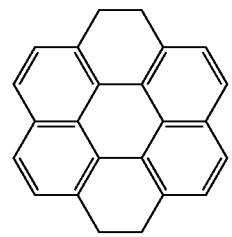

TABLE 3-continued

OLED device data: red, yellow-orange, green, blue-green, blue, and white OLEDs.*,**

| 1st host component (1st hc) | 1st hc % | dopant % | EML thickness, Å | $CIE_x$, $CIE_y$ | Effect on color | Efficiency, W/A | Efficiency effect | Stability, AC, RT, @40 mA/cm² (ref.) $T_{90\%}$, h  $T_{50\%}$, h | Stability, AC, 70° C., @20 mA/cm² (ref.) $T_{90\%}$, h  $T_{50\%}$, h | Stability effect at RT | Stability effect at 70° C. |
|---|---|---|---|---|---|---|---|---|---|---|---|
| | | | | (ref.) | | (ref.) | | | | | |

Example 103: 750 Å NPB|330–400 Å TBADN + 1.5–2% TBP + Perylene|450 Å Alq

| Perylene | 9 | 1.8 | 330 | 0.269, 0.491 (0.146, 0.226) | green | 0.028 (0.043) | −35% | 220 (105) | | 2x increase | |
| | 23 | 1.6 | 395 | 0.336, 0.570 | green | 0.025 | −42% | 420 | | 4.3x increase | |

Example 104: 750 Å NPB|330–400 Å TBADN + 1.5–2% TBP + x % Peropene|450 Å Alq

| | 9, 23 | 1.8–1.6 | 330–400 | ~0.480, ~0.510 (0.150, 0.214) | yellow EL | 0.030 (0.038) | −20 to −30% | | | 10x increase | |

Example 105: 750 Å NPB|320 Å TBADN + 2% TBP + x % Dibenzo[a,h]pyrene|450 Å Alq

| Dibenzo[a,h] pyrene | 2 | 1.9 | 315 | 0.242, 0.434 (0.146, 0.277) | greenish | 0.021 (0.043) | −50% | 100 (200) | ~1,700* (800) | 2x increase | |
| | 5 | 1.9 | 320 | 0.310, 0.532 | green | 0.017 | −60% | 100 | ~3,500 | 4.5x increase | |

Example 106: 750 Å NPB|300 Å TBADN + 2% TBP + x % Pentacene| 450 Å Alq

| Pentacene | 0.2 | 2.0 | 310 | 0.275, 0.310 (0145, 0.222) | white EL | 0.022 (0.043) | −50% | 330 (130) | (950) | 2.5x increase | |

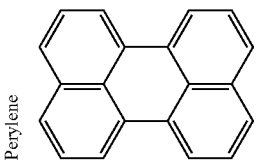

Perylene

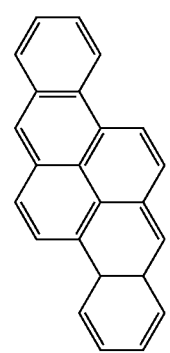

Dibenzo[a,h]pyrene

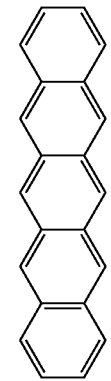

Pentacene

TABLE 3-continued

OLED device data: red, yellow-orange, green, blue-green, blue, and white OLEDs.*,**

| 1st host component (1st hc) | 1st hc % | % dopant | EML thickness, Å | CIE$_x$, CIE$_y$ | Effect on color | Efficiency, W/A | Efficiency effect | Stability, AC, RT, @40 mA/cm² (ref.) T$_{90\%}$, h T$_{50\%}$, h | Stability, AC, 70° C., @20 mA/cm² (ref.) T$_{90\%}$, h T$_{50\%}$, h | Stability effect at RT | Stability effect at 70° C. |
|---|---|---|---|---|---|---|---|---|---|---|---|

Example 107: 750 Å NPB|240–300 Å TBADN + 1.5% TBP + x % 9-Phenylanthracene|350 Å Alq

| 9-Phenylanthracene | 17, 13 | 1.66–1.34 | 240–305 | 0.142, 0.187 (0.142, 0.182) | ~0 | 0.041 (0.041) | none | 450 (380) | | 1.2x increase | |

Example 108: 750 Å NPB|360 Å TBADN + 1% TBP + x % Decacyclene|400 Å Alq

| Decacyclene | 0.2 | 1.0 | 355 | 0.170, 0.297 (0.142, 0.196) | green-blue | 0.032 (0.046) | −30% | | 45–130 800* (20–95) (400) | | 2x increase |
| | 5 | 1.0 | 370 | 0.283, 0.531 | green | 0.013 | −70% | | 50–400 ~3,500* | | 9x increase |

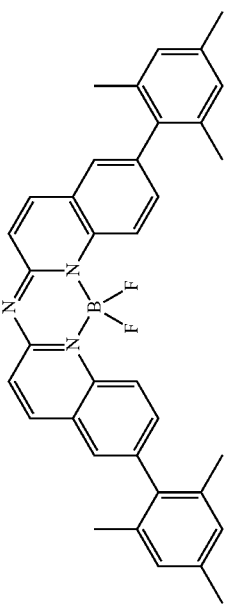

Example 109: 750 Å NPB|200 Å TBADN + 0.75% (Blue 2) + x % Decacyclene|350 Å Alq

| Decacyclene | 0.1 | 0.75 | 200 | 0.167, 0.225 (0.146, 0.126) | worse | 0.035 (0.055) | −36% | | 60 500 (30) (330) | | 1.5x increase |
| | 2 | 0.75 | 205 | 0.228, 0.442 | green-blue | 0.019 | −51% | | 100 1,500* | | 4.5x increase |

Decacyclene

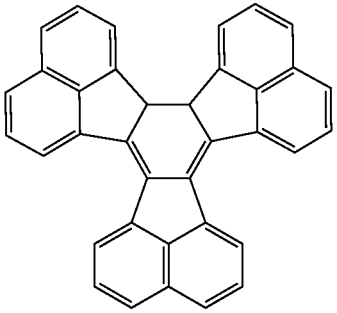

TABLE 3-continued

OLED device data: red, yellow-orange, green, blue-green, blue, and white OLEDs.*,**

| 1st host component (1st hc) | % 1st hc | % dopant | EML thickness, Å | $CIE_x$, $CIE_y$ | Effect on color | Efficiency, W/A | Efficiency effect | Stability, AC, RT @40 mA/cm² $T_{90\%}$, h (ref.) | $T_{50\%}$, h | Stability, AC, 70° C., @20 mA/cm² (ref.) $T_{90\%}$, h | $T_{50\%}$, h | Stability effect at RT | Stability effect at 70° C. |
|---|---|---|---|---|---|---|---|---|---|---|---|---|---|
| | colspan=13 | | | | | | | | | | | | |

Example 110: 750 Å NPB|200–230 Å TBADN + 0.75% Blue 2 + x % Benzo[e]pyrene|350 Å Alq

| Benzo[e]pyrene | 2–6 | 0.75– 0.70 | 210 | 0.148, 0.133 (0.148, 0.132) | ~0 | 0.055 (0.054) | 0 | 145 (100) | 850* (700)* | | | 1.2x increase | |
| | 8 | 0.65 | 230 | 0.148, 0.134 | ~0 | 0.049 | −10% | 190 | 950* | | | 1.4x increase | |

Example 111: 750 Å NPB|200 Å TBADN + 0.75% Blue 2 + x % CuPc|350 Å Alq

| CuPc | 0.1 | 0.75 | 200 | 0.149, 0.129 (0.149, 0.126) | ~0 | 0.043 (0.047) | −9% | | | 30 (15) | 330 (260) | | 1.3x increase |
| | 0.2–2 | 0.75 | 205 | 0.160–0.229, 0.153–0.316 | worse | 0.022– 0.004 | −53 to −91% | | | 50–125 | 700– 3,000* | | 2.7–12x increase |

Example 112: 750 Å NPB|220–380 Å TBADN + 0.4–0.7% Blue 2 + x % 1,3,5-Tris(6-cyanonaphth-2-yl)benzene|350 Å Alq

| 1,3,5-Tris(6-cyanonaphth-2-yl) benzene | 9 | 0.68 | 220 | 0.156, 0.160 (0.150, 0.140) | small | 0.035 (0.052) | −30% | 160 (100) | 1,700* (1,000)* | | | 1.7x increase | |
| | 23–47 | 0.59– 0.40 | 260– 385 | 0.191–0.264, 0.242–0.413 | strong | 0.014– 0.008 | −75 to −85% | 120–140 | 1,500– 1,900* | | | 1.5–1.9x increase | |

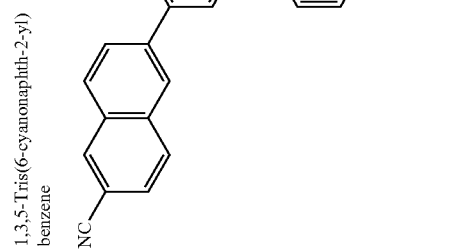

Example 113: 750 Å NPB|450–530 Å TBADN + 0.5% C545T + x % Naphtho[2,3-a]pyrene|300 Å Alq (reference cell has no NP)

| Naphtho[2,3-a] pyrene | 2 | 0.5 | 465 | 0.238, 0.560 (0.215, 0.550) | small | 0.029 (0.047) | −38% | 240 (115) | 2,100* (750) | | | 2.8x increase | |
| | 4 | 0.48 | 475 | 0.306, 0.568 | better | 0.026 | −45% | 310 | 4,000* | | | 5.3x increase | |

TABLE 3-continued

OLED device data: red, yellow-orange, green, blue-green, blue, and white OLEDs.*,**

| 1st host component (1st hc) | % 1st hc | % dopant | EML thickness, Å | CIE$_x$, CIE$_y$ (ref.) | Effect on color | Efficiency, W/A (ref.) | Efficiency effect | Stability, AC, RT, @40 mA/cm² (ref.) T$_{90\%}$, h T$_{50\%}$, h | Stability, AC, 70° C., @20 mA/cm² (ref.) T$_{90\%}$, h T$_{50\%}$, h | Stability effect at RT | Stability effect at 70° C. |
|---|---|---|---|---|---|---|---|---|---|---|---|
| | 8 | 0.49 | 490 | 0.337, 0.565 (ref.) | red edge is up | 0.025 (ref.) | −47% | 335   5,500* | | 7.3x increase | |
| | 13 | 0.45 | 530 | 0.417, 0.543 | strong | 0.026 | −45% | 290   7,000* | | 9.3x increase | |

Example 114: 750 Å NPB 250 Å TBADN + 0.5% CFDMQA + x % mixture of dibenzo[b,k]perylene & dibenzo[b,h]perylene 350 Å Alq

| Mixture of dibenzo[b,k]- & dibenzo[b,h] perylene | 0.25–1 | 0.5 | 255 | 0.285, 0.570 (0.263, 0.568) | better | 0.036 (0.037) | ~0 | 50   1,250* (25)  (550) | 20  700 (10) (270) | 2.3x increase 1.5x increase | 12.6x increase 3.5x increase |
| | 4–8 | 0.5–0.47 | 265 | 0.315, 0.600 | red edge is up | 0.033 | −11% | 10   800* | 15   950 | | |

Example 115: 750 Å NPB 320–425 Å TBADN + 0.7–1% DCJTB + x % Naphtho[2,3-a]pyrene 300 Å Alq (reference cell has no NP)

| Naphtho[2,3-a] pyrene | 5 | 0.9 | 320 | 0.517, 0.463 (0.510, 0.459) | better | 0.019 (0.031) | −39% | 455   2,800* (90)  (1,000)* | 60   1,200* (15)  (600) | 2.8x increase | 2x increase |
| | 9 | 0.88 | 335 | 0.535, 0.454 | better | 0.024 | −23% | 335   3,000* | 35   780 | 3x increase | 1.3x increase |
| | 17 | 0.80 | 365 | 0.549, 0.443 | better | 0.030 | ~0 | 165   1,900* | 10   210 | 1.9x increase | 3x increase |

[Chemical structure: a polycyclic aromatic compound with four Ph substituents]

Example 116: 750 Å NPB 200–270 Å TBADN + 0.4–0.7% + x % Naphthol[2,3-a]pyrene 550 Å Alq (reference cell has no NP)

| Naphtho[2,3-a] pyrene | 5–9 | 0.71–0.58 | 210–225 | 0.490, 0.440 (0.448, 0.369) | better | 0.025 (0.028) | −11% | | 30–55 (40)* | 1,500 (1,100) | 1.4x increase |
| | 13–17 | 0.47 | 240 | 0.530, 0.427 | better | 0.027 | ~0 | | 40 | ~2,000* | 1.8x increase |

*fitted values; lifetimes were measured at average AC current density of 40 mA/cm² (0.5 ms forward bias at 80 mA/cm² alternating with the 0.5 ms of reverse bias of −14 V) and at room temperature and the same way at 20 mA/cm² and 70° C.; fitted T$_{50\%}$'s are predicted values using stretched exponential fit procedure: the devices were run for some time, e.g. 250–2000 hours, after which time the aging was stopped and a plot of luminance versus time was fitted with stretched exponential function of the following form: L$_t$ = L$_0$ × exp(A × t$^B$), where L$_t$ is luminance at time t, L$_0$ is initial luminance, A and B are empirical fit parameters, often found to be in the range of −0.011 and 0.59, respectively; half-lifetimes, T$_{50\%}$, were found by calculating time at*which L$_t$/L$_0$ = 0.5; for 70° C.-20 mA/cm² stability data, T$_{50\%}$ sometimes represent actually measured values; 2x extrapolation works well, namely, fitted T$_{50\%}$ values usually agree very well the actually measured ones when measured decay curve (used for fitting) reaches at least 75% of initial EL;
**the data are given at 20 mA/cm² unless noted otherwise; Alq = AlQ = AlQ$_3$; EML(emitting layer) = LEL(light-emitting layer) = luminescent layer.

TABLE 4

Device data: dibenzo[b,k]perylene (DBP) as a 1st host component for red and green OLEDs - various aging conditions.*, ** reference cells: 750 Å NPB|300 Å Alq + 1–2% DCJTB|300 Å Alq
sample cells: 750 Å NPB|varied thickness of Alq + varied % of DCJTB + varied % of DBP|300 Å Alq Example 47: 750 Å NPB|EML|300 Å Alq

| Cell | | A | B | C | D | E | F |
|---|---|---|---|---|---|---|---|
| EML | | 300 Å Alq + 2% DCJTB | 300 Å Alq + 2% DCJTB | 390 Å Alq + 1.5% DCJTB + 23% DBP | 435 Å Alq + 1.4% DCJTB + 31% DBP | 480 Å Alq + 1.3% DCJTB + 38% DBP | 525 Å Alq + 1.1% DCJTB + 43% DBP |
| AC-50% dc, 1 MHz, −14 V rb, RT, average J = 40 mA/cm$^2$; fresh cells | $T_{90\%}$, h | 120 | 120 | 800 | 750 | 900 | 500 |
| | $T_{50\%}$, h | 1,000* | 1,000* | | | | |
| | Effect | | | 6.7x increase | 6.3x increase | 7.5x increase | 4.2x increase |
| AC-50% dc, 1 MHz, −14 V rb, 70° C., average J = 20 mA/cm$^2$; fresh cells | $T_{90\%}$, h | 30 | 30 | 125 | 140 | 145 | 45 |
| | $T_{50\%}$, h | 475 | 475 | 3,000* | 3,000* | 3,500* | 550 |
| | Effect | | | 4–6x increase | 5–6x increase | 6–8x increase | none |
| AC-50% dc, 1 MHz, −14 V rb, 70° C., average J = 20 mA/cm$^2$; cells annealed at 70° C. for 500 h | $T_{90\%}$, h | 40 | 40 | 190 | 200 | 245 | 50 |
| | $T_{50\%}$, h | 500 | 500 | 3,000* | 3,000* | 4,000* | 500 |
| | Effect | | | 4–6x increase | 5–6x increase | 6–8x increase | none |
| DC-100% duty cycle, RT, 40 mA/cm$^2$; cells annealed at 70° C. for 850 h | $T_{90\%}$, h | 120 | 100 | 270 | 250 | 290 | 220 |
| | $T_{50\%}$, h | 2,200* | 1,600 | 13,000* | 13,000* | 21,000* | 10,000* |
| | Effect | | | 7x increase | 7x increase | 11x increase | 5x increase |

Example 48: 750 Å NPB|EML|300 Å Alq

| Cell | | A | B | C | D | E | F |
|---|---|---|---|---|---|---|---|
| EML | | 450 Å Alq + 1.34% DCJTB + 33% DBP | 450 Å Alq + 1.34% DCJTB + 33% DBP | 390 Å Alq + 0.76% DCJTB + 23% DBP | 435 Å Alq + 0.69% DCJTB + 31% DBP | 480 Å Alq + 0.63% DCJTB + 38% DBP | 525 Å Alq + 0.57% DCJTB + 43% DBP |
| AC-50% dc, 1 MHz, −14 V rb, RT, average J = 40 mA/cm$^2$; fresh cells | $T_{90\%}$, h | 640 | 640 | 540 | 620 | 730 | 720 |
| | $T_{50\%}$, h | | | | | | |
| | Effect | ~6x increase | ~6x increase | ~5x increase | ~6x increase | ~7x increase | ~7x increase |
| DC-100% duty cycle, RT, 40 mA/cm$^2$; fresh cells | $T_{90\%}$, h | 90 | | | | | |
| | $T_{50\%}$, h | 18,000* | | | | | |
| | Effect | ~10x increase | | | | | |

TABLE 4-continued

Device data: dibenzo[b,k]perylene (DBP) as a 1st host component for red and green OLEDs - various aging conditions.*, **

Example 49: 750 Å NPB|EML|300 Å Alq (all 6 cells have the same geometry)

| Cell | | A | B | C | D | E | F |
|---|---|---|---|---|---|---|---|
| EML | | | | 450 Å Alq + 0.67% DCJTB + 33% DBP | | | |
| AC-50% dc, 1 MHz, −14 V rb, RT, average J = 40 mA/cm²; fresh cells | $T_{90\%}$, h $T_{50\%}$, h Effect | | | 900* ~9x increase | | | |
| DC-100% duty cycle, RT, 40 mA/cm²; fresh cells | $T_{90\%}$, h $T_{50\%}$, h Effect | 35 8,000* ~5–10x increase | | | | | | reference cells: 750 Å NPB|375 Å Alq + 0.3–0.5% DPQA|375 Å Alq
sample cells: 750 Å NPB|varied thickness of Alq + varied % of DPQA + varied % of DBP|375 Å Alq
Example 61: 750 Å NPB|EML|375 Å Alq

| Cell | | A | B | C | D | E | F |
|---|---|---|---|---|---|---|---|
| EML | | 375 Å Alq + 0.56% DPQA | 375 Å Alq + 0.53% DPQA | 410 Å Alq + 0.44% DPQA + 9% DBP | 450 Å Alq + 0.41% DPQA + 17% DBP | 525 Å Alq + 0.35% DPQA + 29% DBP | 610 Å Alq + 0.28% DPQA + 41% DBP |
| AC-50% dc, 1 MHz, −14 V rb, RT, average J = 40 mA/cm²; fresh cells | $T_{90\%}$, h $T_{50\%}$, h Effect | 65 800 | 65 800 | 700 11x increase | 740 ~11x increase | 1,000 10,000–25,000* ~13x increase | 1,000 ~13x increase |
| AC-50% dc, 1 MHz, −14 V rb, 70° C., average J = 20 mA/cm²; fresh cells | $T_{90\%}$, h $T_{50\%}$, h Effect | 35 650 | 35 650 | 180 5,000* ~8x increase | 430 | 430 5,000–20,000* ~15x increase | 340 |
| AC-50% dc, 1 MHz, −14 V rb, 70° C., average J = 20 mA/cm²; cells annealed at 70° C. for 500 h | $T_{90\%}$, h $T_{50\%}$, h Effect | 75 700 | 75 700 | 430 3,000* 4.5x increase | 660 | 1,000* 5,000–10,000* ~7x increase | 920* |
| DC-100% duty cycle, RT, 40 mA/cm²; cells annealed at 70° C. for 850 h | $T_{90\%}$, h $T_{50\%}$, h Effect | 25 1,300 | 20 1,200 | 125 11,000* 9x increase | 110 13,000* 10.5x increase | 80 17,000* 14x increase | 70 14,000* 11x increase |

TABLE 4-continued

Device data: dibenzo[b,k]perylene (DBP) as a 1st host component for red and green OLEDs - various aging conditions.*, **

Example 63: 750 Å NPB|EML|375 Å Alq

| Cell | | A | B | C | D | E | F |
|---|---|---|---|---|---|---|---|
| EML | | | | | 450 Å Alq + 0.38% DPQA + 16% DBP | | |
| AC-50% dc, | $T_{90\%}$, h | | | | 970* | | |
| 1 MHz, −14 V | $T_{50\%}$, h | | | | 7,000–25,000* | | |
| rb, RT, | Effect | | | | ~9x increase | | |
| average | | | | | | | |
| J = 40 | | | | | | | |
| mA/cm²; | | | | | | | |
| fresh cells | | | | | | | |
| DC- | $T_{90\%}$, h | 15 | | | | | |
| 100% duty | $T_{50\%}$, h | 10,000* | | | | | |
| cycle, RT, | Effect | ~10x increase | | | | | |
| 40 mA/cm²; | | | | | | | |
| fresh cells | | | | | | | |

*fitted values; lifetimes were measured at average AC current density of 40 mA/cm² (0.5 ms forward bias at 80 mA/cm² alternating with the 0.5 ms of reverse bias of −14 V) and at room temperature and the same way at 20 mA/cm² and 70° C.; fitted $T_{50\%}$'s are predicted values using stretched exponential fit procedure: the devices were run for some time, e.g. 250–1000 hours, after which time the agingwas stopped and a plot of luminance versus time was fitted with stretched exponential function of the following form: $L_t = L_0 \times \exp(A \times t^B)$, where $L_t$ is luminance at time t, $L_0$ is initial luminance, A and B are empirical fit parameters, found to be in the range of −0.011 and 0.59, respectively; half-lifetimes, $T_{50\%}$, were found by calculating time at which $L_t/L_0 = 0.5$; for 60–80° C.-20 mA/cm² stability data, $T_{50\%}$ sometimes represent actually measured values; 2x extrapolation works well: that is, fitted $T_{50\%}$ values usually agree very well with the actually measured ones when measured decay curve (used for fitting) reaches at least 75% of initial EL;
**the data are given at 20 mA/cm² unless noted otherwise; OC - open circuit; DC - direct current; dc - duty cycle; rb - reverse bias; RT - room temperature.

The invention has been described in detail with particular reference to certain preferred embodiments thereof, but it will be understood that variations and modifications can be effected within the spirit and scope of the invention.

PARTS LIST 10 electrical conductors
100 OLED device
110 substrate
120 anode
130 EL medium
140 cathode
200 OLED device
210 substrate
220 anode
230 EL medium
231 hole-transport layer
232 luminescent layer
233 electron-transport layer
240 cathode
300 OLED device
310 substrate
320 anode
330 EL medium
331 hole-injection layer
332 hole-transport layer
333 luminescent layer
334 electron-transport layer
335 electron-injection layer
340 cathode

What is claimed:

1. An organic light-emitting device, comprising:
   a) a substrate;
   b) an anode and a cathode disposed over the substrate;
   c) a luminescent layer disposed between the anode and the cathode wherein the luminescent layer includes a host and at least one dopant;
   d) the host of the luminescent layer being selected to include a solid organic material comprising a mixture of at least two components wherein:
      i) the first component of the mixture is an organic compound that is capable of transporting either electrons or holes or both and is capable of forming both monomer state and an aggregate state and further is capable of forming the aggregate state either in the ground electronic state or in the excited electronic state that results in a different absorption or emission spectrum or both relative to the absorption or emission spectrum or both of the monomer state, respectively, or the first component of the mixture is capable of forming the aggregate state whose presence results in a quantum yield of luminescence of the monomer state being different relative to the quantum yield of luminescence of the monomer state in the absence of the aggregate state, and
      ii) the second component of the mixture is an organic compound that upon mixing with the first host component is capable of forming a continuous and substantially pin-hole-free layer;
      iii) both the first and second components being selected to transfer excitation energy to the dopant so that the dopant produces light while the first and second components produce no light in the presence of the dopant; and
   e) the dopant of the luminescent layer being selected to produce light from the light-emitting device.

2. The organic light-emitting device of claim 1 wherein the aggregate state is a dimer in either ground electronic state or excited electronic state.

3. The organic light-emitting device of claim 1 wherein the aggregate state is crystalline.

4. The organic light-emitting device of claim 3 wherein the aggregate state is a microcrystalline or nanocrystalline domain.

5. The organic light-emitting device of claim 1 wherein the first component is an organic compound that is nonpolar.

6. The organic light-emitting device of claim 1 wherein the first component is an organic compound that includes a benzenoid hydrocarbon.

7. The organic light-emitting device of claim 1 wherein the first component is an organic compound that includes a heterocycle.

8. The organic light-emitting device of claim 1 wherein the second component is an organic compound that is more polar than the first component.

9. The organic light-emitting device of claim 1 wherein the first component is an organic compound having an energy gap greater than 1.5 electron volts.

10. The organic light-emitting device of claim 1 wherein the second component is an organic compound having an energy gap greater than 1.5 electron volts.

11. The organic light-emitting device of claim 1 wherein the first component constitutes at least 1 volume % of the luminescent layer.

12. The organic light-emitting device of claim 1 wherein the second component constitutes at least 1 volume % of the luminescent layer.

13. The organic light-emitting device of claim 1 wherein the dopant has an energy gap less than or equal to those of the first component and the second component.

14. The organic light-emitting device of claim 1 wherein the dopant is a fluorescent dye.

15. The organic light-emitting device of claim 1 wherein the dopant is a phosphorescent dye.

16. The organic light-emitting device of claim 1 wherein the dopant concentration in the luminescent layer is between 0 and 10% by volume.

17. The organic light-emitting device of claim 1 wherein the first component is pyrene or a derivative thereof.

18. The organic light-emitting device of claim 1 wherein the first component is a benzopyrene or a derivative thereof.

19. The organic light-emitting device of claim 1 wherein the first component is a naphthopyrene or a derivative thereof.

20. The organic light-emitting device of claim 1 wherein the first component is naphthacene or a derivative thereof.

21. The organic light-emitting device of claim 1 wherein the first component is pentacene or a derivative thereof.

22. The organic light-emitting device of claim 1 wherein the first component is perylene or a derivative thereof.

23. The organic light-emitting device of claim 1 wherein the first component is fluoranthene or a derivative thereof.

24. The organic light-emitting device of claim 1 wherein the first component is anthracene or a derivative thereof.

25. The organic light-emitting device of claim 1 wherein the first component is anthanthrene or a derivative thereof.

26. The organic light-emitting device of claim 1 wherein the first component is benzo[ghi]perylene or a derivative thereof.

27. The organic light-emitting device of claim 1 wherein the first component is coronene or a derivative thereof.

28. The organic light-emitting device of claim 1 wherein the first component is dibenzo[cd,lm]perylene (peropyrene) or a derivative thereof.

29. The organic light-emitting device of claim 1 wherein the first component is rubicene or a derivative thereof.

30. The organic light-emitting device of claim 1 wherein the first component is chrysene or a derivative thereof.

31. The organic light-emitting device of claim 1 wherein the first component is phenanthrene or a derivative thereof.

32. The organic light-emitting device of claim 1 wherein the first component is pyranthrene or a derivative thereof.

33. The organic light-emitting device of claim 1 wherein the first component is a dibenzopyrene or a derivative thereof.

34. The organic light-emitting device of claim 1 wherein the first component is benzoperylene or a derivative thereof.

35. The organic light-emitting device of claim 1 wherein the first component is a dibenzoperylene or a derivative thereof.

36. The organic light-emitting device of claim 1 wherein the first component is tetraphene or a derivative thereof.

37. The organic light-emitting device of claim 1 wherein the first component is pentaphene or a derivative thereof.

38. The organic light-emitting device of claim 1 wherein the first component is hexaphene or a derivative thereof.

39. The organic light-emitting device of claim 1 wherein the first component is hexacene or a derivative thereof.

40. The organic light-emitting device of claim 1 wherein the first component is triphenylene or a derivative thereof.

41. The organic light-emitting device of claim 1 wherein the first component is a benzotriphenylene or a derivative thereof.

42. The organic light-emitting device of claim 1 wherein the first component is benzo[a]coronene or dibenzocoronene or tribenzocoronene or tetrabenzocoronene or pentabenzocoronene or hexabenzocoronene or a derivative thereof.

43. The organic light-emitting device of claim 1 wherein the first component is picene or a derivative thereof.

44. The organic light-emitting device of claim 1 wherein the first component is fluorene or a derivative thereof.

45. The organic light-emitting device of claim 1 wherein the first component is a naphthoperylene or dinaphthoperylene or a derivative thereof.

46. The organic light-emitting device of claim 1 wherein the first component is a PAH compound that can be drawn using only frilly aromatic benzene rings so as to form graphite-like segments or a derivative thereof.

47. The organic light-emitting device of claim 1 wherein the first component includes a benzenoid hydrocarbon or a derivative thereof substituted with a donor or an acceptor moiety or both.

48. The organic light-emitting device of claim 1 wherein the second component includes a benzenoid hydrocarbon or a derivative thereof substituted with a donor or an acceptor moiety or both.

49. The organic light-emitting device of claim 1 wherein the second component includes an oxinoid compound.

50. The organic light-emitting device of claim 49 wherein the second component includes $AlQ_3$.

51. The organic light-emitting device of claim 1 wherein the second component includes an anthracene moiety.

52. The organic light-emitting device of claim 51 wherein the second component includes:
2-(1,1 -dimethylethyl)-9,10-bis(2-naphthalenyl)anthracene (TBADN),
9,10-bis(2-naphthalenyl)anthracene (ADN),
9,10-bis(1-naphthalenyl)anthracene,
9,10-Bis[4-(2,2-diphenylethenyl)phenyl]anthracene,
9,10-Bis([1,1':3',1"-terphenyl]-5'-yl)anthracene,
9,9'-Bianthracene,
10,10'-Diphenyl-9,9'-bianthracene,
10,10'-Bis([1,1':3',1"-terphenyl]-5'-yl)-9,9'-bianthracene,
2,2'-Bianthracene,
9,9',10,10'-Tetraphenyl-2,2'-bianthracene,
9,10-Bis(2-phenylethenyl)anthracene, or
9-Phenyl-10-(phenylethynyl)anthracene.

53. The organic light-emitting device of claim 1 wherein the second component includes an amine moiety.

54. The organic light-emitting device of claim 53 wherein the second component includes:
N,N'-bis(1-naphthalenyl)-N,N'-diphenylbenzidine (NPB),
N,N'-bis(1-naphthalenyl)-N,N'-bis(2-naphthalenyl)benzidine (TNB),
N,N'-bis(3-methylphenyl)-N,N'-diphenylbenzidine (TPD), or
N,N'-Bis(N'',N'''-diphenylaminonaphthalen-5-yl)-N,N'-diphenyl-1,5-diaminonaphthalene (CAS 503624-47-3).

55. The organic light-emitting device of claim 1 wherein the second component includes a fluorene moiety.

56. The organic light-emitting device of claim 55 wherein the second component includes:
2,2',7,7'-Tetraphenyl-9,9'-spirobi[9H-fluorene],
2,2',7,7'-Tetra-2-phenanthrenyl-9,9'-spirobi[9H-fluorene],
2,2'-Bis(4-N,N-diphenylaminophenyl)-9,9'-spirobi[9H-fluorene], (CAS 503307-40-2),
4'-Phenyl-spiro[fluorene-9,6'-[6H]indeno[1,2-j]fluoranthene],
2,3,4-Triphenyl-9,9'-spirobifluorene,
11,11'-Spirobi[11H-benzo[b]fluorene],
9,9'-Spirobi[9H-fluorene]-2,2'-diamine,
9,9'-Spirobi[9H-fluorene]-2,2'-dicarbonitrile,
2',7'-Bis([1,1'-biphenyl]-4-yl)-N,N,N',N'-tetraphenyl-9,9'-spirobi[9H-fluorene]-2,7-diamine,
9,9,9',9',9'',9''-Hexaphenyl-2,2':7',2''-ter-9H-fluorene,
2,7-Bis([1,1'-biphenyl]-4-yl)-9,9'-spirobi[9H-fluorene],
2,2',7,7'-tetra-2-Naphthalenyl-9,9'-spirobi[9H-fluorene], or
9,9'-[(2,7-Diphenyl-9H-fluoren-9-ylidene)di-4,1-phenylenel]bis-anthracene.

57. The organic light-emitting device of claim 1 wherein the second component includes a naphthacene moiety.

58. The organic light-emitting device of claim 57 wherein the second component includes:
5,6,11,12-Tetraphenylnaphthacene (rubrene),
5,12-Bis(2-naphthyl)-6,11-diphenyltetracene,
5,12-Bis(2-mesityl)-6,11-diphenyltetracene,
5,12-Bis(1-naphthyl)-6,11-diphenyltetracene,
5,6,11,12-Tetrakis(2-naphthyl)tetracene,
10,10'-[(6,11-Diphenyl-5,12-naphthacenediyl)di-4,1 phenylene]bis[2,3,6,7-tetrahydro-1H,5H-benzothiazolo[5,6,7-ij]quinolizine,
9,10,15,16-Tetraphenyl-dibenzo[a,c]naphthacene,
5,6,13,14-Tetraphenylpentacene,
4,4'-(8,9-Dimethyl-5,6,7,10,11,12-hexaphenyl-1,4naphthacenediyl)bis-benzonitrile,
4,4'-(8,9-Dimethoxy-5,6,7,10,11,12-hexaphenyl-1,4naphthacenediyl)bis[N,N-diphenylbenzenamine],
1,2,3,5,6,11,12-Heptaphenylnaphthacene,
1,4,5,6,7,10,11,12-Octaphenylnaphthacene,
6,11-diphenyl-5,12-bis(4'-N,N-diphenylaminophenyl) naphthacene,
7,8,15,16-Tetraphenyl-benzo[a]pentacene,
2,3,5,6,11,12-Hexaphenylnaphthacene,
6,11-diphenyl-5,12-bis(4'-cyanophenyl)naphthacene,
6,11-diphenyl-5,12-bis(4'-(2-thienyl)phenyl)naphthacene, or
9,10,19,20-Tetraphenyl-tetrabenzo[a,c,j,l]naphthacene.

59. The organic light-emitting device of claim 1 wherein the second component includes a benzoxazolyl moiety or thio and amino analogs of benzoxazolyl moiety.

60. The organic light-emitting device of claim 1 wherein the dopant includes a DCM moiety.

61. The organic light-emitting device of claim 60 wherein the dopant includes DCJTB.

62. The organic light-emitting device of claim 1 wherein the dopant includes a periflanthene moiety.

63. The organic light-emitting device of claim 62 wherein the dopant includes

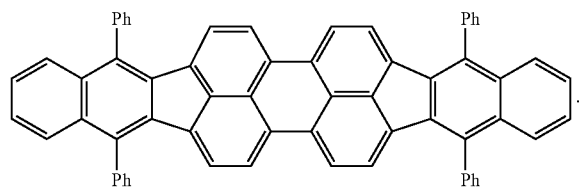

(Red 2)

64. The organic light-emitting device of claim 1 wherein the dopant includes a coumarin moiety.

65. The organic light-emitting device of claim 64 wherein the dopant includes C-6, C-545T, or C-525T.

66. The organic light-emitting device of claim 1 wherein the dopant includes a quinacridone moiety.

67. The organic light-emitting device of claim 66 wherein the dopant includes

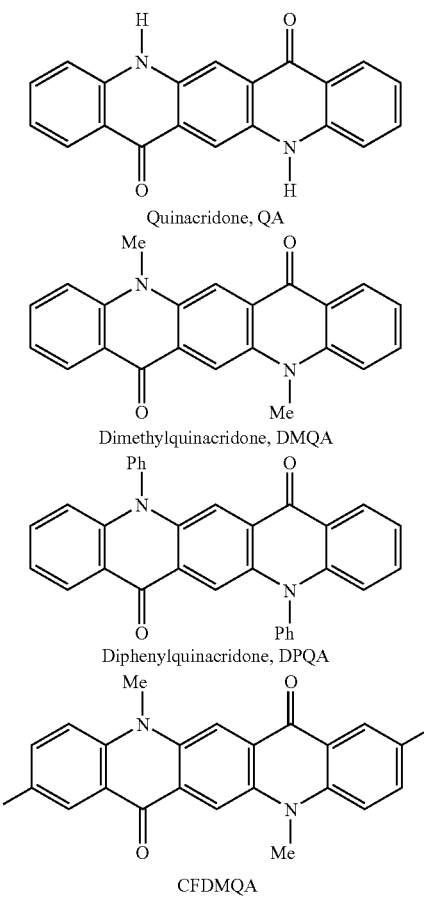

Quinacridone, QA

Dimethylquinacridone, DMQA

Diphenylquinacridone, DPQA

CFDMQA

68. The organic light-emitting device of claim 1 wherein the dopant includes a DPMB (dipyridinomethene borate) moiety

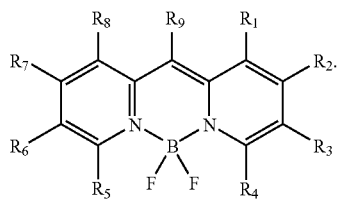

69. The organic light-emitting device of claim 68 wherein the dopant includes

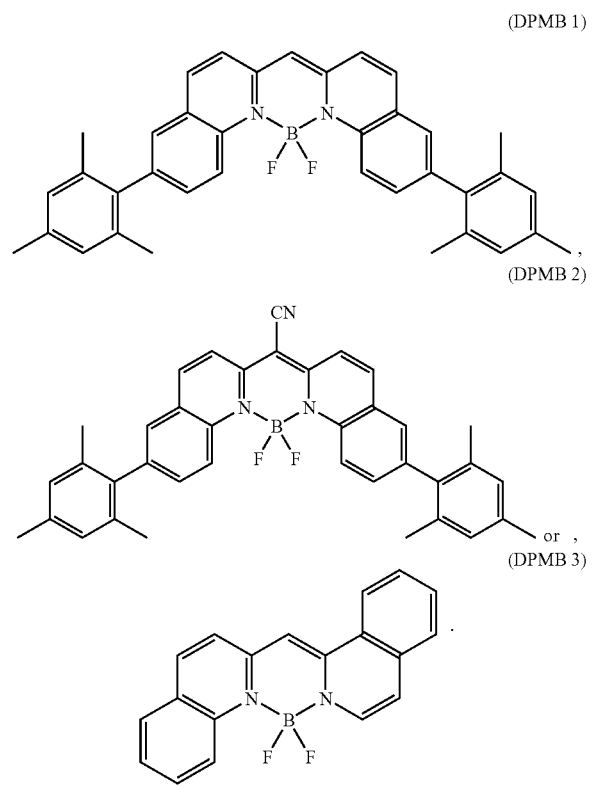

(DPMB 1)

(DPMB 2)

(DPMB 3) or,

70. The organic light-emitting device of claim 1 wherein the dopant includes an indenoperylene moiety.

71. The organic light-emitting device of claim 70 wherein the dopant includes (Yellow-green 2)

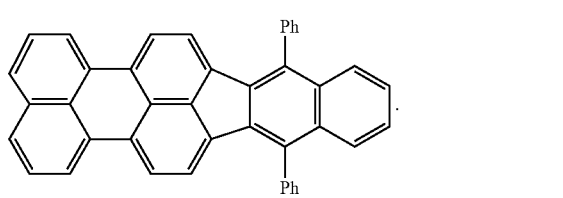

72. The organic light-emitting device of claim 1 wherein the dopant includes a naphthacene moiety.

73. The organic light-emitting device of claim 72 wherein the dopant includes:
  5,6,11,12-Tetraphenylnaphthacene (rubrene),
  2,2'-[(6,11-diphenyl-5,12-naphthacenediyl)di-4,1-phenylene]bis(6-methylbenzothiazole) (Orange 2),
  5,12-Bis(2-mesityl)-6,11-diphenyltetracene,
  5,6,11,12-Tetrakis(2-naphthyl)tetracene,
  10,10'-[(6,11-Diphenyl-5,12-naphthacenediyl)di-4,1-phenylene]bis[2,3,6,7-tetrahydro-1H,5H-benzothiazolo[5,6,7-ij]quinolizine,
  5,6,13,14-Tetraphenylpentacene,
  4,4'-(8,9-Dimethoxy-5,6,7,10,11,12-hexaphenyl-1,4-naphthacenediyl)bis[N,N-diphenylbenzenamine],
  6,11-diphenyl-5,12-bis(4'-N,N-diphenylaminophenyl) naphthacene,
  7,8,15,16-Tetraphenyl-benzo[a]pentacene, or
  6,11-diphenyl-5,12-bis(4'-cyanophenyl)naphthacene.

74. The organic light-emitting device of claim 1 wherein the dopant includes a BASB moiety.

75. The organic light-emitting device of claim 74 wherein the dopant includes:
  4-Diphenylamino)-4'-[4-(diphenylamino)styryl]stilbene,
  4-(Di-p-Tolylamino)-4'-[(di-p-tolylamino)styryl]stilbene (Blue-green 2),
  4,4'-[(2,5-Dimethoxy-1,4-phenylene)di-2,1-ethenediyl] bis[N,N-bis(4-methylphenyl)benzenamine,
  4,4'-(1,4-Naphthalenediyldi-2,1-ethenediyl)bis[N,N-bis (4-methylphenyl)benzenamine,
  3,3'-(1,4-Phenylenedi-2,1-ethenediyl)bis[9-(4-ethylphenyl)-9H-carbazole,
  4,4'-(1,4-Phenylenedi-2,1-ethenediyl)bis[N,N-diphenyl-1-naphthalenamine,
  4,4'-[1,4-Phenylenebis(2-phenyl-2,1-ethenediyl)]bis[N,N-diphenylbenzenamine],
  4,4',4''-(1,2,4-Benzenetriyltri-2,1-ethenediyl)tris[N,N-diphenylbenzenamine],
  9,10-Bis[4-(di-p-tolylamino)styryl]anthracene, or
  α,α'-(1,4-Phenylenedimethylidyne)bis[4-(diphenylamino)-1-naphthaleneacetonitrile.

76. The organic light-emitting device of claim 1 wherein the dopant includes a perylene moiety.

77. The organic light-emitting device of claim 76 wherein the dopant includes:
  Perylene,
  2,5,8,11-Tetra-tert-butylperylene (TBP),
  2,8-Di-tert-Butylperylene,
  Benzo[b]perylene, or
  Dibenzo[b,k]perylene.

78. The organic light-emitting device of claim 1 wherein the dopant includes a ADPMB (aza-dipyridinomethene borate) moiety

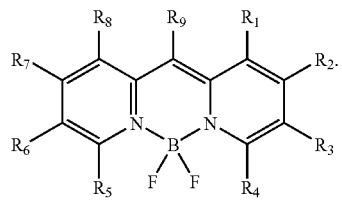

79. The organic light-emitting device of claim 78 wherein the dopant includes:

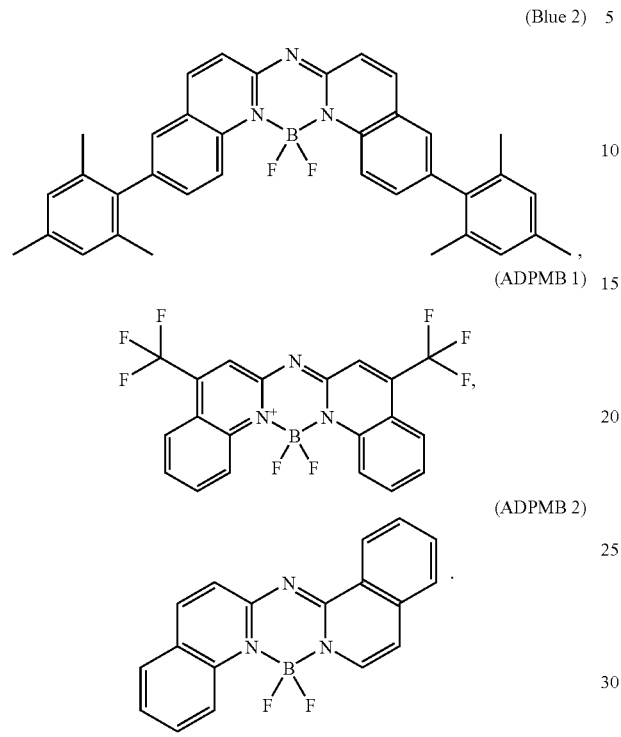

(Blue 2)

(ADPMB 1)

(ADPMB 2)

80. The organic light-emitting device of claim 1 wherein the first component of the mixture is a benzenoid compound that has the formula:

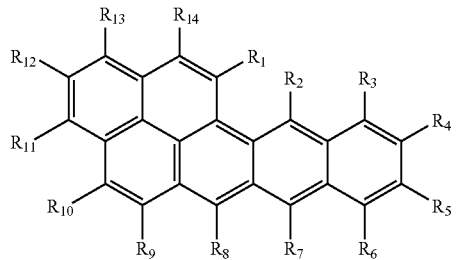

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-triphenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2- phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3 -FlAn), 1,2- fluorantheno (1,2-FlAn), 3,4-peryleno (3,4-Per), 7,8-fluorantheno (7,8-FlAn), 8,9-fluorantheno (8.9-FlAn), 2,3 -triphenyleno (2,3-TriP), 1,2-triphenyleno (1,2-TriP), ace, or indeno substituent or their alkyl or aryl substituted derivative.

81. The organic light-emitting device of claim 1 wherein the first component of the mixture is a benzenoid compound that has the formula:

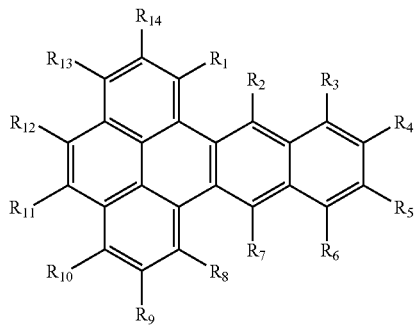

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

82. The organic light-emitting device of claim 1 wherein the first component of the mixture is a benzenoid compound that has the formula:

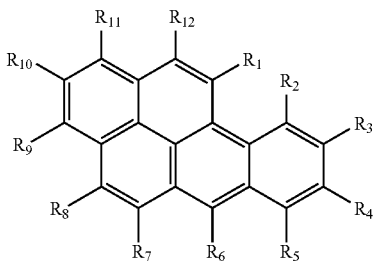

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

83. The organic light-emitting device of claim 1 wherein the first component of the mixture is a benzenoid compound that has the formula:

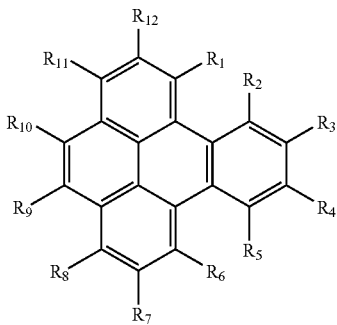

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

84. The organic light-emitting device of claim 1 wherein the first component of the mixture is a benzenoid compound that has the formula:

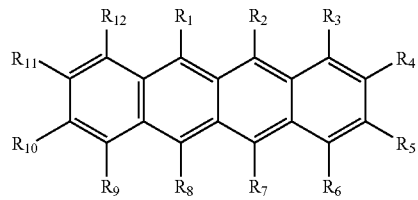

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

85. The organic light-emitting device of claim 1 wherein the first component of the mixture is a benzenoid compound that has the formula:

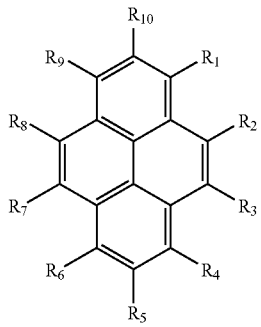

wherein:
substituents $R_1$ through $R_{10}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{10}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{10}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

86. The organic light-emitting device of claim 1 wherein the first component of the mixture is a benzenoid compound that has the formula:

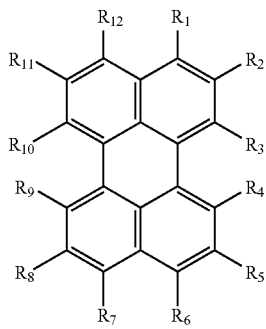

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

87. The organic light-emitting device of claim 1 wherein the first component of the mixture is a benzenoid compound that has the formula:

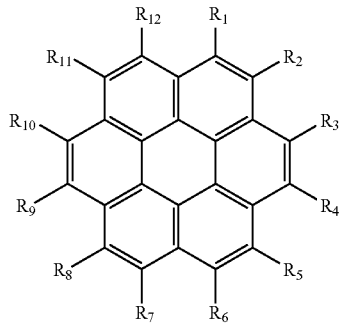

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

88. The organic light-emitting device of claim 1 wherein the first component of the mixture is a benzenoid compound that has the formula:

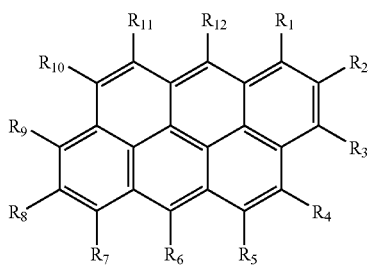

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

89. The organic light-emitting device of claim 1 wherein the first component of the mixture is a benzenoid compound that has the formula:

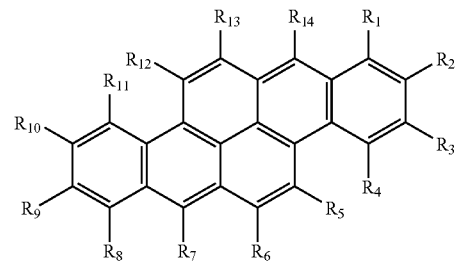

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

90. The organic light-emitting device of claim 1 wherein the first component of the mixture is a benzenoid compound that has the formula:

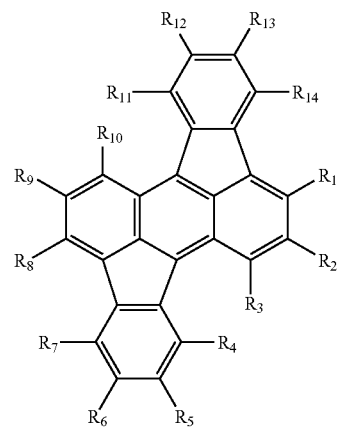

wherein:
    substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

91. The organic light-emitting device of claim 1 wherein the first component of the mixture is a benzenoid compound that has the formula:

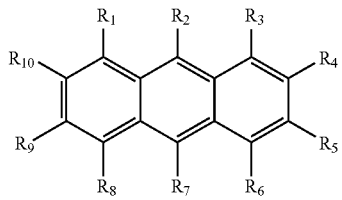

wherein:
    substituents $R_1$ through $R_{10}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{10}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{10}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

92. The organic light-emitting device of claim 1 wherein the first component of the mixture is a benzenoid compound that has the formula:

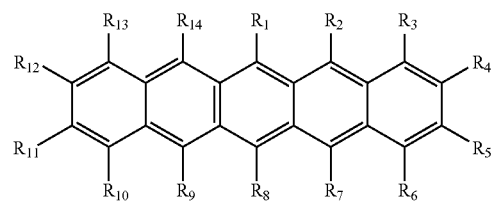

wherein:
    substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

93. The organic light-emitting device of claim 1 wherein the first component of the mixture is a benzenoid compound that has the formula:

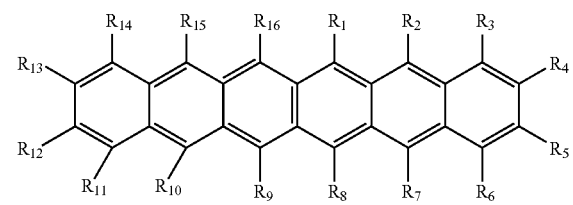

wherein:

substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

94. The organic light-emitting device of claim 1 wherein the first component of the mixture is a benzenoid compound that has the formula:

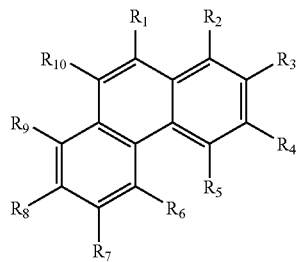

wherein:

substituents $R_1$ through $R_{10}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{10}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{10}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

95. The organic light-emitting device of claim 1 wherein the first component of the mixture is a benzenoid compound that has the formula:

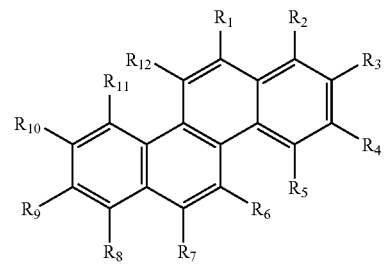

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

96. The organic light-emitting device of claim 1 wherein the first component of the mixture is a benzenoid compound that has the formula:

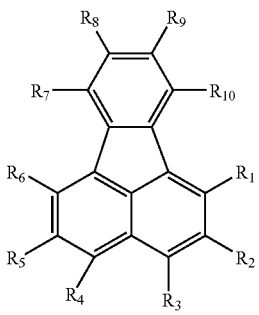

wherein:
substituents $R_1$ through $R_{10}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{10}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{10}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

97. The organic light-emitting device of claim 1 wherein the first component of the mixture is a benzenoid compound that has the formula:

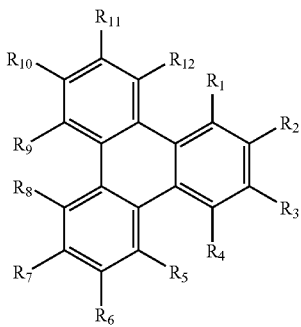

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

98. The organic light-emitting device of claim 1 wherein the first component of the mixture is a benzenoid compound that has the formula:

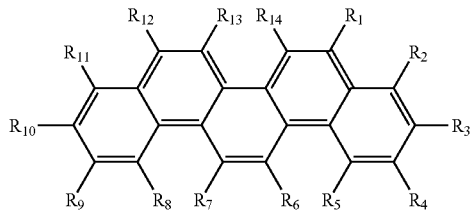

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluoran-

99. The organic light-emitting device of claim 1 wherein the first component of the mixture is a benzenoid compound that has the formula:

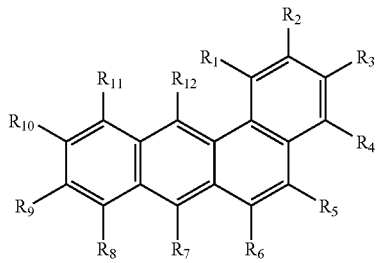

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

100. The organic light-emitting device of claim 1 wherein the first component of the mixture is a benzenoid compound that has the formula:

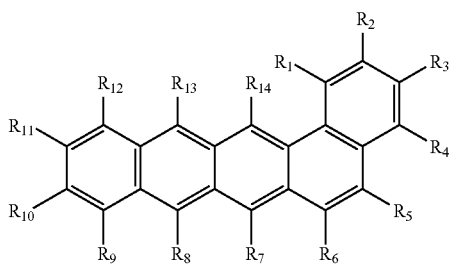

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

101. The organic light-emitting device of claim 1 wherein the first component of the mixture is a benzenoid compound that has the formula:

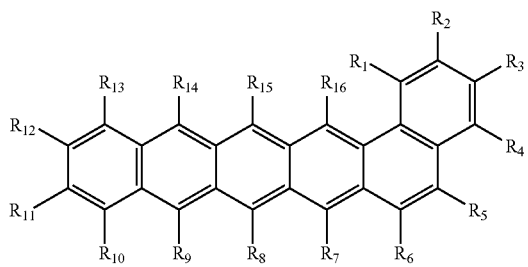

wherein:
substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-biphenylene (2,2'-

BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

102. The organic light-emitting device of claim 1 wherein the first component of the mixture is a benzenoid compound that has the formula:

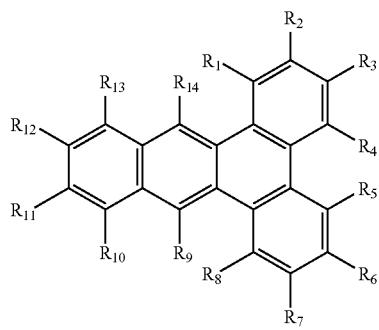

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

103. The organic light-emitting device of claim 1 wherein the first component of the mixture is a benzenoid compound that has the formula:

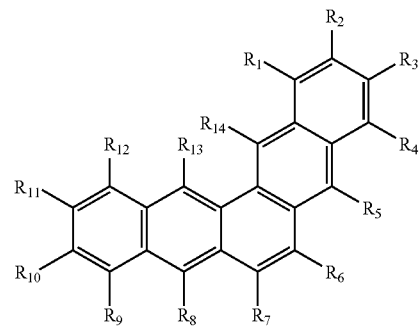

wherein:
substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

104. The organic light-emitting device of claim 1 wherein the first component of the mixture is a benzenoid compound that has the formula:

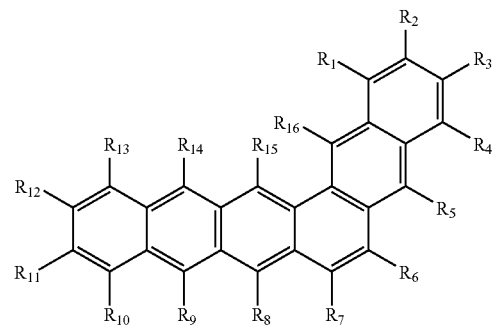

wherein:
substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

105. The organic light-emitting device of claim 1 wherein the first component of the mixture is a benzenoid compound that has the formula:

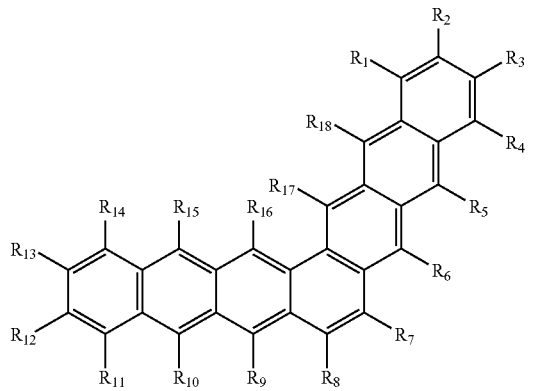

wherein:
substituents $R_1$ through $R_{18}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{18}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{18}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

106. The organic light-emitting device of claim 1 wherein the first component of the mixture is a benzenoid compound that has the formula:

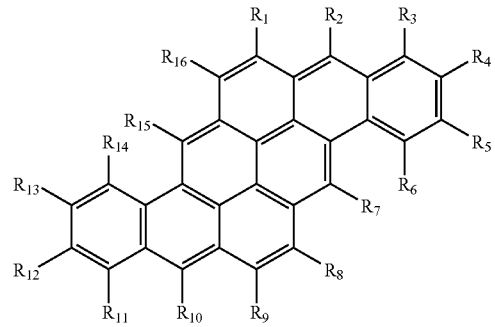

wherein:
substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

107. The organic light-emitting device of claim 1 wherein the first component of the mixture is a benzenoid compound that has the formula:

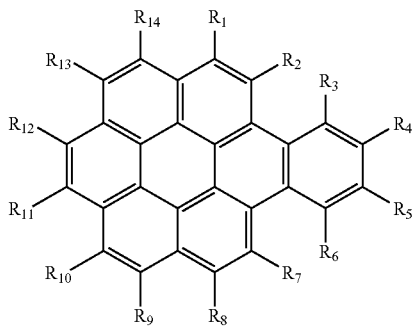

wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-trinhenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

108. The organic light-emitting device of claim 1 wherein the first component of the mixture is a benzenoid compound that has the formula that can be drawn using only fully aromatic benzene rings so as to form graphite-like segments:

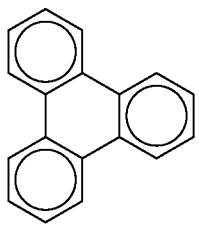

-continued

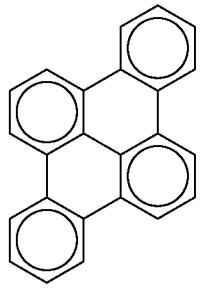

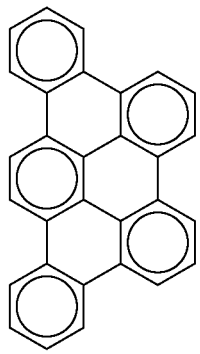

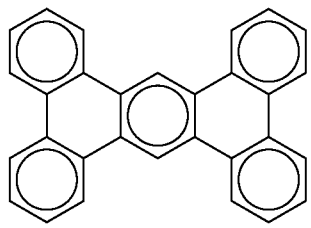

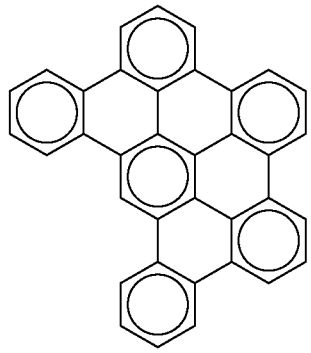

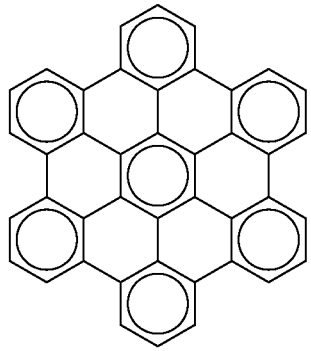

161
-continued
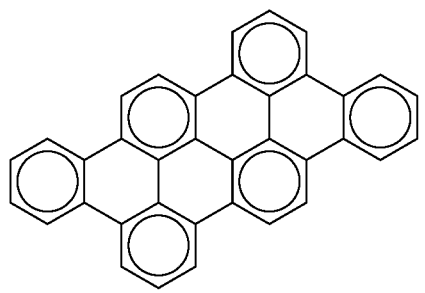
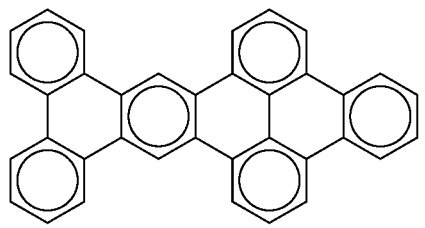
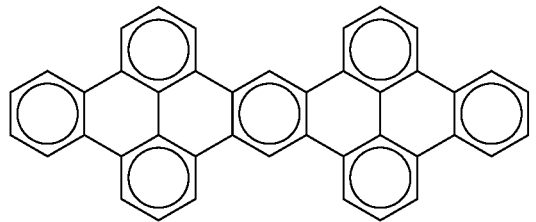
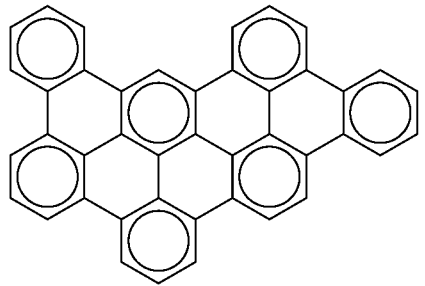
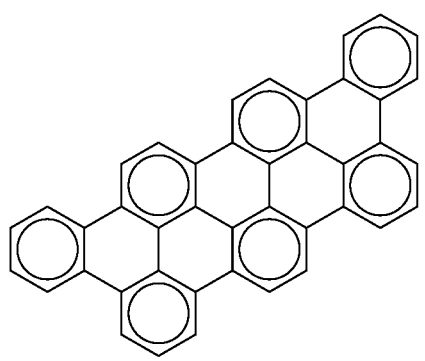
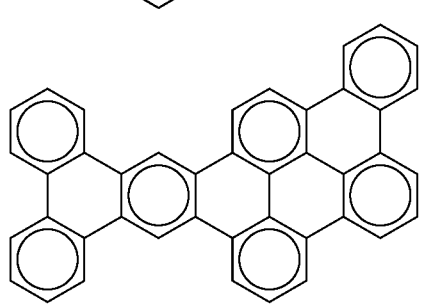
162
-continued
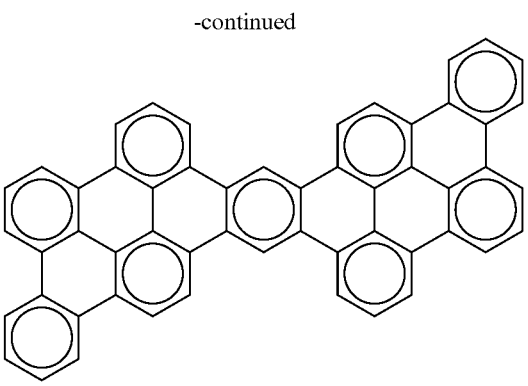
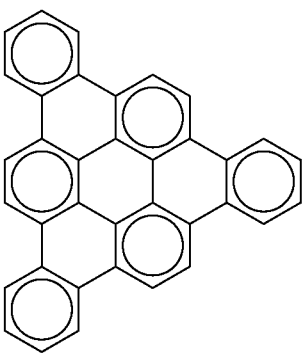
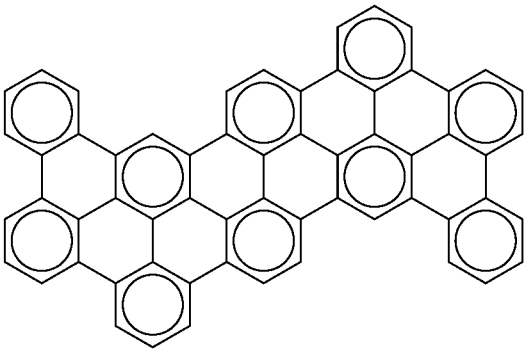
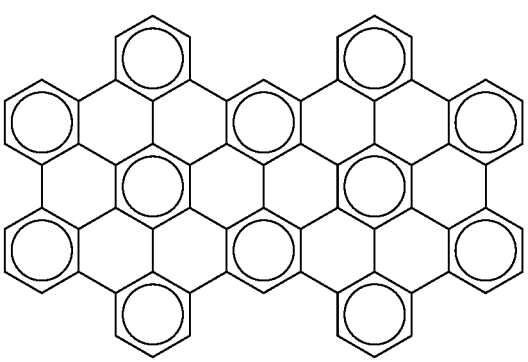

-continued

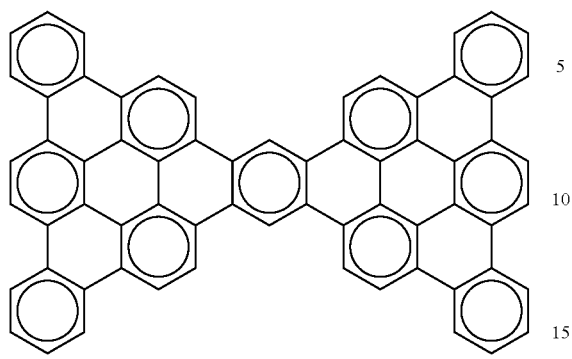
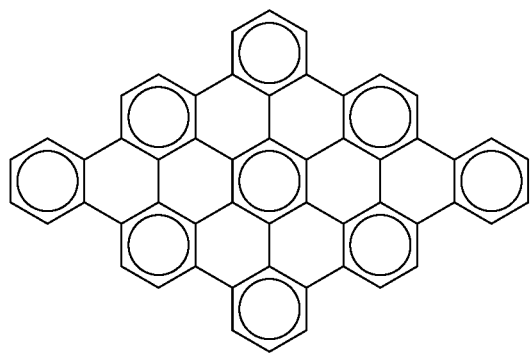
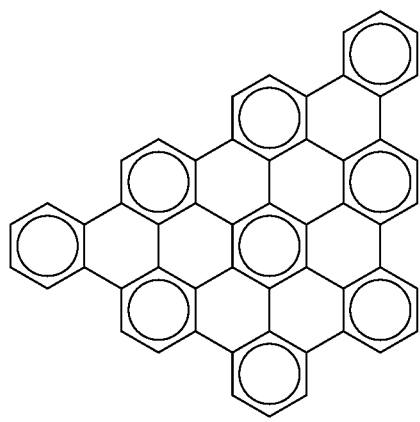
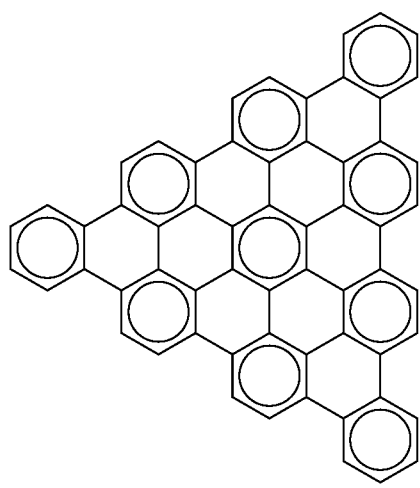

-continued

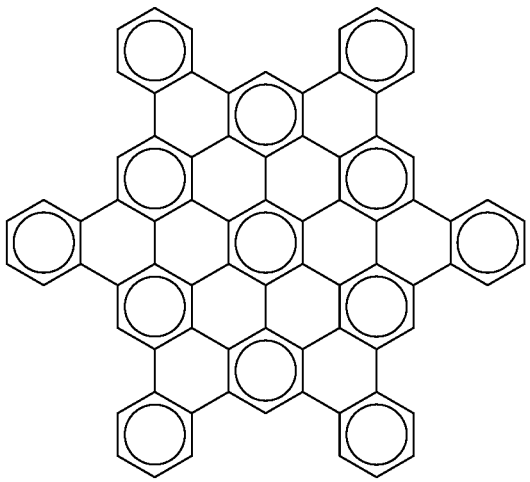
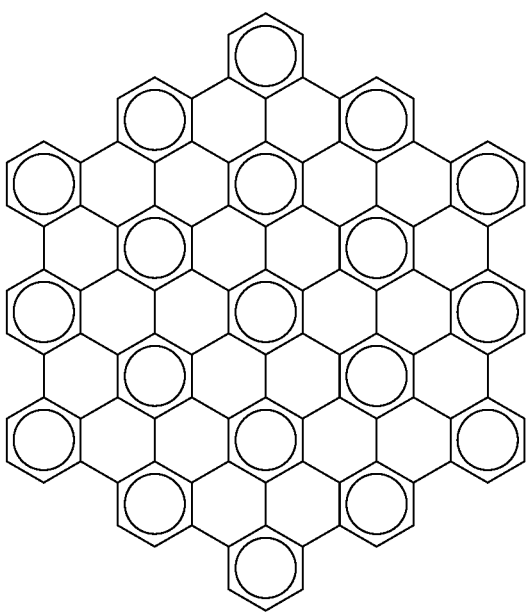

wherein:

substituents in each position for each compound and analogous compounds of the homological series are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent substituents form an annelated benzo-, naphtho-, anthra-, phenanthro-, fluorantheno-, pyreno-, triphenyleno-, or peryleno-substituent or its alkyl or aryl substituted derivative; or any two substituents form a 1,2-benzo, 1,2-naphtho, 2,3-naphtho, 1,8-naphtho, 1,2-anthraceno, 2,3 -anthraceno, 2,2'-biphenylene (2,2'-BP), 4.5- phenanthreno (4,5-PhAn), 1,12-triphenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2,3-Per), 3,4-fluorantheno (3,4-FlAn), 2,3-fluorantheno (2,3-FlAn), 1,2-fluorantheno (1,2-FlAn), 3,4-peryleno (3,4-Per), 7,8-fluorantheno (7,8-FlAn), 8,9-fluorantheno (8,9-FlAn), 2,3-triphenyleno (2,3-TriP), 1,2-triphenyleno (1,2-TriP), ace, or indeno substituent or their alkyl or aryl substituted derivative.

* * * * *

UNITED STATES PATENT AND TRADEMARK OFFICE
CERTIFICATE OF CORRECTION

PATENT NO.        : 7,183,010 B2
APPLICATION NO. : 10/634324
DATED             : February 27, 2007
INVENTOR(S)       : Viktor V. Jarikov It is certified that error appears in the above-identified patent and that said Letters Patent is hereby corrected as shown below:

| | |
|---|---|
| Column 134, line 3 of Claim 46 | Please delete "frilly" and insert --fully--. |
| Column 135, lines 19 and 20 of claim 56 | Please delete "phenylenel" and insert --phenylene]--. |
| Column 135, line 8 of claim 58 | Please delete "di-4,1" and insert -- di-4,1- --. |
| Column 140, line 32 of claim 80 (excluding structure) | Please delete "8.9-FIAn) and insert --(8,9-FIAn)--. |
| Column 140, line 23 of claim 81 (excluding structure) | Please delete "1,12-trinhenyleno" and insert --1,12-triphenyleno--. |
| Column 141, line 23 of claim 82 (excluding structure) | Please delete "1,12-trinhenyleno" and insert --1,12-triphenyleno--. |
| Column 142, line 23 of claim 83 (excluding structure) | Please delete "1,12-trinhenyleno" and insert --1,12-triphenyleno--. |
| Column 142, line 23 of claim 84 (excluding structure) | Please delete "1,12-trinhenyleno" and insert --1,12-triphenyleno--. |
| Column 143, line 23 of claim 85 (excluding structure) | Please delete "1,12-trinhenyleno" and insert --1,12-triphenyleno--. |
| Column 144, line 23 of claim 86 (excluding structure) | Please delete "1,12-trinhenyleno" and insert --1,12-triphenyleno--. |
| Column 145, line 23 of claim 87 (excluding structure) | Please delete "1,12-trinhenyleno" and insert --1,12-triphenyleno--. |

UNITED STATES PATENT AND TRADEMARK OFFICE
CERTIFICATE OF CORRECTION

PATENT NO. : 7,183,010 B2
APPLICATION NO. : 10/634324
DATED : February 27, 2007
INVENTOR(S) : Viktor V. Jarikov It is certified that error appears in the above-identified patent and that said Letters Patent is hereby corrected as shown below:

| | |
|---|---|
| Column 145, line 23 of claim 88 (excluding structure) | Please delete "1,12-trinhenyleno" and insert --1,12-triphenyleno--. |
| Column 146, line 23 of claim 89 (excluding structure) | Please delete "1,12-trinhenyleno" and insert --1,12-triphenyleno--. |
| Column 147, line 23 of claim 90 (excluding structure) | Please delete "1,12-trinhenyleno" and insert --1,12-triphenyleno--. |
| Column 147, line 23 of claim 91 (excluding structure) | Please delete "1,12-trinhenyleno" and insert --1,12-triphenyleno--. |
| Column 148, line 23 of claim 92 (excluding structure) | Please delete "1,12-triphenyleno" and insert --1,12-triphenyleno--. |
| Column 149, line 23 of claim 93 (excluding structure) | Please delete "1,12-trinhenyleno" and insert --1,12-triphenyleno--. |
| Column 150, line 23 of claim 94 (excluding structure) | Please delete "1,12-trinhenyleno" and insert --1,12-triphenyleno--. |
| Column 150, line 23 of claim 95 (excluding structure) | Please delete "1,12-trinhenyleno" and insert --1,12-triphenyleno--. |
| Column 151, line 23 of claim 96 (excluding structure) | Please delete "1,12-trinhenyleno" and insert --1,12-triphenyleno--. |
| Column 152, line 23 of claim 97 (excluding structure) | Please delete "1,12-trinhenyleno" and insert --1,12-triphenyleno--. |

UNITED STATES PATENT AND TRADEMARK OFFICE
CERTIFICATE OF CORRECTION

PATENT NO.        : 7,183,010 B2
APPLICATION NO.   : 10/634324
DATED             : February 27, 2007
INVENTOR(S)       : Viktor V. Jarikov It is certified that error appears in the above-identified patent and that said Letters Patent is hereby corrected as shown below:

| | |
|---|---|
| Column 152, line 23 of claim 98 (excluding structure) | Please delete "1,12-trinhenyleno" and insert --1,12-triphenyleno--. |
| Column 153, line 23 of claim 99 (excluding structure) | Please delete "1,12-trinhenyleno" and insert --1,12-triphenyleno--. |
| Column 154, line 23 of claim 100 (excluding structure) | Please delete "1,12-trinhenyleno" and insert --1,12-triphenyleno--. |
| Column 155, line 23 of claim 101 (excluding structure) | Please delete "1,12-trinhenyleno" and insert --1,12-triphenyleno--. |
| Column 155, line 23 of claim 102 (excluding structure) | Please delete "1,12-trinhenyleno" and insert --1,12-triphenyleno--. |
| Column 156, line 23 of claim 103 (excluding structure) | Please delete "1,12-trinhenyleno" and insert --1,12-triphenyleno--. |
| Column 157, line 23 of claim 104 (excluding structure) | Please delete "1,12-trinhenyleno" and insert --1,12-triphenyleno--. |
| Column 158, line 23 of claim 105 (excluding structure) | Please delete "1,12-trinhenyleno" and insert --1,12-triphenyleno--. |
| Column 158, line 23 of claim 106 (excluding structure) | Please delete "1,12-trinhenyleno" and insert --1,12-triphenyleno--. |
| Column 159, line 23 of claim 107 (excluding structure) | Please delete "1,12-trinhenyleno" and insert --1,12-triphenyleno--. |

UNITED STATES PATENT AND TRADEMARK OFFICE
CERTIFICATE OF CORRECTION

PATENT NO. : 7,183,010 B2
APPLICATION NO. : 10/634324
DATED : February 27, 2007
INVENTOR(S) : Viktor V. Jarikov It is certified that error appears in the above-identified patent and that said Letters Patent is hereby corrected as shown below:

| | |
|---|---|
| Column 164, line 24 of claim 108 (excluding structures) | Please delete "4.5-phenanthreno" and insert --4,5-phenanthreno--. |

Signed and Sealed this

Fourth Day of September, 2007

JON W. DUDAS
*Director of the United States Patent and Trademark Office*